(12) United States Patent
Mizukoshi et al.

(10) Patent No.: US 8,058,110 B2
(45) Date of Patent: Nov. 15, 2011

(54) PLATING METHOD, SEMICONDUCTOR DEVICE FABRICATION METHOD AND CIRCUIT BOARD FABRICATION METHOD

(75) Inventors: Masataka Mizukoshi, Kawasaki (JP); Kanae Nakagawa, Kawasaki (JP); Takeshi Shioga, Kawasaki (JP); Kazuaki Kurihara, Kawasaki (JP); John David Baniecki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/043,854

(22) Filed: Mar. 9, 2011

(65) Prior Publication Data

US 2011/0168564 A1  Jul. 14, 2011

Related U.S. Application Data

(60) Division of application No. 12/684,570, filed on Jan. 8, 2010, now Pat. No. 7,927,998, which is a division of application No. 11/250,399, filed on Oct. 17, 2005, now Pat. No. 7,670,940, which is a continuation-in-part of application No. 11/066,481, filed on Feb. 28, 2005, now abandoned.

(30) Foreign Application Priority Data

Oct. 18, 2004 (JP) .................................. 2004-303345
Aug. 15, 2005 (JP) .................................. 2005-235229

(51) Int. Cl.
  *H01L 21/76* (2006.01)
(52) U.S. Cl. .............................. 438/127; 257/E23.127
(58) Field of Classification Search ................. 438/127; 257/E23.127
See application file for complete search history.

(56) References Cited

U.S. PATENT DOCUMENTS

| | | | |
|---|---|---|---|
| 6,284,363 B1 * | 9/2001 | Maeda et al. | 428/328 |
| 6,428,393 B1 | 8/2002 | Yukawa et al. | |
| 2006/0027936 A1 | 2/2006 | Mizukoshi et al. | |

FOREIGN PATENT DOCUMENTS

JP  5037120 A  2/1993

(Continued)

OTHER PUBLICATIONS

Japanese Office Action dated Jun. 27, 2010, issued in corresponding Japanese Patent Application No. 2005-235229.

*Primary Examiner* — Jenny L Wagner
(74) *Attorney, Agent, or Firm* — Westerman, Hottori, Daniels & Adrian, LLP

(57) ABSTRACT

The plating method comprises the step of forming a resin layer 10 over a substrate 16; the step of cutting the surface part of the resin layer 10 with a cutting tool 12; the step of forming a seed layer 36 on the resin layer 10 by electroless plating; and the step of forming a plating film 44 on the seed layer 36 by electroplating. Suitable roughness can be give to the surface of the resin layer 10, whereby the adhesion between the seed layer 36 and the resin layer 10 can be sufficiently ensured. Excessively deep pores are not formed in the surface of the resin layer 10 as are by desmearing treatment, whereby a micronized pattern of a photoresist film 40 can be formed on the resin layer 10. Thus, interconnections 44, etc. can be formed over the resin layer 10 at a narrow pitch with high reliability ensured.

3 Claims, 46 Drawing Sheets

FOREIGN PATENT DOCUMENTS

| | | |
|---|---|---|
| JP | 7-326614 A | 12/1995 |
| JP | 9-82616 A | 3/1997 |
| JP | 10-56251 A | 2/1998 |
| JP | 11-006073 A | 1/1999 |
| JP | 11-220262 A | 8/1999 |
| JP | 2000-173954 A | 6/2000 |
| JP | 2001-237542 A | 8/2001 |
| JP | 2002-009416 A | 1/2002 |
| JP | 3375555 B2 | 11/2002 |
| JP | 2002-368428 A | 12/2002 |
| JP | 2003-027250 A | 1/2003 |
| JP | 2004-14611 A | 1/2004 |
| JP | 2004-172530 A | 6/2004 |

* cited by examiner

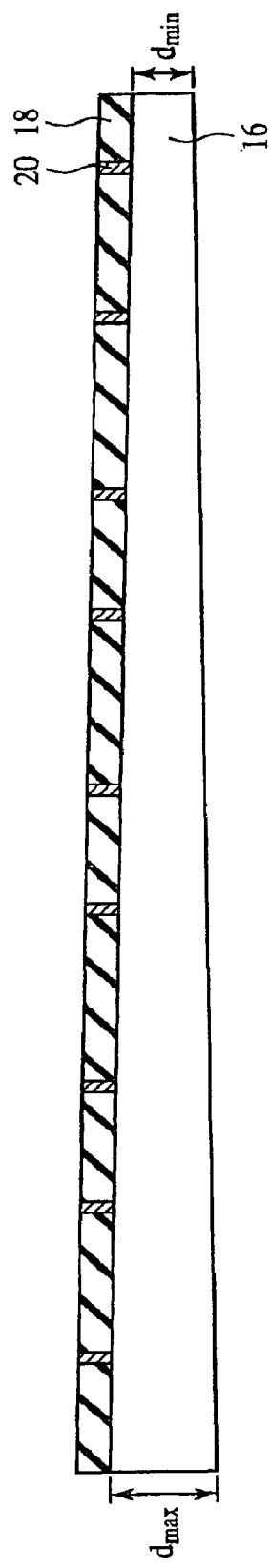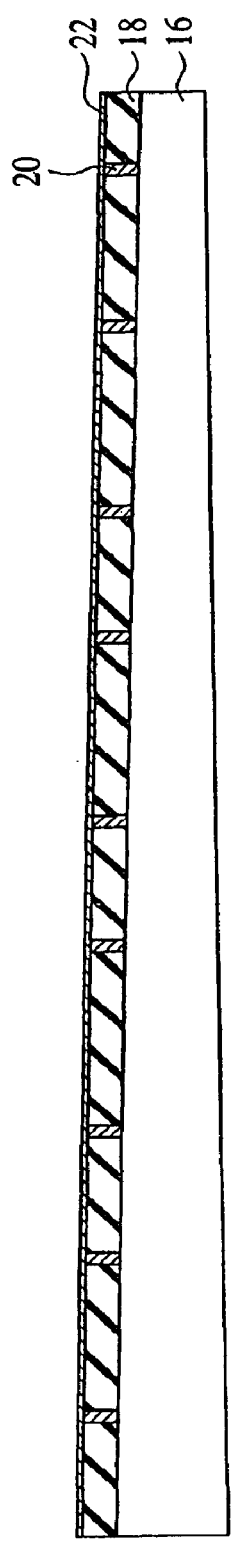
FIG. 2A
FIG. 2B

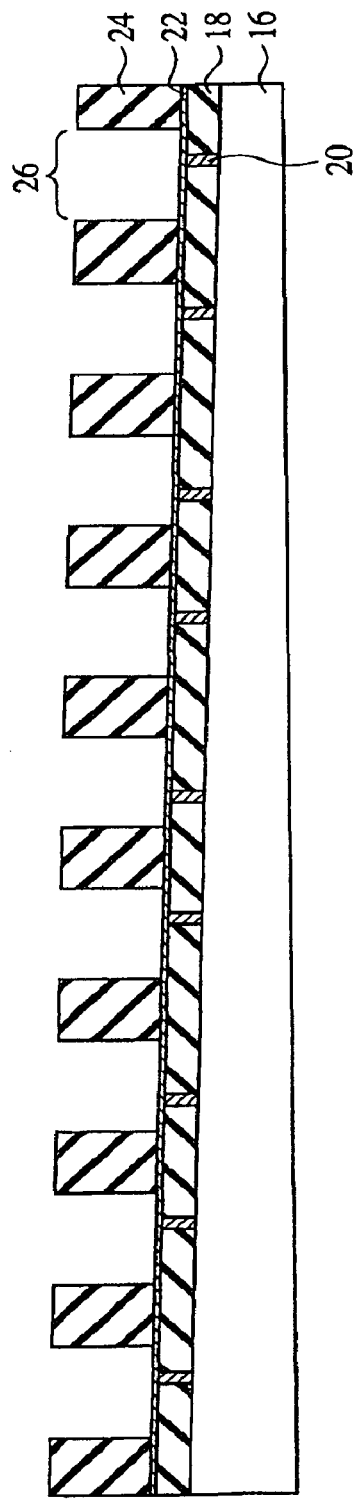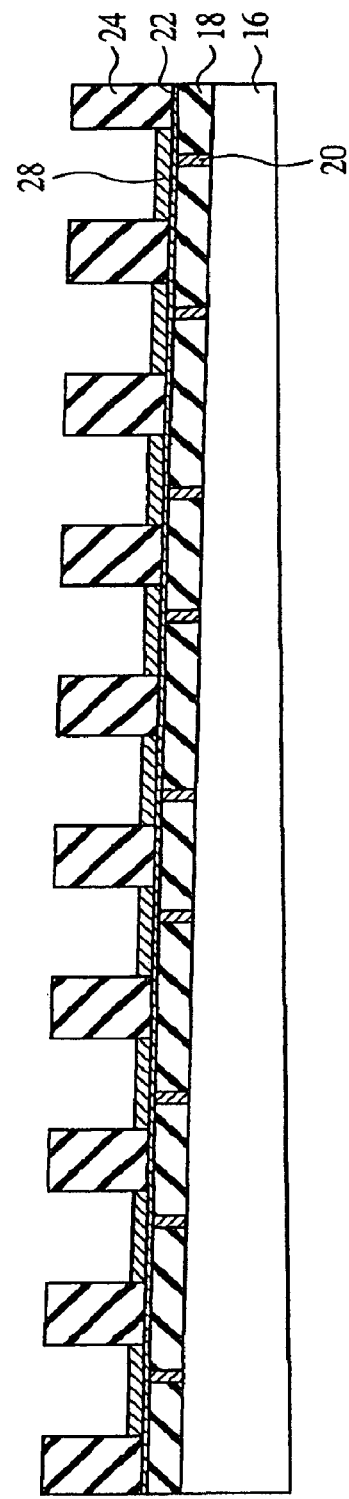

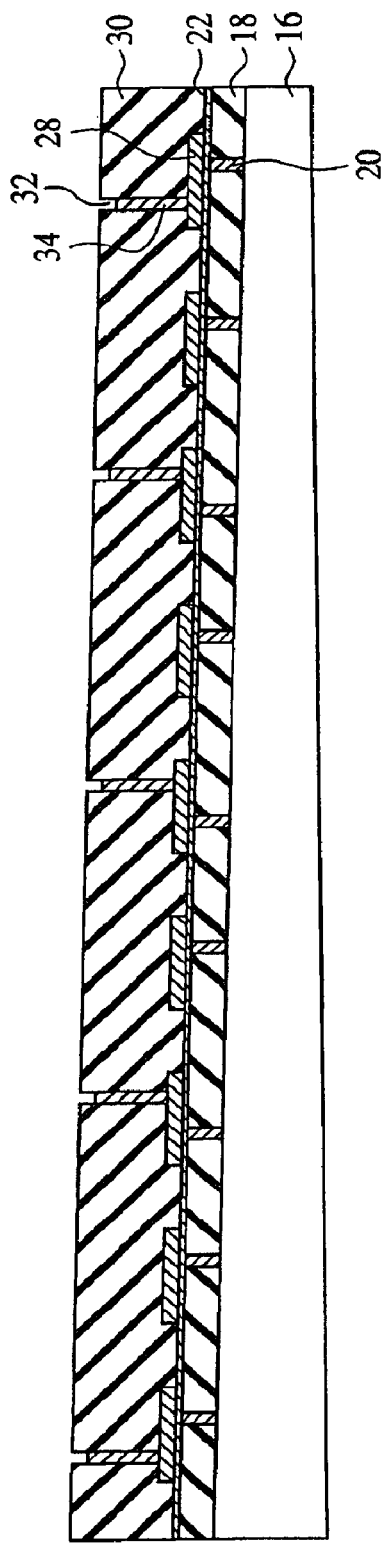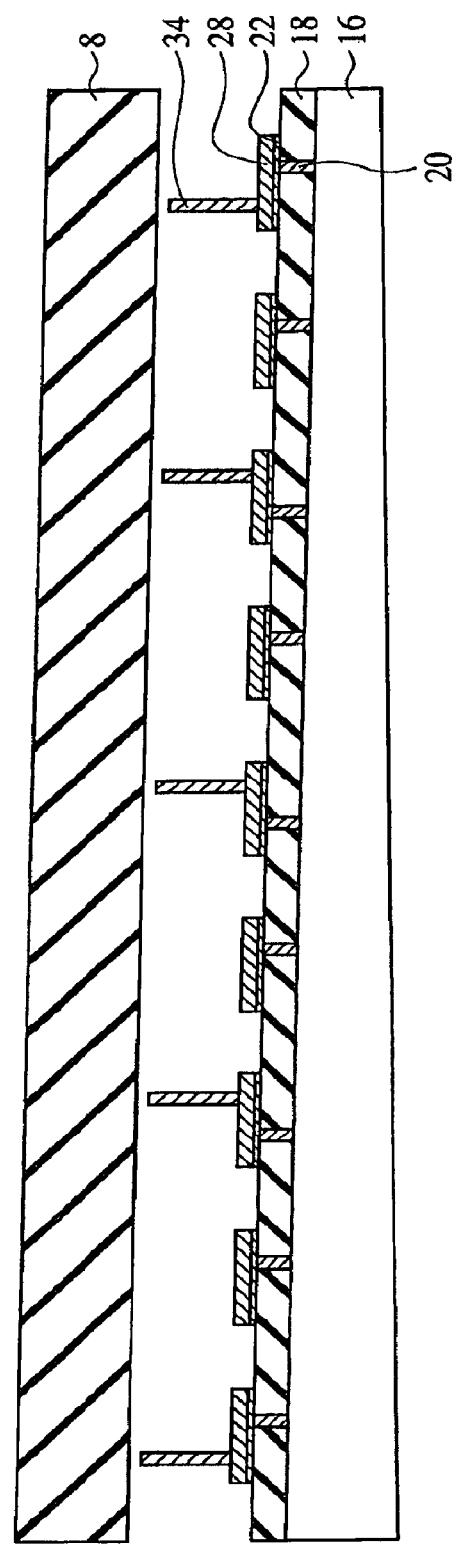
FIG. 5A
FIG. 5B

PLATING METHOD, SEMICONDUCTOR DEVICE FABRICATION METHOD AND CIRCUIT BOARD FABRICATION METHOD

CROSS-REFERENCE TO RELATED APPLICATIONS

This application is a division of U.S. application Ser. No. 12/684,570, filed Jan. 8, 2010, which is a division of U.S. application Ser. No. 11/250,399, filed on Oct. 17, 2005 which is a continuation-in-part of Ser. No. 11/066,481, filed on Feb. 28, 2005. This application is based upon and claims the benefit of priorities from the prior Japanese Patent Application No. 2004-303345, filed on Oct. 18, 2004, and the prior Japanese Patent Application No. 2005-235229 filed on Aug. 15, 2005, the entire contents of which are incorporated herein by reference.

BACKGROUND OF THE INVENTION

The present invention relates to a plating method, and a semiconductor fabrication method and a circuit board fabrication method using the plating method, more specifically, a plating method which can realize high reliability, and a semiconductor device fabrication method and a circuit board fabrication method using the plating method.

In the multi-layer interconnections formed on semiconductor substrates or circuit boards, inter-layer insulation films are required for the electric insulation between the interconnection layers.

In the steps of forming such inter-layer insulation films, recently the technique of forming an inter-layer insulation film by applying a sheet of a resin (hereinafter called a resin sheet) to a semiconductor substrate or a circuit board by vacuum press is noted. Forming an inter-layer insulation film of the resin sheet can much reduce the material waste in comparison with forming an inter-layer insulation film by spin coating, and resultantly inter-layer insulation films can be formed at lower costs.

In forming an interconnection on a resin layer formed by using such resin sheet, the interconnection can be formed by, e.g., the following technique.

First, contact holes are formed in the resin layer by a laser or others. Next, desmearing treatment is performed. The desmearing treatment is a chemical treatment for removing smears of the resin produced when the contact holes are formed in the resin layer by the laser or others. The desmearing treatment removes the smears out of the contact holes and forms convexities and concavities in the surface of the resin layer. In the desmearing treatment, the resin layer is immersed in, e.g., an alkaline solution of permanganic acid of 50-90° C. for about several minutes to several tens minutes. Then, a seed layer for forming a plating film is formed by electroless plating on the resin layer with the concavities and convexities formed in the surface by the desmearing treatment. The seed layer is formed, anchored in the concavities, i.e., a number of fine pores, formed in the surface of the resin layer, whereby the adhesion between the resin layer and the plating film is sufficiently secured. This phenomena is called anchor effect. Then, a photoresist film is formed on the entire surface of the resin layer, and openings are formed in the photoresist film by photolithography. Next, a plating film is formed on the seed layer in the openings by electroplating. Because of the sufficient adhesion between the seed layer and the resin layer, the plating film is secured to the resin layer via the seed layer. Finally, the photoresist film is released, and the interconnection is formed on the resin layer.

Patent Reference 1 discloses a method for forming a plating film on a resin substrate, in which a resin substrate layer with UV radiation applied to is immersed in an alkaline solution to subject the resin substrate to the desmearing treatment, whereby the adhesion between the resin substrate and the plating film is retained firmly.

Patent Reference 2 discloses a method for forming conductor circuit pattern on a molding formed by injection molding, in which when a resist applied to the surface of the injection molding, laser beams are applied also to the surface of the injection molding to thereby roughen the surface of the injection molding, whereby the step of roughening the surface of the injection molding can be omitted.

[Patent Reference 1]
Specification of Japanese Patent Application Unexamined Publication No. 2003-27250
[Patent Reference 2]
Specification of Japanese Patent Application Unexamined Publication No. Hei 11-6073

As disclosed in Patent Reference 1, when an object (the resin substrate) for the plating film to be formed on is immersed in an alkaline solution to thereby make the desmearing treatment, deep pores of several μm to ten-odd μm are formed in the surface of the resin layer, which makes it difficult to form a micronized interconnection pattern on the surface of the resin substrate by using a photoresist film. When the pitch of the interconnections formed on the resin substrate is small, the possibility that short circuits, etc. may take place is higher.

As disclosed in Patent Reference 2, when the surface of an object (the resin substrate) for the plating film to be formed on is roughened by applying laser beams, the application of laser beams takes a long time when the surface for the plating film to be formed on is large.

SUMMARY OF THE INVENTION

An object of the present invention is to provide a plating method which can easily form a plating film of good adhesion without making the desmearing treatment on a resin layer over a large area of which the plating film is to be formed, and a semiconductor device fabrication method and a circuit board fabrication method using the plating method.

According to one aspect of the present invention, there is provided a plating method comprising the steps of: forming a resin layer over a base substrate; cutting the surface part of the resin layer with a cutting tool; forming a seed layer on the resin layer by electroless plating; and forming a plating film on the seed layer by electroplating.

According to another aspect of the present invention, there is provided a plating method comprising the steps of: forming a resin layer over a base substrate; cutting the surface part of the resin layer with a cutting tool so that a ten-point height of irregularities of the surface of the resin layer is 0.5-5 μm; forming a seed layer on the resin layer; and forming a plating film on the seed layer by electroplating.

According to further another aspect of the present invention, there is provided a semiconductor device fabrication method comprising the steps of: forming a resin layer over a semiconductor substrate; cutting the surface part of the resin layer with a cutting tool so that a ten-point height of irregularities of the surface of the resin layer is 0.5-5 μm; forming a seed layer on the resin layer; and forming on the seed layer an interconnection of a plating film by electroplating.

According to further another aspect of the present invention, there is provided a circuit board fabrication method comprising the steps of: forming a resin layer over a base substrate; cutting the surface part of the resin layer with a cutting tool so that a ten-point height of irregularities of the surface of the resin layer is 0.5-5 µm; forming a seed layer on the resin layer; and forming an interconnection on the seed layer by electroplating.

According to further another aspect of the present invention, there is provided a circuit board fabrication method for fabricating a circuit board including a base substrate; and a capacitor having a lower electrode formed over the base substrate, a dielectric film formed over the lower electrode, and an upper electrode formed over the dielectric film, the method comprising the steps of: forming the lower electrode over the base substrate; forming the dielectric film containing a resin over at least the lower electrode; cutting with a cutting tool the surface part of the dielectric film so that a ten-point height of irregularities of the surface of the dielectric film is 0.5-5 µm; forming a seed layer on the dielectric film; and forming the upper electrode on the seed layer by electroplating.

According to further another aspect of the present invention, there is provided a circuit board fabrication method for fabricating a circuit board including a base substrate; a first electrode formed over the base substrate; and a resistor formed over the first electrode; and a second electrode formed over the resistor, the method comprising the steps of: forming the first electrode on the base substrate; forming a resistor layer containing the resin over the first electrode; cutting the surface part of the resistor layer so that a ten-point height of irregularities of the surface of the resistor layer is 0.5-5 µm; forming a seed layer on the resistor layer; and forming an electrode on the seed layer by electroplating.

According to further another aspect of the present invention, there is provided a circuit board fabrication method for fabricating a circuit board including a base substrate and an inductor formed over the base substrate, the method comprising the steps of: forming an insulation layer containing a resin over the base substrate; cutting the surface part of the insulation layer with a cutting tool so that a ten-point height of irregularities of the surface of the insulation layer is 0.5-5 µm; forming a seed layer on the insulation layer, and forming the inductor on the seed layer by electroplating.

According to the present invention, as a pre-processing for forming the seed layer for the plating processing, the surface of the resin layer is cut with a cutting tool so as to give the surface of the resin layer suitable roughness. Such processing sufficiently and easily ensures the adhesion between the resin layer and the seed layer. According to the present invention, no excessively deep pores are formed in the surface of the resin layer, as are formed by the desmearing treatment, which permits a micronized pattern to be formed on the resin layer. According to the present invention, the surface roughening processing is made over a large area in a short period of time, which makes it possible to form a micronized pattern to be formed over a large area in a short period of time. Thus, according to the present invention, interconnections, etc. can be easily formed on the resin layer at an extremely small pitch while ensuring high reliability.

According to the present invention, the dielectric film of the capacitor is formed of a resin sheet, and the surface of the dielectric film is cut with a cutting tool. This processing can suitably adjust the roughness of the surface of the dielectric film of a resin, whereby the adhesion between the dielectric film and the upper electrodes can be sufficiently ensured. According to the present invention, the desmearing treatment is not necessary, and no excessively deep pores are formed in the surface of the dielectric film. Thus, even when the thickness of the dielectric film is made sufficiently small, the insulation between the upper electrodes and the lower electrodes can be sufficiently ensured. The present invention can provide a circuit board having high reliability and capacitors of a large dielectric capacity.

In the present invention, the surface of the resistor layer of a resin is cut with a cutting tool, which gives the surface of the resistor layer of a resin suitable roughness. Thus, the adhesion between the resistor layer and the electrodes can be sufficiently ensured. The present invention does not require the desmearing treatment, and accordingly no excessively deep pores are formed in the surface of the resistor layer of the resin. Accordingly, even when the thickness of the resistor layer is made small, the inter-electrode insulation can be sufficiently ensured. Thus, the thickness of the resistor layer is suitable set, whereby the resistor value can be set at a required valued. Without excessively deep pores formed in the surface of the resistor layer, the dispersion of the resistor value can be made small. The present invention can fabricate a circuit board including resistors of high reliability.

In the present invention, the surface of the high-magnetic permeability layer of a resin film is cut with a cutting tool, whereby suitable roughness can be given to the surface of the high-magnetic permeability of the resin film. Accordingly, the adhesion between the high-magnetic permeability layer of a resin and the inductor can be sufficiently ensured. The present invention does not require the desmearing treatment, and accordingly no excessively deep pores are formed in the surface of the high-magnetic permeability layer of the resin, which allows a micronized pattern of a photoresist film to be formed on the high-magnetic permeability layer. Thus, according to the present invention, an inductor of high reliability can be formed at an extremely small coil pitch.

BRIEF DESCRIPTION OF THE DRAWINGS

FIGS. 2A and 2B are views of a semiconductor device in the steps of the semiconductor fabrication method according to a first embodiment of the present invention, which illustrate the method (Part 1).

FIGS. 3A and 3B are views of the semiconductor device in the steps of the semiconductor fabrication method according to the first embodiment of the present invention, which illustrate the method (Part 2).

FIGS. 5A and 5B are views of the semiconductor device in the steps of the semiconductor fabrication method according to the first embodiment of the present invention, which illustrate the method (Part 4).

DETAILED DESCRIPTION OF THE INVENTION

The inventors of the present application made earnest studies to solve the above-described problems and have got the idea that the surface part of a resin layer is cut by a cutting tool of diamond to thereby give the surface of the resin layer a suitable roughness without making the desmearing treatment.

Figure 1A:
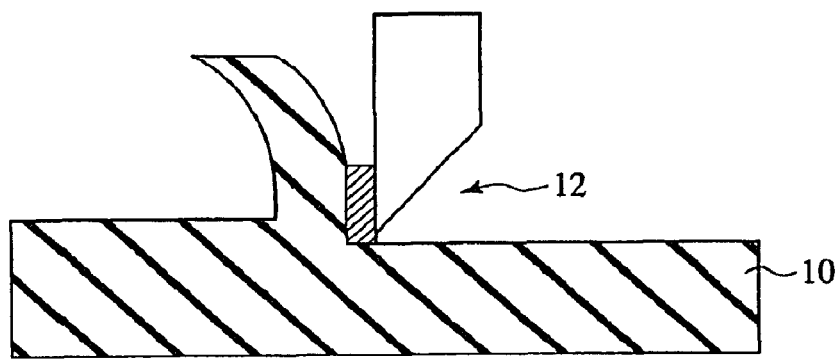
FIGS. 1A and 1B are side views of a resin layer when a surface part of the resin layer is cut with a cutting tool.
Figure 1B:
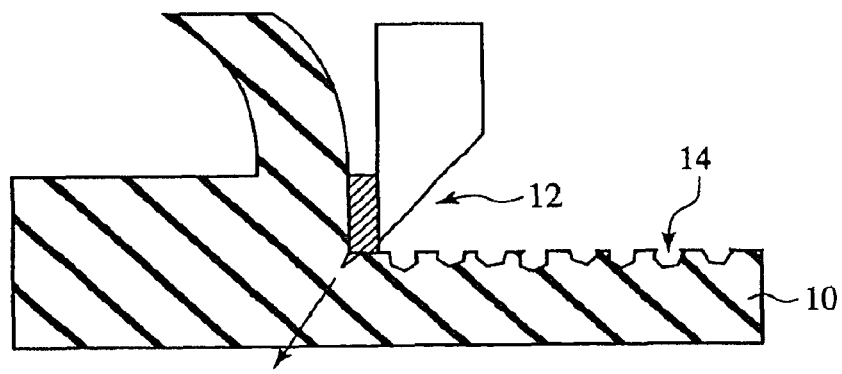

FIGS. 1A and 1B are side views of a resin layer when a surface part of the resin layer is cut with a cutting tool.

As illustrated in FIG. 1A, when the surface of a resin layer (a resin film before cut) 10 is cut in a relatively small cut amount with a cutting tool 12, the force applied to the cut surface is relatively small, and the roughness in the surface of the resin layer 10 is very small. The cut amount is a depth of one cut by the cutting tool.

In contrast to this, as illustrated in FIG. 1B, the surface of the resin layer 10 is cut in a relatively large cut amount, the force applied to the cut surface is relatively large, and concavities and convexities 14 of a suitable roughness are formed in the surface of the resin layer 10.

As described above, cut conditions are suitably set by the cutting tool 12, whereby a suitable roughness can be given to the surface of the resin layer 10. This makes it possible to form a plating film of good adhesion on the resin layer 10 without the desmearing treatment. Furthermore, the cut of the surface of the resin layer 10 with the cutting tool 12 does not form in the surface of the resin layer 10 pores which are so deep as those formed by making the desmearing treatment on the surface of the resin layer 10, which permits a micronized pattern of a photoresist film to be formed on the resin layer 10. Thus, according to the present invention, interconnections of the plating film can be formed at small pitches.

A First Embodiment

The plating method according to a first embodiment of the present invention and the semiconductor device fabrication method using the plating method will be explained with reference to FIGS. 2A to 13B and FIG. 29. FIGS. 2A to 12B are sectional views of a semiconductor device in the steps of the semiconductor device fabrication method according to the present embodiment, which illustrate the fabrication method. FIGS. 2A to 6B and 8A to 12B are sectional views, and FIGS. 7A and 7B are plan views.

As illustrated in FIG. 2A, a semiconductor substrate 16 is prepared. The semiconductor substrate 16 is, e.g., a silicon wafer. Transistors (not illustrated), etc. are formed on the semiconductor substrate 16. On the semiconductor substrate 16 with the transistors formed on, an inter-layer insulation film 18 of, e.g., a silicon oxide film is formed. The inter-layer insulation film 18 is formed by, e.g., CVD. A plurality of the inter-layer insulation film 18 are formed on the semiconductor substrate 16, but one of the inter-layer insulation films is illustrated in FIG. 2A. Conductor plugs 20 are buried in the inter-layer insulation film 18. The conductor plugs 20 are electrically connected to, e.g., the source/drain diffused layer (not illustrated), the gate electrodes (not illustrated), etc. of the transistors.

The TTV (Total Thickness Variation) of the semiconductor substrate 16 is, e.g., 5 μm. A TTV means flatness of a wafer and a difference between a maximum value $d_{max}$ and a minimum value $d_{min}$ of the thickness of the entire wafer surface.

Next, as illustrated in FIG. 2B, a 500 nm-thickness seed layer 22 of copper or nickel is formed on the entire surface by, e.g., sputtering.

Next, as illustrated in FIG. 3A, a photoresist film 24 is formed on the entire surface by spin coating.

Next, by photolithography, openings 26 are formed in the photoresist film 24 down to the seed layer 22. The openings 26 are for forming interconnections 28 (see FIG. 3B).

Next, as illustrated in FIG. 3B, interconnections 28 of Cu are formed in the openings 26 by electroplating. Then, the photoresist film 24 is released (see FIG. 4A).

Figure 4A:
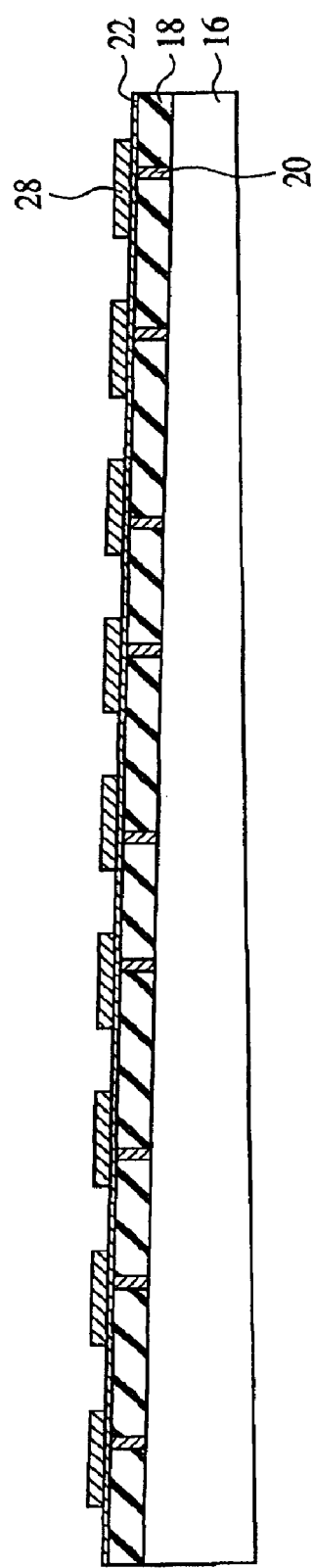
FIGS. 4A and 4B are views of the semiconductor device in the steps of the semiconductor fabrication method according to the first embodiment of the present invention, which illustrate the method (Part 3).
Figure 4B:
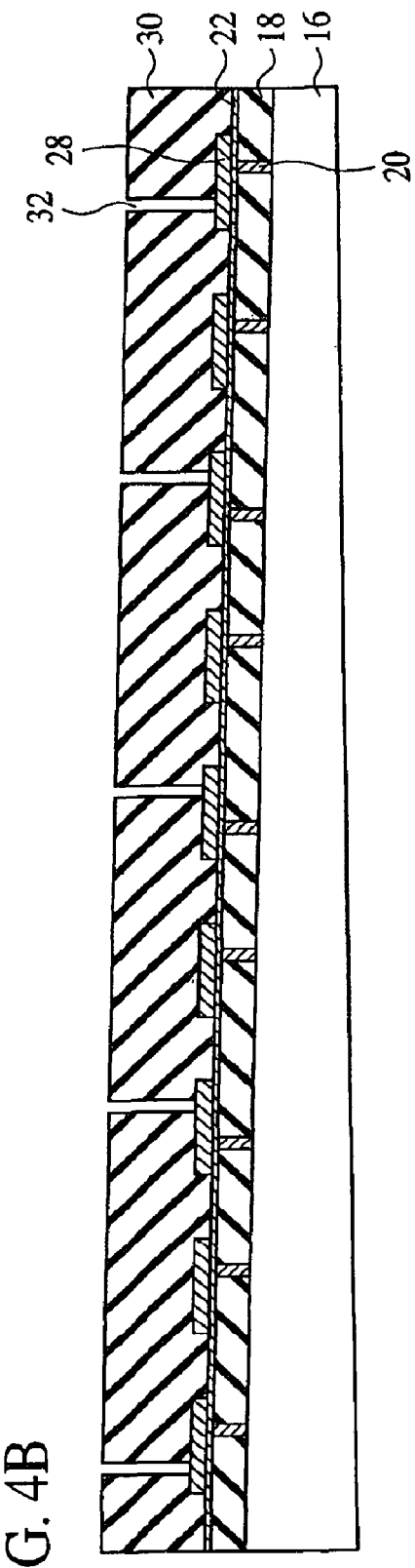

Then, as illustrated in FIG. 4B, a photoresist film 30 is formed on the entire surface by spin coating.

Next, openings 32 are formed in the photoresist film 30 down to the interconnections 28 by photolithography. The openings 32 are for forming conductor plugs 34 (see FIG. 5A).

Next, as illustrated in FIG. 5A, conductor plugs 34 of Cu are formed in the openings 32 by electroplating. Then, the photoresist film 30 is released.

Next, as illustrated in FIG. 5B, the seed layer 22 exposed around the conductor plugs 34 are removed by wet etching. The etching liquid is, e.g., an about 1-10% ammonium persulfate aqueous solution. The etching period of time is, e.g., about 2 minutes. When the seed layer 22 is removed, the surfaces of the interconnections 28 and the conductor plugs 34 are also etched a little, but the seed layer 22 can be etched in a short period of time because the thickness of the seed layer 22 is sufficiently smaller in comparison with the sizes of the interconnections 28 and the conductor plugs 34. Accordingly, in etching the seed layer 22, the interconnections 28 and the conductor plugs 34 are never excessively etched.

Next, a resin film 8 is placed on the semiconductor substrate 16. The resin film 8 is the film for forming insulation layers (trade name: Ajinomoto Build-up Film: ABF) by AJINOMOTO CO., INC. The Ajinomoto Build-up Film is a resin film comprising a matrix of epoxy resin mixed with an inorganic filler of silica. The thickness of the resin film 8 is 30 μm.

The resin film may be, other than the above-described film, a liquid crystal polymer film (trade name: Vecstar) by KURARAY CO., LTD., a polyethylene naphthalate film (trade name: Teonex® PEN Film) by Teijin DuPont Films Limited.

The thickness of the resin film 8 is 30 μm here but is not essentially 30 μm. However, when the resin film 8 which is thinner than the TTV of the semiconductor substrate 16 is used, a part of the resin film is not cut. The thickness of the resin film 8 must be larger than the TTV of the semiconductor substrate 16.

Figure 6A:
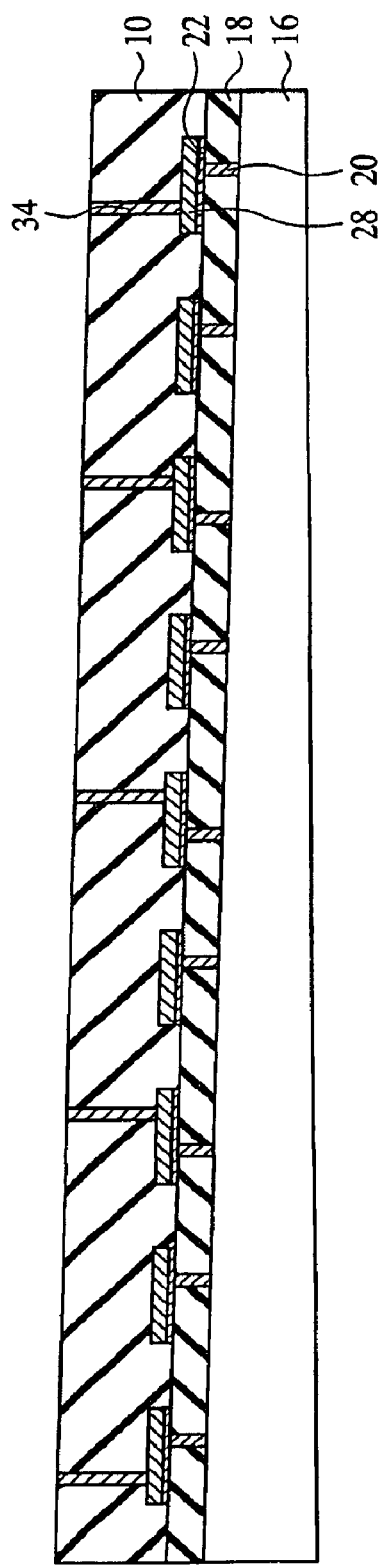
FIGS. 6A and 6B are views of the semiconductor device in the steps of the semiconductor fabrication method according to the first embodiment of the present invention, which illustrate the method (Part 5).
Figure 7A:
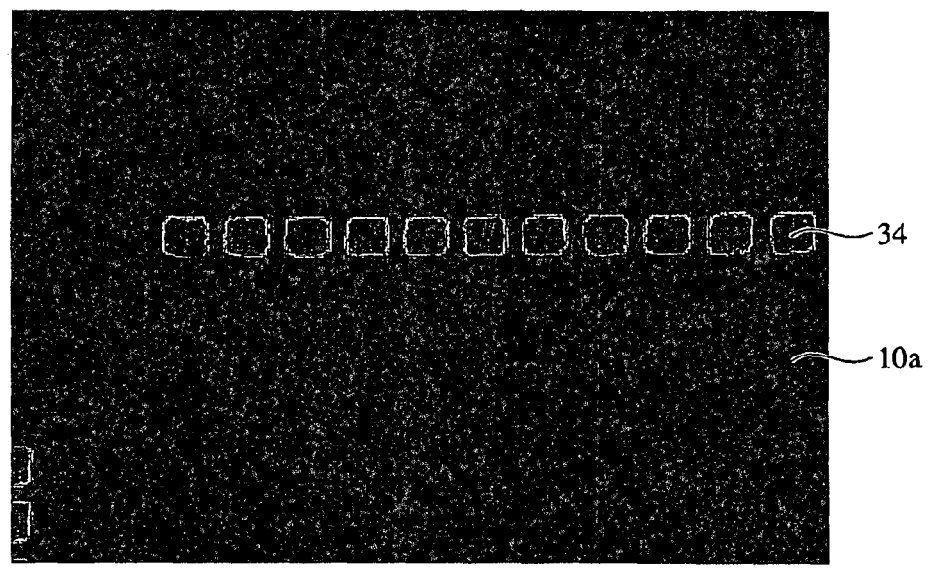
FIGS. 7A and 7B are views of the semiconductor device in the steps of the semiconductor fabrication method according to the first embodiment of the present invention, which illustrate the method (Part 6).
Figure 7B:
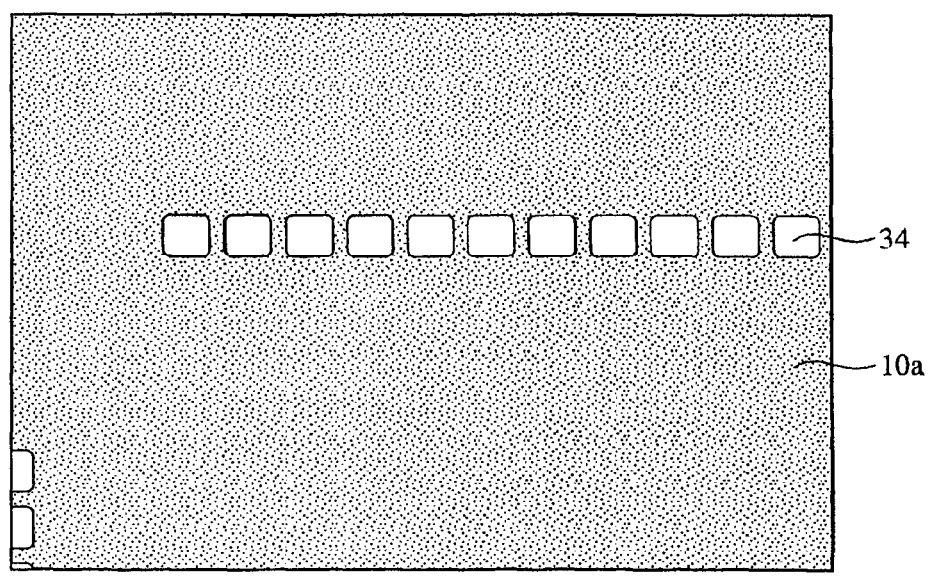

Next, by using a vacuum press, the resin film 8 is applied to the semiconductor substrate 16 with the inter-layer insulation film 18, etc. formed on (see FIG. 6A). Conditions for the vacuum press are, e.g., 100° C. and 1 MPa. Thus, the resin film 8 is formed on the semiconductor substrate 16.

Next, by thermal processing, the resin film 8 is solidified. Conditions for the thermal processing are, e.g., 170° C. and 1 hour. Thus, the resin layer 10 of the resin film 8 is formed on the semiconductor substrate 16.

Then, the semiconductor substrate 16 is fixed to a chuck table (not illustrated) by vacuum adsorption. The chuck table is a table for fixing wafers, etc. when they are processed. The semiconductor substrate 16 is fixed to the chuck table on the second surface (back surface) of the semiconductor substrate 16, i.e., the surface of the semiconductor substrate 16, where the resin layer 10 is not formed. It is preferable to use pin chuck when the semiconductor substrate 16 is fixed to the chuck table.

Figure 6B:
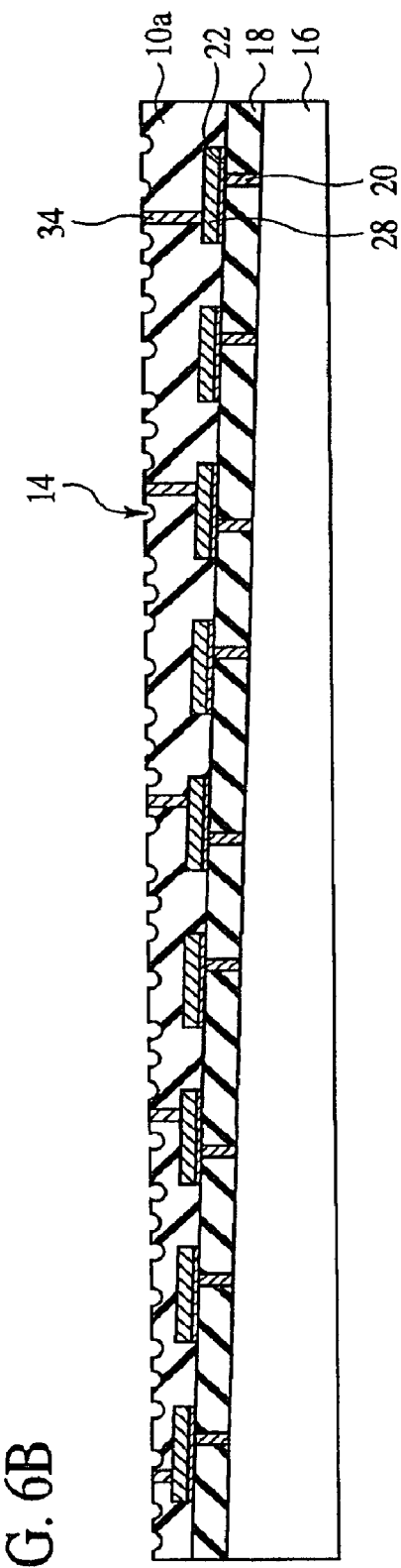

Next, while the semiconductor substrate 16 is being rotated, the surface part of the resin layer 10 and the upper parts of the conductor plugs 34 are cut with a cutting tool 12 of diamond to an about 10 μm-thickness of the resin layer 10 (see FIG. 1B and FIG. 6B).

Conditions for cutting the surface part, etc. of the resin layer 10, etc. are as exemplified below.

The rake of the cutting tool 12 is 0 degrees. The rake is an angle formed by a plane perpendicular to the cutting surface of an object-to-be-cut, and a front surface (the rake face) of the cutting tool blade, that is forward in the direction of advance of the cutting tool. Generally, as the rake angle is larger, the cut is better. However, the blade is more damaged, and the life of the blade tends to become shorter. The rake angle is suitably 0-30 degrees. The rake angle is set as described above in the present embodiment, in which the object-to-be-cut is the relatively soft resinous material.

The rotation number of the chuck table is, e.g., 1000 rpm. With such rotation number, the cut speed is about 5 m/second when the rotation radius is about 5 cm. The cut amount of the cutting tool 12 is, e.g., about 5 μm. As described above, the cut amount is a cut depth of the cutting tool at the time of a cut. The feed speed of the cutting tool 12 is, e.g., 50 μm/second. The feed speed is a speed at which the cutting tool is advanced radially of the chuck table in cutting, i.e., in the direction interconnecting one point on the outer peripheral edge of the chuck table and the rotation center.

When the surface of the resin layer 10 is cut under such conditions, ten-point height of irregularities Rz of the surface of the resin layer 10a after cut (hereinafter the resin layer after cut will be called the resin layer 10a to be discriminated from the resin layer 10 before cut) is, e.g., about 1-2 μm. The ten-point height of irregularities Rz of the surface of the conductor plugs is, e.g., about 5-15 nm.

The ten-point height of irregularities Rz is given by extracting a roughness curve by a reference length in the direction of its average line, summing an average value of the absolute values of altitudes of the highest peak to the fifth peak and an average value of the absolute values of altitudes of the lowest valley to the fifth valley measured in the direction of the depth ratio from the average line of the extracted part, and expressing the sum in micrometer (μm) (refer to JIS B 0601-1994). That is, the ten-point height of irregularities Rz is the difference between the average of the five highest peaks from to the mean line and the average depth to the five deepest valleys from the mean line.

FIG. 7 is views of the surfaces of the resin layer and the conductor plugs when the resin layer and the conductor plugs are cut with the cutting tool. FIG. 7A is a view showing a photomicrograph, and FIG. 7B is a schematic view of FIG. 7A.

As seen in FIG. 7, suitable concavities and convexities are formed substantially equally in the surface of the resin layer 10a. On the other hand, the upper portions of the conductor plugs 34 are specular.

After the surface part of the resin layer 10 has been cut, the TTV of the thickness from the second surface (back surface) of the semiconductor substrate 16 to the surface of the resin layer 10a is 1 μm or below. The value of the TTV is smaller, the better. However, when the TTV is 1 μm or below, there is no problem.

The ten-point height of irregularities Rz of the surface of the resin layer 10a is about 1-2 μm here but is not essentially about 1-2 μm.

Figure 29:
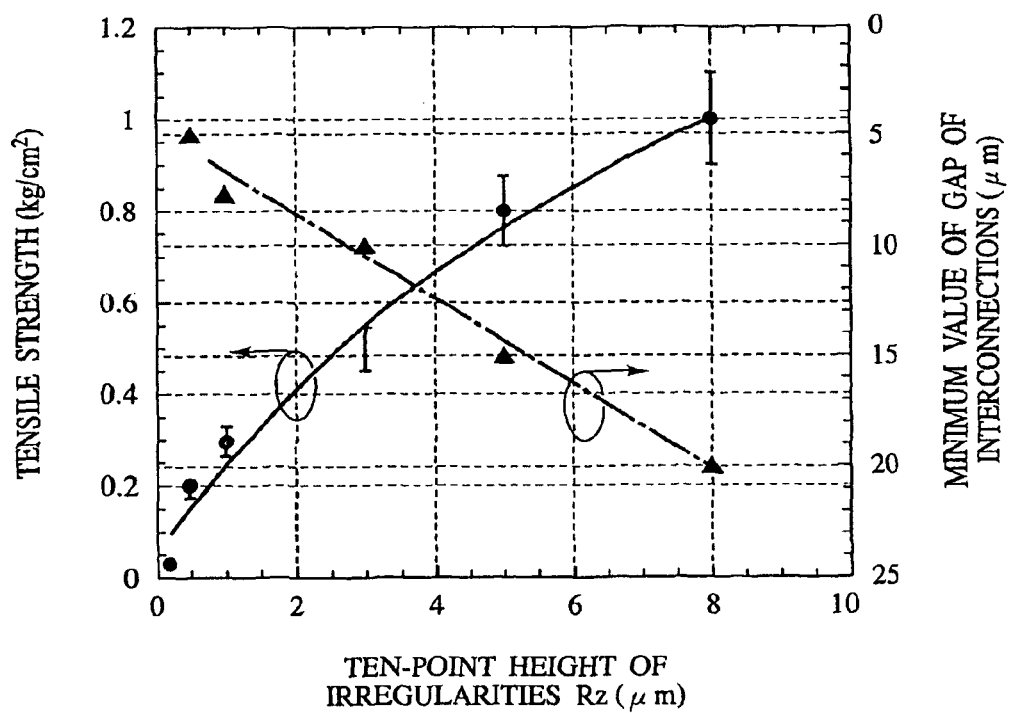
FIG. 29 is a graph of the relationships among the ten-point height of irregularities of the surface of the resin layer, the tensile strength of the plated film and the minimum value of the gap of the interconnections which allows the interconnections to be formed free from short-circuit.

FIG. 29 is a graph of relationships among the ten-point height of irregularities of the surface of the resin layer, the tensile strength of the plated film and the minimum value of the gap between the interconnections which allows the interconnections to be formed free from short-circuit. In FIG. 29, the ten-point height of irregularities on the surface of the resin layer is taken on the horizontal axis, and on the left vertical axis, the tensile strength of the plated film is taken, and on the right vertical axis, the minimum value of the gap between the interconnections which allows the interconnection to be formed free from short-circuit is taken.

In order to make the interconnections incapable of being easily released, the tensile strength of the interconnections must be at least about 0.2 kg/cm$^2$. As illustrated in FIG. 29, when the ten-point height of irregularities Rz of the surface of the resin layer 10a is 0.5 μm or above, the tensile strength of 0.2 kg/cm$^2$ or more can be secured, the adhesion between the resin layer 10a and the plated film can be sufficiently ensured. On the other hand, when the ten-point height of irregularities Rz of the surface of the resin layer 10a is below 0.5 μm, the tensile strength of the interconnections is much lowered. This is because the depth of the concavities 14 in the surface of the resin layer 10a is too small to anchor the seed layer 36 and the plated film 44 sufficiently into the resin layer 10, and the anchor effect is insufficient. Accordingly, it is preferable that the ten-point height of irregularities Rz of the surface of the resin layer 10a is 0.5 μm or above.

When the ten-point height of irregularities Rz of the surface of the resin layer 10a is 5 μm or below, the photoresist film formed on the resin layer 10a can be patterned, micronized, and interconnections of the plating film can be formed at an extremely small pitch. As illustrated in FIG. 29, with a ten-point height of irregularities Rz of 5 μm or below, the gap between the interconnections can be reduced to 15 μm or below without causing short-circuit. For the high integration of the semiconductor device, it is preferable that the thickness of the resin layer 10a is made as thin as about 10 μm. When the ten-point height of irregularities Rz of the surface of the resin layer 10a is above 5 μm, there is a risk that the lower interconnections 22 buried in the resin layer 10a and the upper interconnections 44 (see FIG. 10A) formed on the resin layer 10a may short with each other. It is not always easy to cut the surface of the resin layer so that the ten-point height of irregularities Rz of the surface of the resin layer 10a is 5 μm or above. Accordingly, it is preferable to set the ten-point height of irregularities Rz of the surface of the resin layer 10a at 5 μm or below.

For such reason, it is preferable to cut the surface of the resin layer 10 so that the ten-point height of irregularities Rz of the surface of the resin layer 10a is 0.5-5 μm. Conditions for cutting the surface of the resin layer 10 are suitably set, whereby the surface of the resin layer 10a can be set at a required roughness.

In a case that as the material of the resin layer 10, a resin film containing a filler mixed in the matrix of a resin is used, when the surface of the resin layer 10 is cut, the filler (not illustrated) is dug out of the resin layer 10, and pores are often formed in parts where the filler was dug out. However, the diameter of the filler is 2-5 μm, which is relatively small, and no excessively deep pores are formed in the surface of the resin layer 10a. No problem is caused.

Figure 8A:
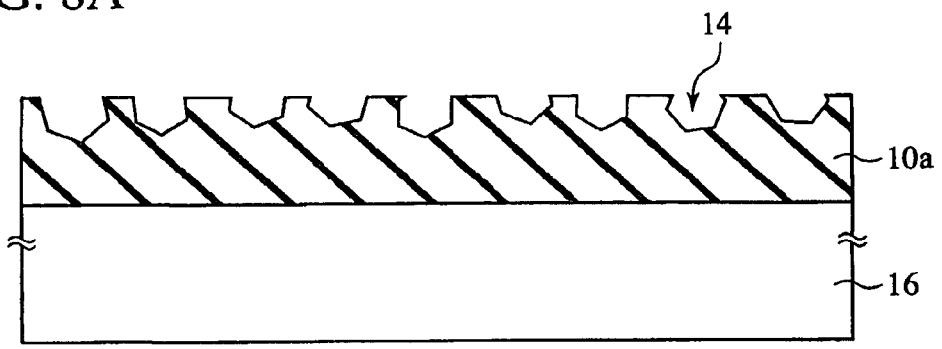
FIGS. 8A to 8C are views of the semiconductor device in the steps of the semiconductor fabrication method according to the first embodiment of the present invention, which illustrate the method (Part 7).

Thus, the concavities and convexities 14 of suitable roughness are formed in the surface of the resin layer 10a (see FIG. 8A).

The resin film 8 formed of the matrix of epoxy resin with an inorganic filler mixed in is used here. However, the filler is not essentially an inorganic material and can be an organic material. For example, a resin film formed of a matrix of epoxy resin containing a rubber-based organic filler may be used.

Figure 13A:
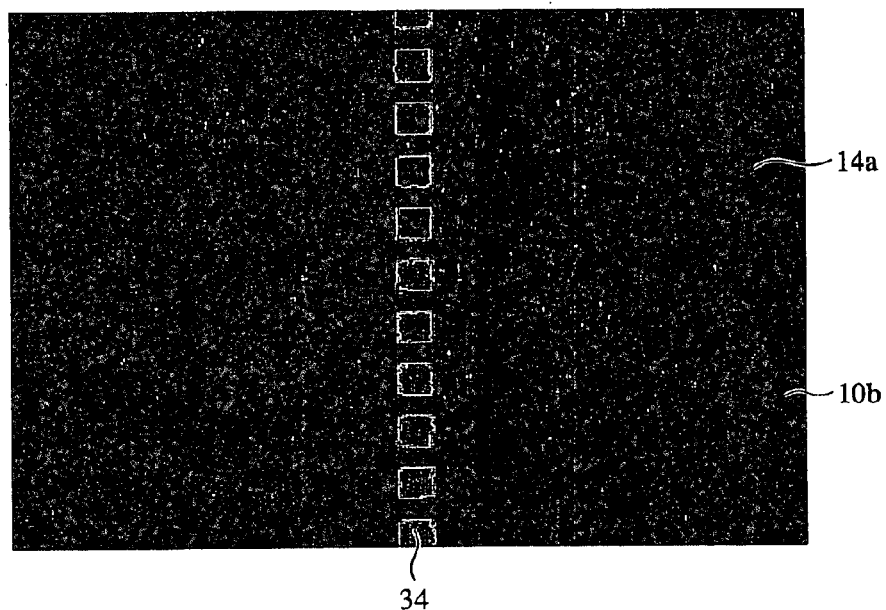
FIGS. 13A and 13B are views of the resin film having a matrix of epoxy resin containing a rubber-based filler, which is cut with the cutting tool.
Figure 13B:
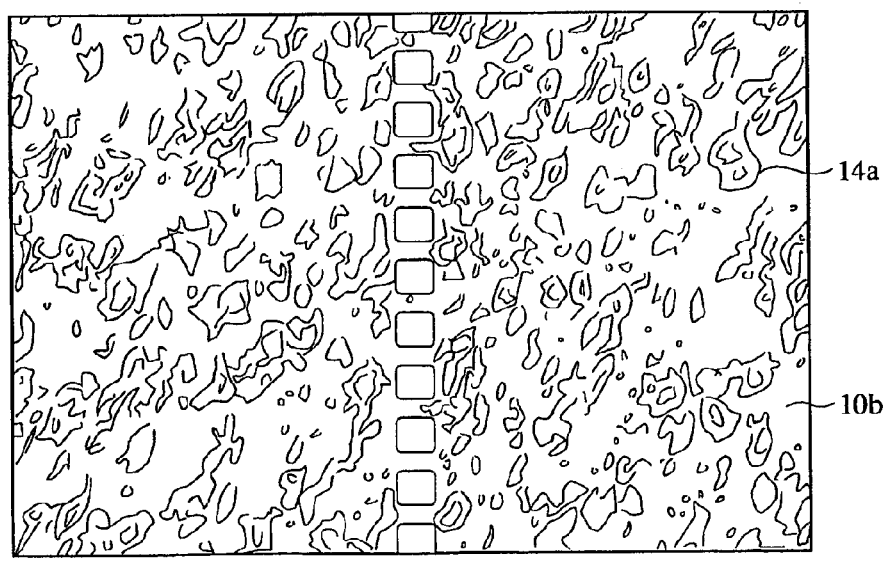

FIGS. 13A and 13B are views of a resin film formed of a matrix of epoxy resin containing a rubber-based filler, which is cut with a cutting tool. FIG. 13A is a view showing a photomicrograph, and FIG. 13B is a schematic view of FIG. 13A.

As seen in FIG. 13, when the filler is a rubber-based material, suitable concavities and convexities 14a are formed in the surface of the resin layer 10b. On the other hand, the upper surface of conductor plugs 34 are specular.

Thus, the filler mixed in the resinous matrix may be an organic material.

The cutting here is conducted by advancing the cutting tool 12 straight in one direction while the semiconductor substrate 16 is being rotated. However, it is also possible to conduct the cutting by rotating a wheel (not illustrated) with the cutting tool 12 mounted while the semiconductor substrate 16 is being advanced straight in one direction.

Figure 8B:
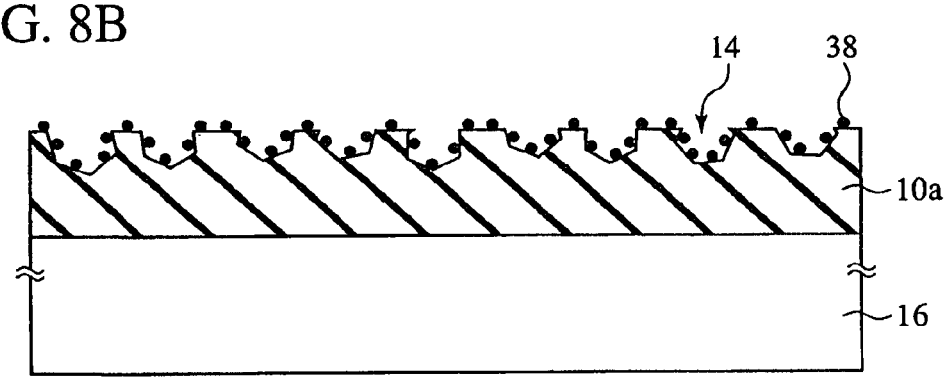
Figure 8C:
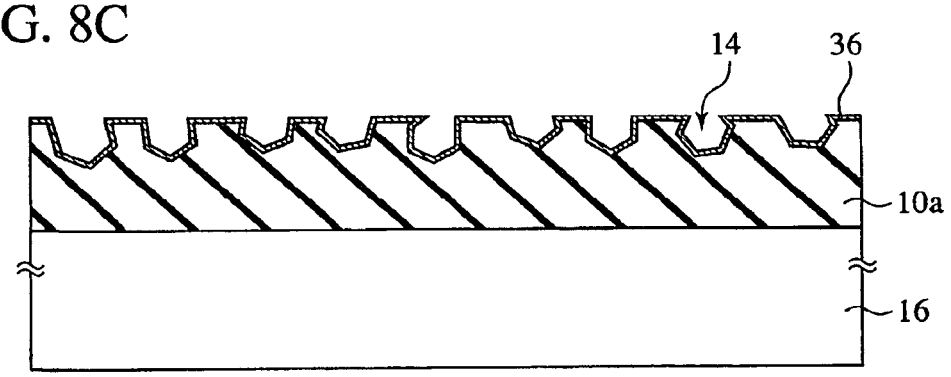
Figure 9A:
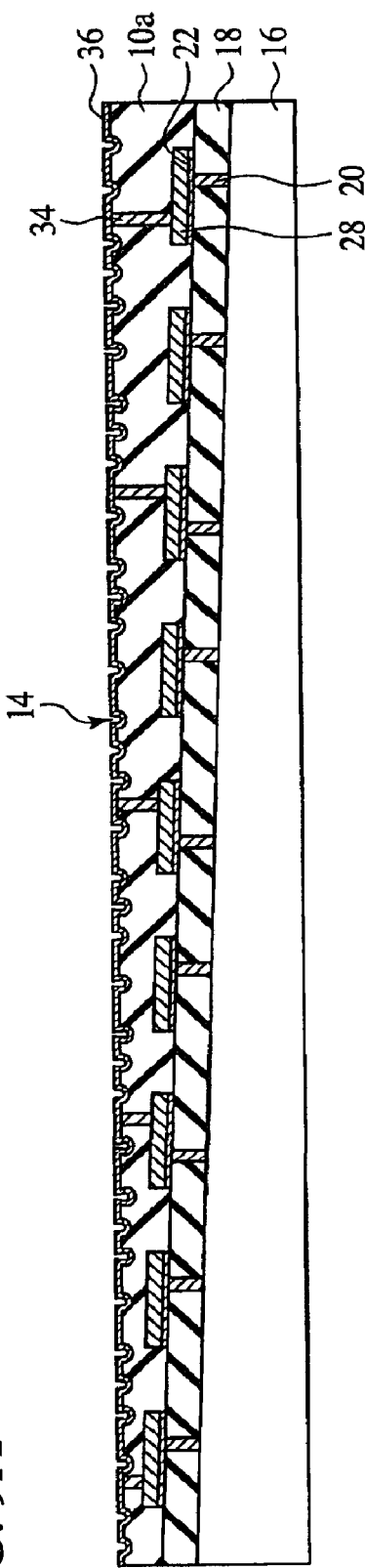
FIGS. 9A and 9B are views of the semiconductor device in the steps of the semiconductor fabrication method according to the first embodiment of the present invention, which illustrate the method (Part 8).

Next, a seed layer 36 of copper or nickel is formed on the resin layer 10a by electroless plating (see FIG. 8C or FIG. 9A). The seed layer 36 is formed as exemplified below.

First, the resin layer 10a is conditioned by using a conditioner. The conditioning is chemical liquid processing for removing contaminants from the surface of the resin layer 10a and making the surface of the resin layer 10a easy for a catalyst to adhere to. The conditioner is, e.g., a conditioner (Model: 3320) by Tekran Inc. The conditioning temperature is, e.g., 50° C. The conditioning period of time is, e.g., 5 minutes. Then, the surface of the resin layer 10a is rinsed with water.

Then, as illustrated in FIG. 8B, a catalyst 38 which is to be the core in forming the electroless plating film is adhered to the surface of the resin layer 10a.

Specifically, after the resin layer 10a is immersed in a chemical liquid for the pre-processing, the resin layer 10a is immersed in the catalyst liquid without rinsing off the chemical liquid for the pre-processing. The chemical liquid for the preprocessing is, e.g., a chemical liquid for the pre-processing (type: Cataprep 404) by Rohm and Haas Electronic Materials. The temperature of the chemical liquid for the pre-processing for the resin layer 10a to be immersed in is, e.g., the room temperature. The time of immersing the resin layer 10a in the chemical liquid for the pre-processing is 90 seconds. The catalyst liquid is a solution containing Pd—Sn complex. For example, a catalyst liquid (type: Cataposit 404) by Rohm and Haas Electronic Materials is used. The temperature of the catalyst liquid at the time of immersing the resin layer 10a is, e.g., 55° C. The period time of immersing the resin layer 10a in the catalyst liquid is, e.g., 3 minutes. Thus, the Pd—Sn complex adheres to the surface of the resin layer 10a. Then, the surface of the resin layer 10a is rinsed with water. Next, accelerator processing is performed. To be specific, the resin layer 10a is immersed in an accelerator. Thus, tin salt is dissolved, and the catalyst 38 of metal palladium is produced by the oxidation-reduction reaction. The accelerator is an accelerator (Type: Accelerator 19E) by Rohm and Haas Electronic Materials.

Thus, the catalyst 38 which is to be core in forming the electroless plating film is adhered to the surface of the resin layer 10a.

Then, the resin layer 10a is immersed in an electroless plating liquid. The electroless plating liquid is, e.g., an electroless plating liquid (Type: Cuposit 328) by Rohm and Haas Electronic Materials. Thus, the copper ions are reduced with the electrons emitted when the reducing agent in the electroless plating liquid is oxidized on the surface of the catalyst (palladium) 38, and the electroless plating film 36 of copper is formed.

Thus, the seed layer 36 of the electroless plating film of, e.g., a 0.3-0.5 μm-thickness is formed.

Because of the relatively thin seed layer 36 formed on the resin layer 10a having the concavities formed in the surface, the parts of the seed layer 36 formed in the concavities 14 are surely secured in the concavities 14. Accordingly, the adhesion between the seed layer 36 and the resin layer 10a can be sufficiently ensured.

Figure 9B:
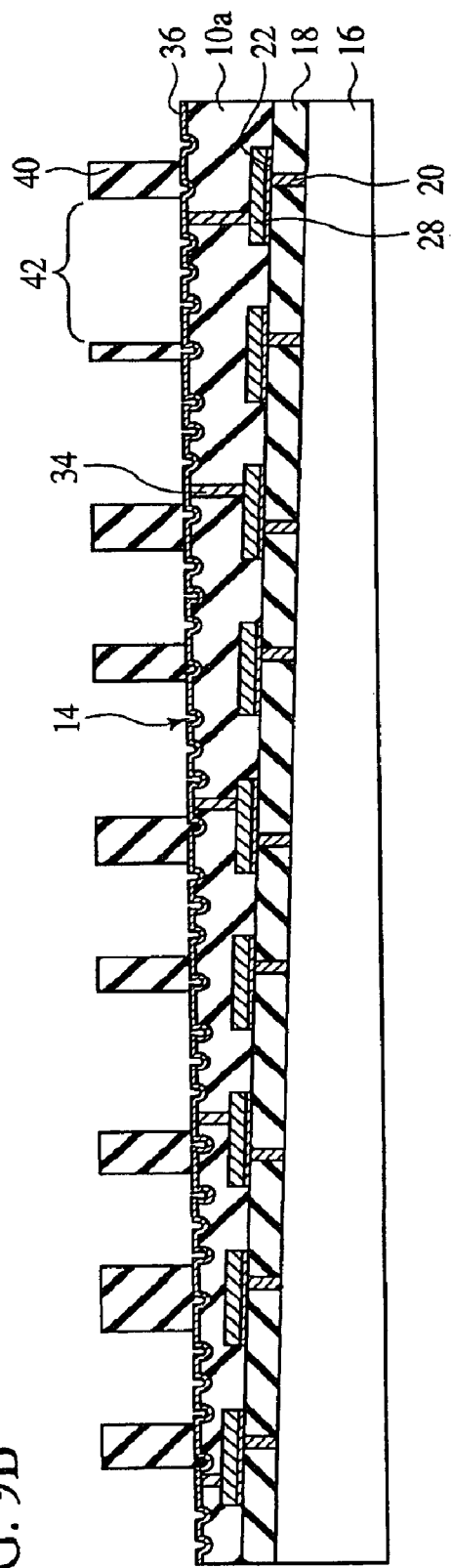

Next, as illustrated in FIG. 9B, a photoresist film 40 is formed on the entire surface by spin coating.

Then, openings 42 are formed in the photoresist film 40 down to the seed layer 36 by photolithography. The openings 42 are for forming interconnections 44 (see FIG. 8A). Without excessively deep pores formed in the surface of the resin layer 10a, no excessively deep concavities are formed in the surface of the seed layer 36 either. Accordingly, even when the photoresist film 40 is patterned, micronized, the pattern of the photoresist film 40 can be good.

Figure 10A:
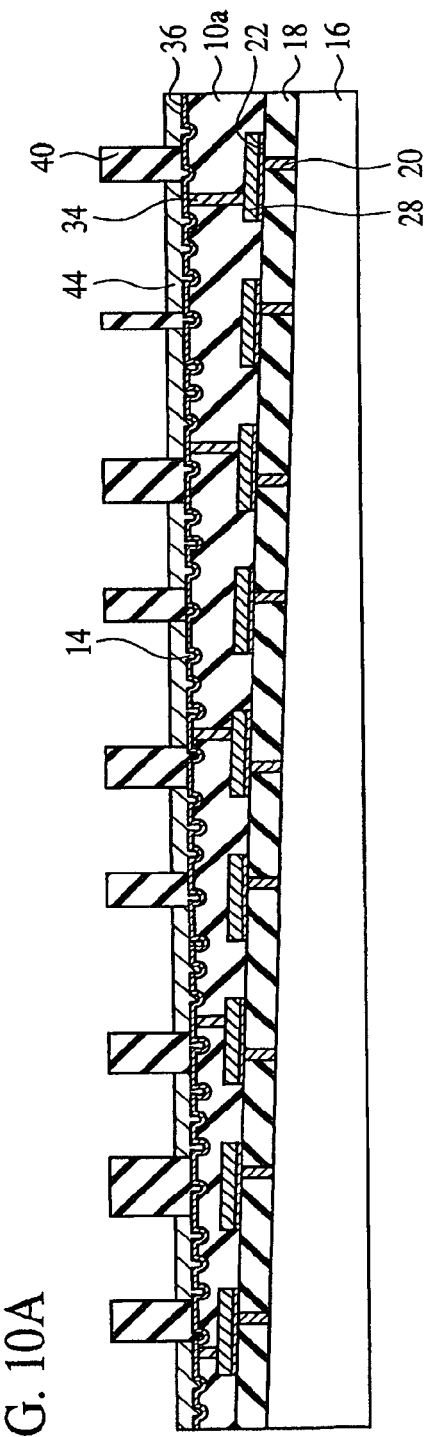
FIGS. 10A and 10B are views of the semiconductor device in the steps of the semiconductor fabrication method according to the first embodiment of the present invention, which illustrate the method (Part 9).

Then, as illustrated in FIG. 10A, the interconnections 44 of Cu are formed on the seed layer 36 in the openings 42 in the photoresist film 40. As described above, even when the photoresist film is patterned, micronized, the pattern can be good, which permits the interconnections 44 to be formed at an extremely small pitch. The adhesion between the seed layer 36 and the resin layer 10a is sufficiently secured, whereby the interconnections 44 can be surely secured to the resin layer 10a via the seed layer 36.

Figure 10B:
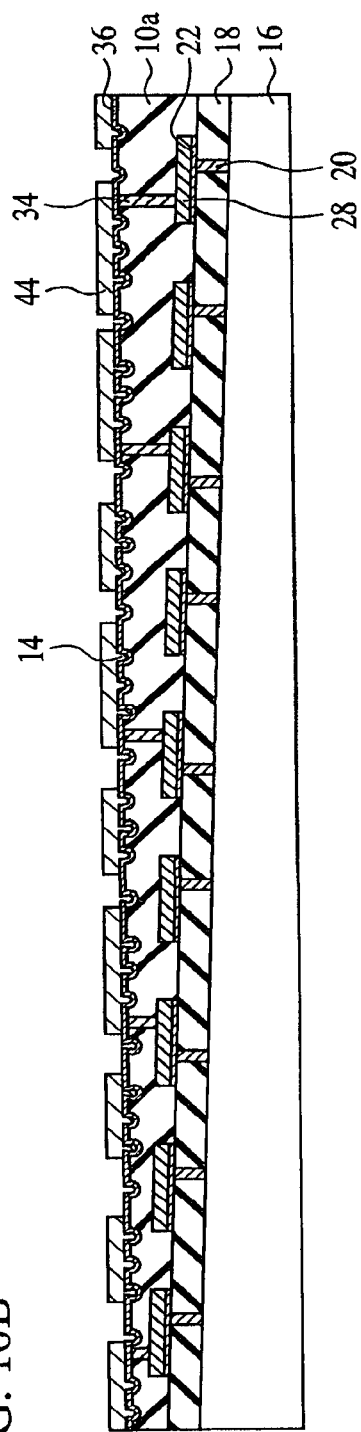

Then, as illustrated in FIG. 10B, the photoresist film 40 is released.

Next, a photoresist film 46 is formed by spin coating on the entire surface of the resin layer 10a with the interconnections 44 formed on.

Figure 11A:
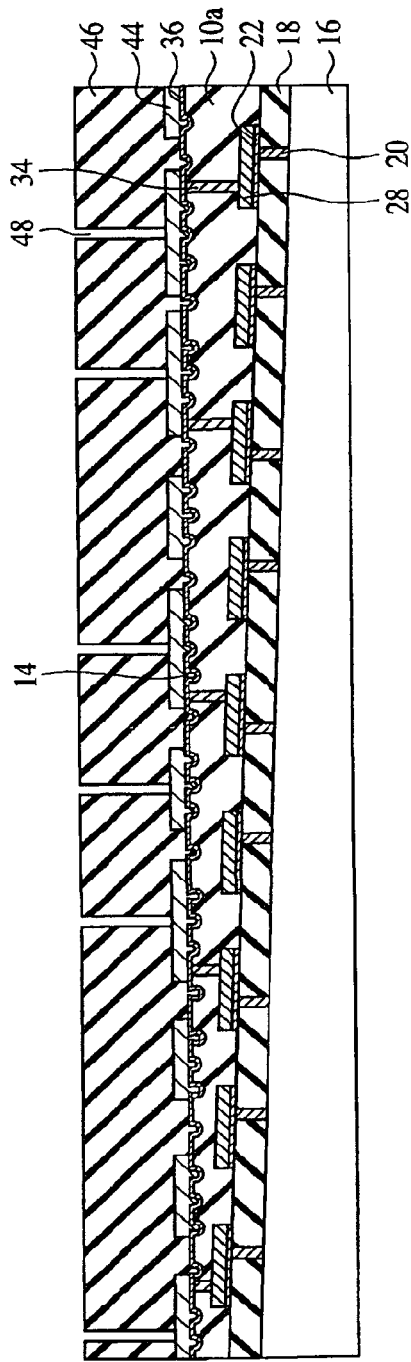
FIGS. 11A and 11B are views of the semiconductor device in the steps of the semiconductor fabrication method according to the first embodiment of the present invention, which illustrate the method (Part 10).

Next, by photolithography, openings 48 are formed in the photoresist film 46 down to the interconnections 44 as illustrated in FIG. 11A. The openings 48 are for forming conductor plugs 50 (see FIG. 11B).

Figure 11B:
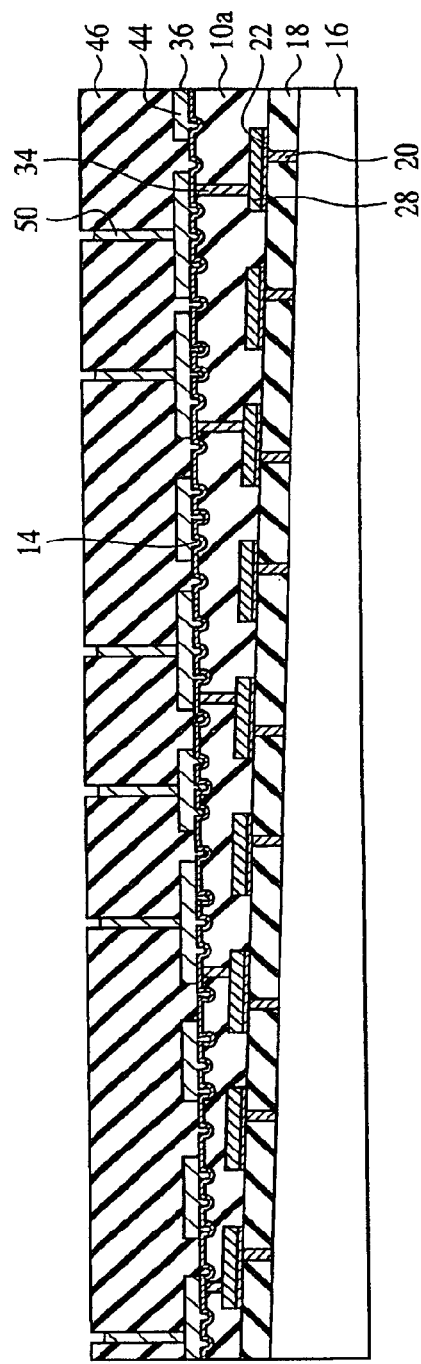

As illustrated in FIG. 11B, the conductor plugs 50 of Cu are formed in the openings 48 by electroplating. Then, the photoresist film 46 is released.

Figure 12A:
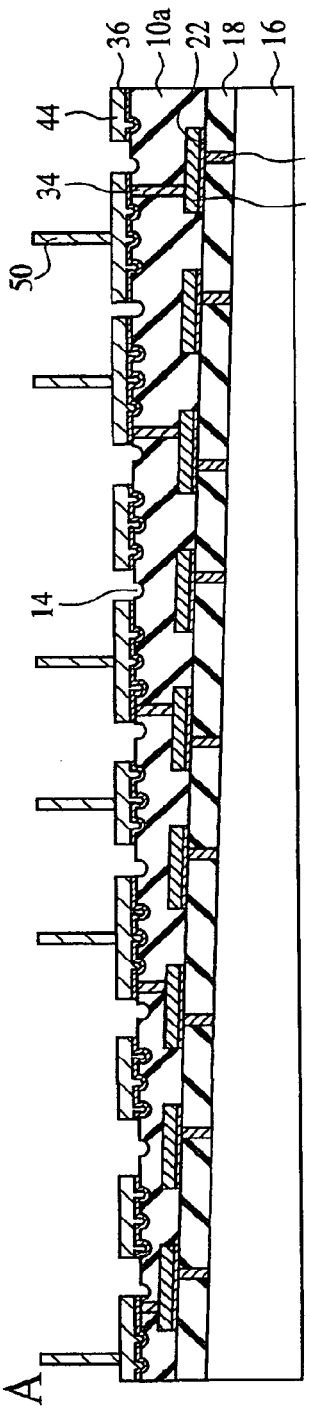
FIGS. 12A through 12C are views of the semiconductor device in the steps of the semiconductor fabrication method according to the first embodiment of the present invention, which illustrate the method (Part 11).

Then, as illustrated in FIG. 12A, the seed layer 36 exposed around the interconnections 44 is removed by wet etching. The etching liquid is, e.g., an about 1-10% ammonium peroxide aqueous solution. The etching period of time is, e.g., about 2 minutes. When the seed layer 36 is etched off, the surfaces of the interconnections 44 and the conductor plugs 48 are also a little etched. However, because of the sufficiently smaller thickness of the seed layer 36 than the sizes of the interconnections 44 and the conductor plugs 48, the seed layer 36 can be etched in a short period of time. Accordingly, when the seed layer 36 is etched, the interconnections 44 and the conductor plugs 48 are never excessively etched.

Then, a resin film 51 is prepared. The resin film 51 is the same resin film (film for forming insulation layers by AJINOMOTO CO., INC.) (trade name: Ajinomoto Build-up Film: ABF) as the resin film 8 described above is used.

Figure 12B:
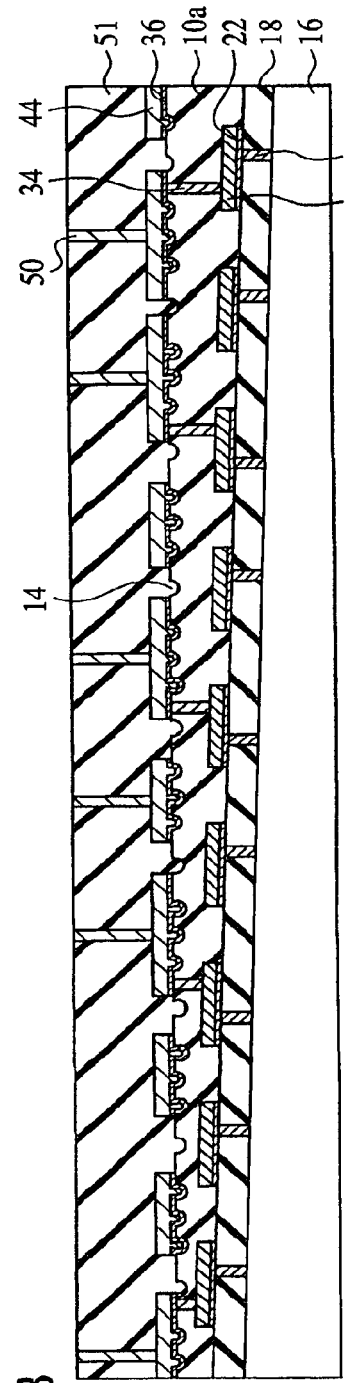
Figure 12C:
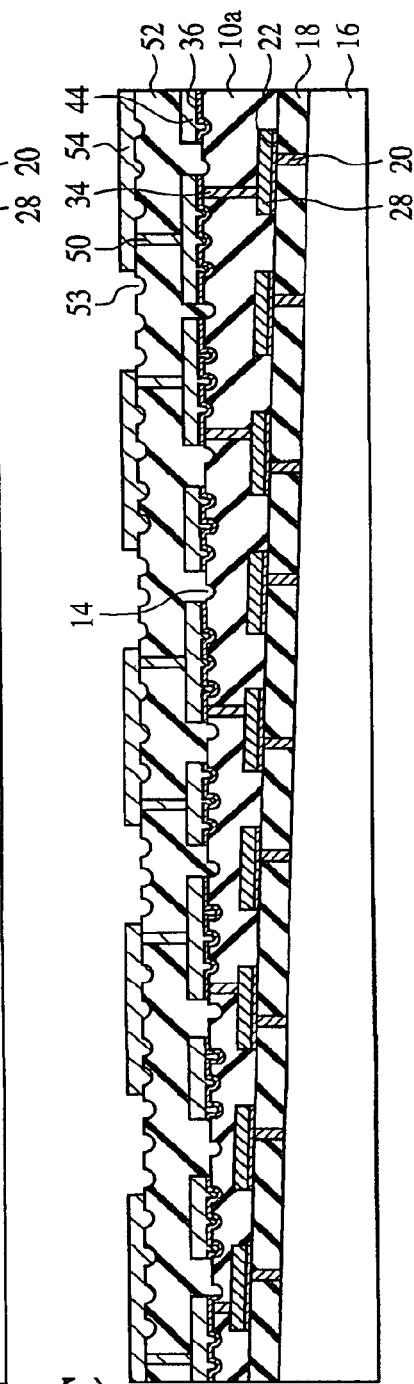

Then, the resin film 51 is applied to the resin layer 10a by a vacuum press apparatus (see FIG. 12B). Conditions for the vacuum pressing are, e.g., 100° C. and 1 MPa, as are those for vacuum pressing the resin film 8. Thus, the resin film 51 is formed on the resin layer 10a with the interconnections 44, the conductor plugs 50, etc. formed on.

Then, the resin layer 51 is solidified by thermal processing. Conditions for the thermal processing are, e.g., 170° C. and 1 hour, as are those for solidifying the resin film 8 described above. Thus, the resin layer 52 of the resin film 51 is formed on the resin layer 10a with the interconnections 44, the conductor plugs 50, etc. formed on.

Then, the surface part of the resin layer 52 is cut. Conditions for cutting the surface part of the resin layer 52 are the same as those for cutting the surface part of the resin layer 10. That is, the rake angle of the cutting tool 12 is 0 degrees. The rotation number of the chuck table is, e.g., 1000 rpm. With such rotation number, the cut speed is about 5 m/second when the rotation radius is about 5 cm. The cut amount of the cutting tool 12 is, e.g., about 5 μm. The feed speed of the cutting tool 12 is, e.g., 50 μm/second. When the cut is performed under these conditions, the suitable concavities and convexities 53 are formed in the surface of the resin layer 52. Thus, the ten-point height of irregularities Rz of the surface of the resin layer 52 is, e.g., about 1-2 μm.

The ten-point height of irregularities Rz of the surface of the resin layer 52 is about 1-2 μm here but is not essentially about 1-2 μm. The surface of the resin layer 52 may be cut so that the ten-point height of irregularities Rz of the surface of the resin layer 52 is, e.g., 0.5-5 μm.

The cutting here is conducted by advancing the cutting tool 12 straight in one direction while the semiconductor substrate 16 is being rotated. However, it is also possible to conduct the cutting by rotating a wheel (not illustrated) with the cutting tool 12 mounted while the semiconductor substrate 16 is being advanced straight in one direction.

Then, a seed layer (not illustrated) is formed on the resin layer 52 and the conductor plugs 50 by electroless plating. The technique for forming the seed layer is the same as the technique for forming the seed layer 36 described above. That is, after the conditioning, the adhesion of the catalyst to the surface of the resin layer, etc., the seed layer is formed by electroless plating.

Next, a photoresist film (not illustrated) is formed on the entire surface by spin coating.

Then, openings (not illustrated) are formed in the photoresist film down to the seed layer by photolithography.

Next, by electroplating, interconnections 54 of Cu are formed in the openings of the photoresist film. Then, the photoresist film is released.

Then, the seed layer exposed around the interconnection 54 is removed by wet etching. The etching liquid is, e.g., an about 1-10% ammonium persulfate aqueous solution. The etching period of time is, e.g., about 2 minutes. When the seed layer is etched off, the surfaces of the interconnections 54 are also etched a little. However, because of the thickness of the seed layer which is sufficiently smaller in comparison with the size of the interconnections 54, the seed layer can be etched in a short period of time. Accordingly, in etching the seed layer, the interconnections 54 are never excessively etched.

Then, a resin layer and a metal interconnection layer may be further formed thereon.

Thus, the semiconductor device fabrication method according to the present embodiment is performed by using the plating method according to the present embodiment.

The plating method and the semiconductor device fabrication method according to the present embodiment is characterized mainly in that the surface of the resin layer is cut with the cutting tool so that the ten-point height of irregularities of the surfaces of the resin layers is 0.5-5 μm.

In the conventional plating method, as described above, the surface of the resin layer is roughened by the desmearing treatment. When the surface of the resin layer is roughened by the desmearing treatment, often about ten-odd μm-pores are formed. It is difficult to form a micronized pattern of a photoresist film on a resin layer with ten-odd μm-pores formed in. Accordingly, it is very difficult to form interconnections of a plating film on the resin layer at an extremely small pitch without causing short circuits, etc.

However, in the present embodiment, the surface of the resin layer is cut with the cutting tool, whereby the surface of the resin layer can be set at suitable roughness. According to the present embodiment, the surface of the resin layer can be suitably roughened, whereby the adhesion between the seed layer and the resin layer can be sufficiently ensured. Furthermore, extremely deep pores as formed by the desmearing treatment are not formed in the surface of the resin layer, which allows a micronized pattern of a photoresist film to be formed on the resin layer. Thus, according to the present embodiment, interconnections, etc. of a plating film can be formed on a resin film at an extremely small pitch while high reliability being ensured.

A Second Embodiment

The circuit board fabrication method according to a second embodiment of the present invention will be explained with reference to FIGS. 14A to 23. FIGS. 14A to 23 are sectional view of a circuit board in the steps of the circuit board fabrication method, which illustrate the method. The same members of the present embodiment as those of the plating method and the semiconductor device fabrication method according to the first embodiment illustrated in FIGS. 1A to 12B are represented by the same reference numbers not to repeat or to simplify their explanation.

The circuit board fabrication method according to the present embodiment is characterized mainly in that the dielectric film of capacitors is formed of a resin sheet, and the surface part of the dielectric film of the resin sheet is cut with a cutting tool.

Figure 14A:
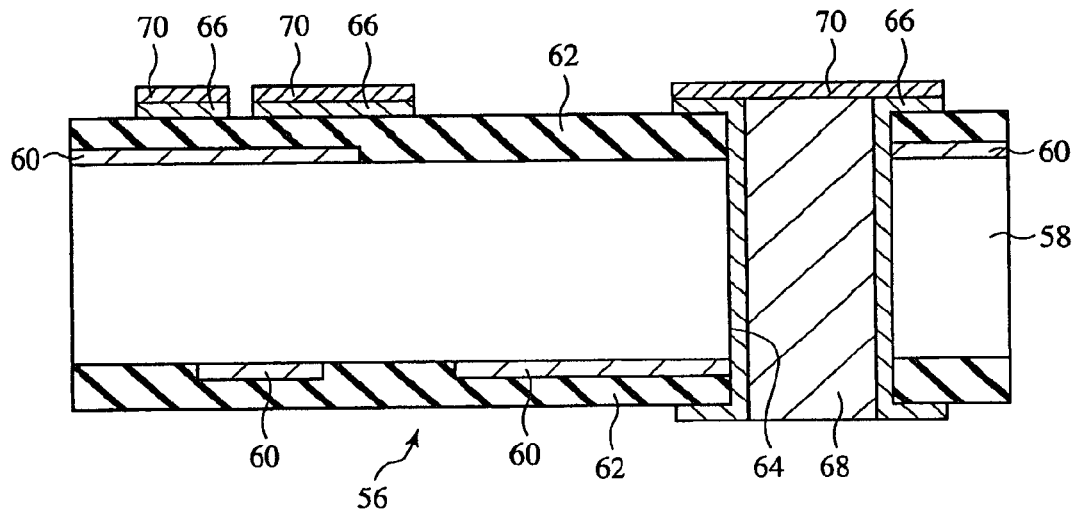
FIGS. 14A and 14B are views of a circuit board in the steps of the circuit board fabrication method according to a second embodiment of the present invention, which illustrate the method (Part 1).
Figure 14B:
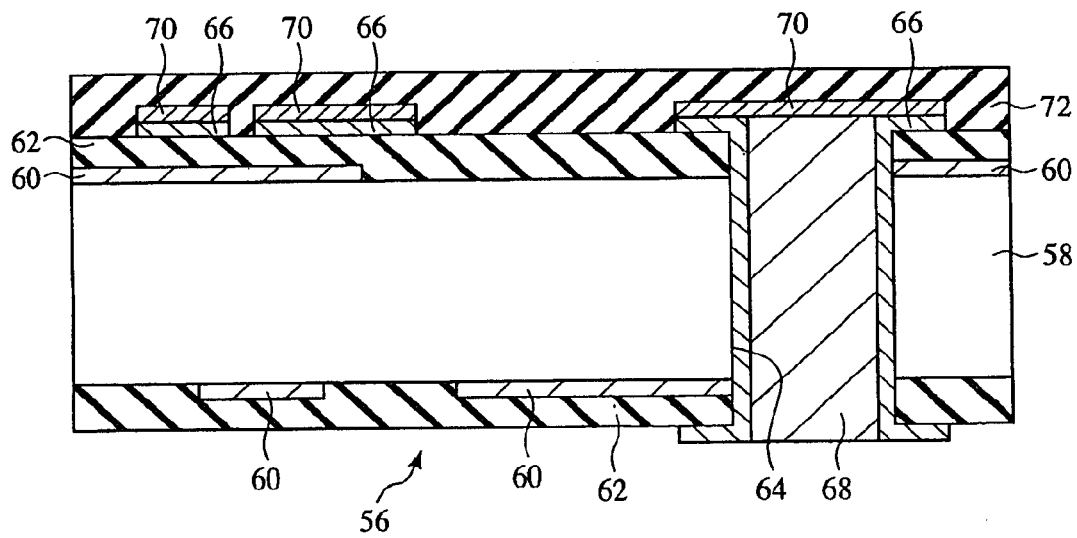

First, as illustrated in FIG. 14A, a core layer 56 is prepared. The core layer 56 has the following constitution, for example. That is, interconnections 60, etc. are formed on the upper surface and the under surface of a base substrate 58 of, e.g., epoxy resin. Insulation films 62 of, e.g., epoxy resin are formed respectively on the upper side and the under side of the base substrate 58 with the interconnections 60, etc. are formed on. A through-hole 64 is formed in the base substrate 58 and the insulation films 62. A conductor film 66 is formed in the through-hole 64. The conductor film 66 is formed also on the insulation layer 62. A via 68 is buried in the through-hole 64 with the conductor film 66 formed on. A conductor film 70 is formed on the via 68 and the conductor film 66. The conductor film 66 and the conductor film 70 form interconnections.

Next, a resin film of epoxy resin is placed on the core layer 56. This resin film is for forming the resin layer 72 (see FIG. 14B). The resin film is ABF (Ajinomoto Build-up Film), which is a film for forming insulation films, by AJINOMOTO CO., INC. The thickness of the resin film is 60 μm.

Then, the resin film is applied to the core layer 56 with a vacuum press apparatus. Conditions for vacuum pressing the resin film are, e.g., 100° C. and 1 MPa, which are the same as conditions for vacuum pressing the resin film 8 described in the first embodiment.

Then, the resin film is solidified by thermal processing. Conditions for the thermal processing are, e.g., 170° C. and 1 hour, which are the same as those for solidifying the resin layer 8 in the first embodiment. Thus, a resin layer (insulation layer) 72 of the resin film is formed on the base substrate 58 (see FIG. 14B).

Then, the surface of the resin layer 72 is cut with a cutting tool. Conditions for cutting the surface part of the resin layer 72 are the same as conditions for cutting the surface of the resin layer 10 described above. That is, the rake angle of the cutting tool 12 is 0 degrees. The rotation number of the chuck table is, e.g., 1000 rpm. With such rotation number, the cut speed is about 5 m/second when the rotation radius is about 5 cm. The cut amount of the cutting tool 12 is, e.g., about 5 μm. The feed speed of the cutting tool 12 is, e.g., 50 μm/second. When the cut is performed under these conditions, the ten-point height of irregularities Rz of the surface of the resin layer 72 is, e.g., about 1-2 μm.

The ten-point height of irregularities Rz of the surface of the resin layer 72 is about 1-2 μm here but is not essentially about 1-2 μm. The surface of the resin layer 72 may be cut so that the ten-point height of irregularities Rz of the surface of the resin layer 72 is, e.g., 0.5-5 μm.

The cutting here is conducted by advancing the cutting tool 12 straight in one direction while the base substrate 58 is being rotated. However, it is also possible to conduct the cutting by rotating a wheel (not illustrated) with the cutting tool 12 mounted while the base substrate 58 is being advanced straight in one direction (not illustrated).

Then, contact holes 74 are formed in the resin layer 72 down to the interconnections 70 by photolithography.

Then, a seed layer (not illustrated) of copper or nickel is formed on the entire surface by electroless plating. The technique for forming the seed layer is the same as the technique for forming the seed layer 36 described in, e.g., the first embodiment. That is, after the conditioning, the adhesion of a catalyst to the surface of the resin layer, etc. are performed, the seed layer is formed by electroless plating.

Then, a photoresist film (not illustrated) is formed on the entire surface by spin coating.

Next, openings (not illustrated) are formed in the photoresist film down to the seed layer by photolithography. The openings are for forming interconnections 76.

Next, by electroplating, the interconnections 76 of Cu are formed in the opening of the photoresist film. Then, the photoresist film is released.

Figure 15A:
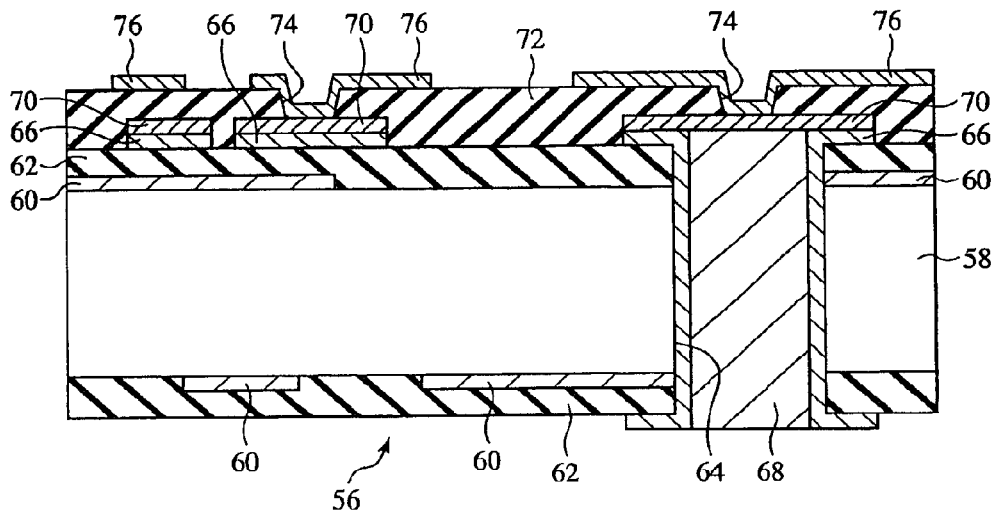
FIGS. 15A and 15B are views of the circuit board in the steps of the circuit board fabrication method according to the second embodiment of the present invention, which illustrate the method (Part 2).
Figure 15B:
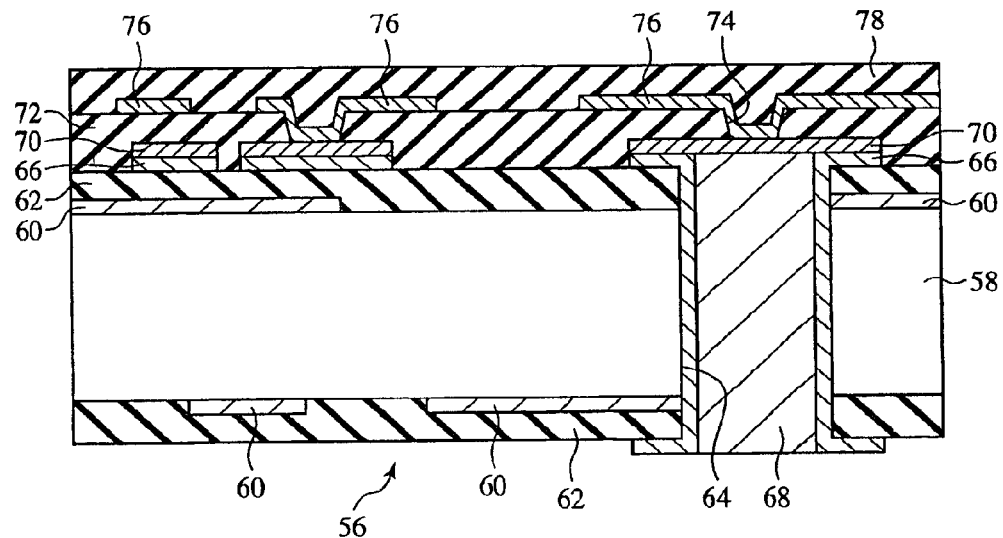

Next, the seed layer exposed around the interconnections 76 is removed by wet etching (see FIG. 15A). The etching liquid is, e.g., an about 1-10% ammonium persulfate aqueous solution. The etching period of time is, e.g., about 2 minutes. When the seed layer is etched off, the surfaces of the interconnections 76 are also etched a little. However, because of the thickness of the seed layer which is sufficiently smaller than the size of the interconnections 76, the seed layer can be etched in a short period of time. Thus, in etching the seed layer, the interconnections 76 are never excessively etched.

Then, a resin film is adhered to the base substrate 58 with a vacuum press apparatus. The resin film is for forming the resin layer 78. The resin film is ABF (Ajinomoto Build-up Film), which is a film for forming insulation layer by AJINO-MOTO CO., INC. The thickness of the resin film is 60 μm. Conditions for the vacuum pressing are, e.g., 100° C. and 1 MPa, which are the same as those for vacuum pressing the resin film 8 described in the first embodiment.

Next, the resin layer is solidified by thermal processing. Conditions for the thermal processing are, e.g., 170° C. and 1 hour, which are the same as those for solidifying the resin film 8 in the first embodiment. Thus, the resin layer (insulation layer) 78 of the resin film is formed on the base substrate 58 (see FIG. 15B).

Then, the surface of the resin layer 78 is cut with the cutting tool. Conditions for cutting the surface of the resin layer 78 are the same as those for cutting the surface part of the resin layer 10 described above. That is, the rake angle of the cutting tool 12 is 0 degrees. The rotation number of the chuck table is, e.g., 1000 rpm. With such rotation number, the cut speed is about 5 m/second when the rotation radius is about 5 cm. The cut amount of the cutting tool 12 is, e.g., about 5 μm. The feed speed of the cutting tool 12 is, e.g., 50 μm/second. When the cut is performed under these conditions, the ten-point height of irregularities Rz of the surface of the resin layer 78 is, e.g., about 1-2 μm.

The ten-point height of irregularities Rz of the surface of the resin layer 78 is about 1-2 μm here but is not essentially about 1-2 μm. The surface of the resin layer 78 may be cut so that the ten-point height of irregularities Rz of the surface of the resin layer 78 is, e.g., 0.5-5 μm.

The cutting here is conducted by advancing the cutting tool 12 straight in one direction while the base substrate 58 is being rotated. However, it is also possible to conduct the cutting by rotating a wheel (not illustrated) with the cutting tool 12 mounted while the base substrate 58 is being advanced straight in one direction.

Then, contact holes 80 are formed in the resin layer 78 down to the interconnections 76 by photolithography.

Next, a seed layer (not illustrated) of copper or nickel is formed on the entire surface by electroless plating. The technique for forming the seed layer is the same as that for forming the seed layer 36 described in, e.g., the first embodiment. That is, after the conditioning, the adhesion of a catalyst to the surface of the resin layer, etc. are performed, the seed layer is formed by electroless plating.

Then, a photoresist film (not illustrated) is formed on the entire surface by spin coating.

Next, openings are formed down to the seed layer are formed by photolithography. The openings are for forming the lower electrodes 82 of capacitors.

Next, the lower electrodes 82 of Cu are formed in the openings by electroplating. Then, the photoresist film is released.

Figure 16A:
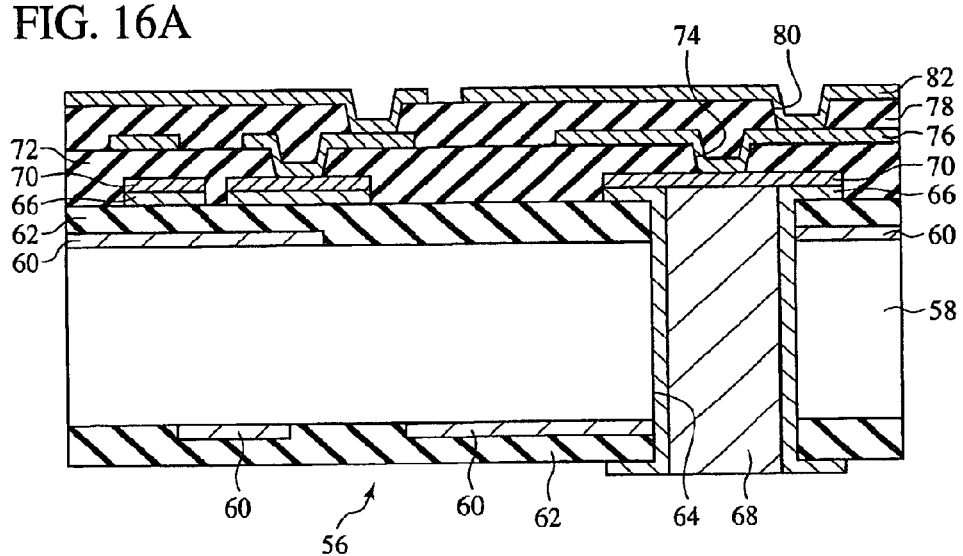
FIGS. 16A and 16B are views of the circuit board in the steps of the circuit board fabrication method according to the second embodiment of the present invention, which illustrate the method (Part 3).

Then, the seed layer exposed around the lower electrodes 82 is removed by wet etching (see FIG. 16A). The etching liquid is, e.g., an about 1-10% ammonium persulfate aqueous solution. The etching period of time is, e.g., about 2 minutes. When the seed layer is etched, the surfaces of the lower electrodes 82 are also a little etched. However, because of the thickness of the seed layer which is sufficiently smaller in comparison with the size of the lower electrodes 82, the seed layer can be etched in a short period of time. Thus, in etching the seed layer, the lower electrodes 82 are never excessively etched.

Then, a resin film 83 is prepared. The resin film 83 is for forming the resin layer 84. The resin film 83 is a resin film formed of a matrix of epoxy resin mixed with a filler of a high-dielectric constant substance whose specific dielectric constant is higher than the resin. The filler of a high-dielectric constant substance is formed of, e.g., $BaTiO_3$. The specific dielectric constant of the resin used as the matrix is about 3-5. The thickness of the resin film 83 is 60 μm.

The filler of a high-dielectric constant substance is $BaTiO_3$ here but is not essentially $BaTiO_3$. A material whose specific dielectric constant is higher than that of the resin forming the matrix can be used as the material of the filler. For example, the filler can be high-dielectric constant substance, such as $CaTiO_3$, $SrTiO_3$, $ZnTiO_3$, $PbTiO_3$, $CaZrO_3$, $BaZrO_3$, $PbZrO_3$, $Ba_xSr_{1-x}TiO_3$, $BaTi_xZr_{1-x}O_3$, $PbZr_xTi_{1-x}O_3$, $Pb_xLa_{1-x}Zr_yTi_{1-y}O_3$, $La_2Ti_2O_7$, $Nd_2Ti_2O_7$ or others. The filler can be a mixture of them.

Figure 16B:
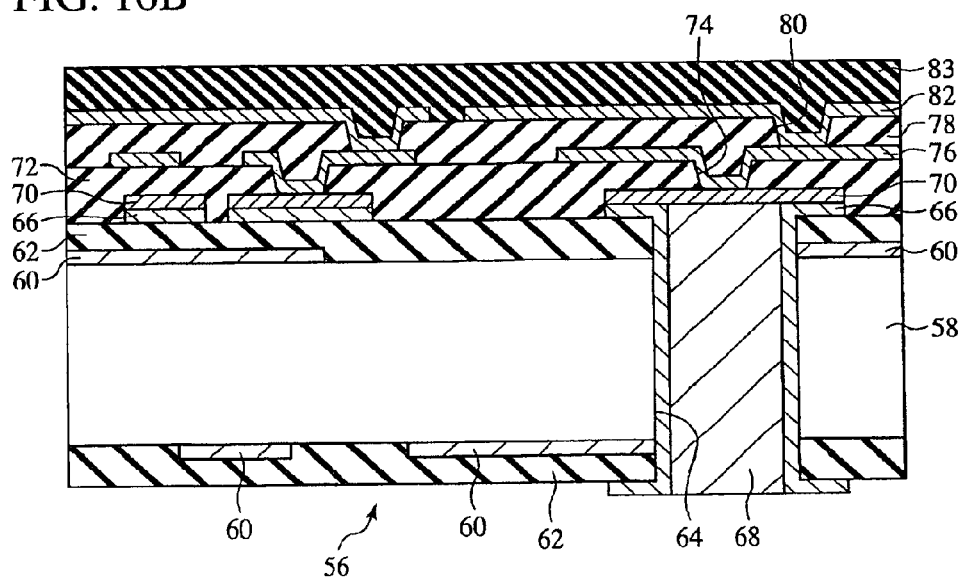

Then, as illustrated in FIG. 16B, the resin film 83 is applied to the base substrate 58 with a vacuum press apparatus. Conditions for the vacuum pressing are, e.g., 100° C. and 1 MPa, which are the same as those for the vacuum pressing the resin film 8 described in the first embodiment. Thus, the resin film 83 is formed on the base substrate 58.

Next, thermal processing is performed to solidify the resin film 83. Conditions for the thermal processing are, e.g., 170° C. and 1 hour, which are the same as those for solidifying the resin film 8 described in the first embodiment. The thermal processing is for solidifying the resin film 83 itself. Accordingly the thermal processing can be performed under the same conditions as those described above in solidifying the resin film 8. Thus, the resin layer (dielectric film) 84 of the resin film 83 is formed on the base substrate 58.

Figure 17:
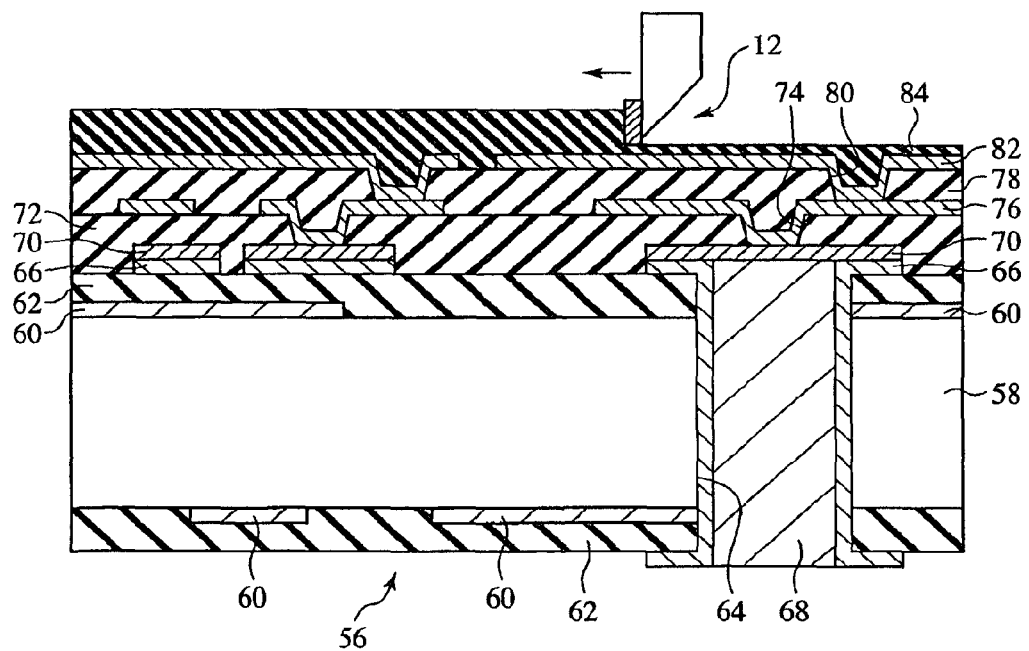
FIG. 17 is a view of the circuit board in the step of the circuit board fabrication method according to the second embodiment of the present invention, which illustrates the method (Part 4).

Then, as illustrated in FIG. 17, the surface of the resin layer 84 is cut with the cutting tool 12. Conditions for cutting the surface of the resin layer 84 are the same as those for cutting the surface part of, e.g., the resin layer 10 described above. That is, the rake angle of the cutting tool 12 is 0 degrees. The rotation number of the chuck table is, e.g., 1000 rpm. With such rotation number, the cut speed is about 5 m/second when the rotation radius is about 5 cm. The cut amount of the cutting tool 12 is, e.g., about 5 μm. The feed speed of the cutting tool 12 is, e.g., 50 μm/second. When the cut is performed under these conditions, the ten-point height of irregularities Rz of the surface of the resin layer 84a after the surface part is cut is, e.g., about 1-2 μm. Conditions for cutting the surface part of the resin layer 84 are suitably set, whereby the surface part of the resin layer 84a after cut can have required roughness. In cutting the surface part of the resin layer 84, the surface part of the resin layer 84 is cut until the thickness of the resin layer 84 present on the bottom electrodes 82 becomes, e.g., about 4 μm. Thus, as illustrated in FIG. 17, the dielectric film 84a of the resin layer of, e.g., a 4 μm-thickness is formed.

The ten-point height of irregularities Rz of the surface of the resin layer 84a is about 1-2 μm here but is not essentially about 1-2 μm. The surface of the resin layer 84a may be cut so that the ten-point height of irregularities Rz of the surface of the resin layer 84a is, e.g., 0.5-5 μm.

The surface of the resin layer 84 is cut here until the thickness of the resin layer 84 on the lower electrodes 82 becomes, e.g., 4 μm, but the thickness of the resin layer 84 as cut is not limited to 4 μm. However, in order to form the capacitors 92 of a sufficiently large capacitance (see FIG. 20A), it is necessary to decrease to some extent the thickness of the resin layer 84 on the lower electrodes 82. When the thickness of the resin layer 84 on the lower electrodes 82 is 5 μm or below, the capacitors 92 can have a relatively large capacitance. Accordingly, it is preferable to cut the surface of the resin layer 84 until the thickness of the resin layer 84 on the lower electrodes 82 becomes 5 μm or below.

The cutting here is conducted by advancing the cutting tool 12 straight in one direction while the base substrate 58 is being rotated. However, it is also possible to conduct the cutting by rotating a wheel (not illustrated) with the cutting tool 12 mounted while the base substrate 58 is being advanced straight in one direction.

Figure 18A:
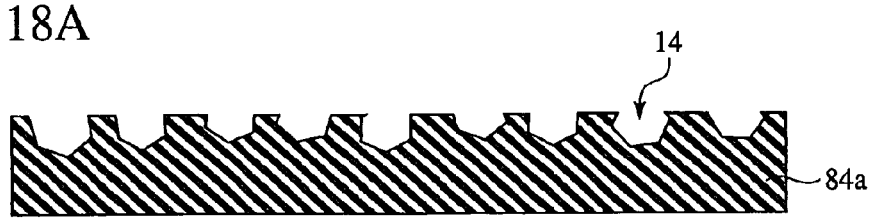
FIGS. 18A and 18B are views of the circuit board in the steps of the circuit board fabrication method according to the second embodiment of the present invention, which illustrate the method (Part 5).
Figure 18B:
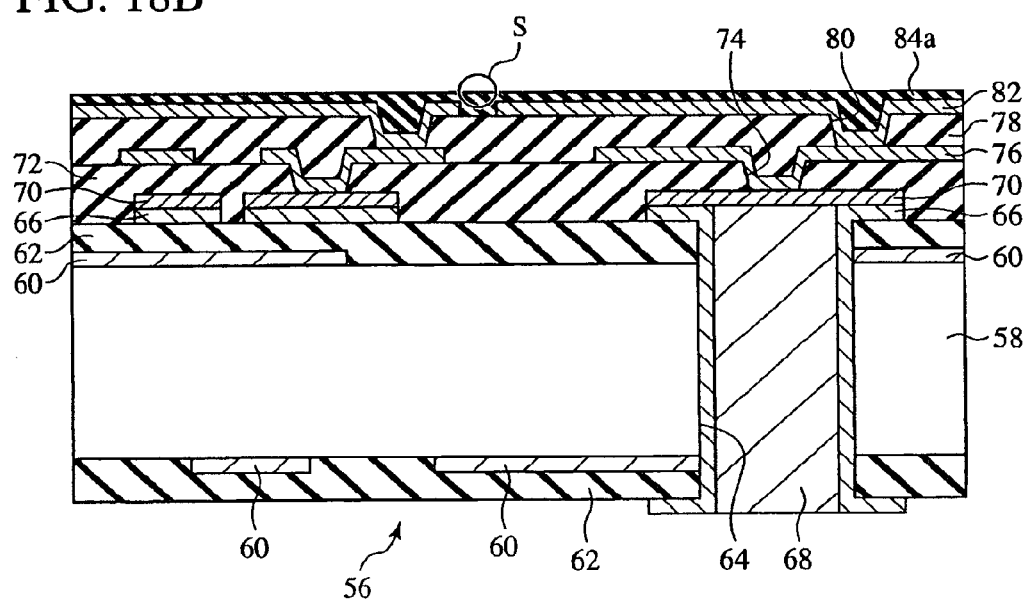

FIG. 18A is an enlarged view of the part in the circle S in FIG. 18B. As illustrated in FIG. 18A, concavities and convexities 14 are formed in the surface of the resin layer 84a.

Figure 19A:
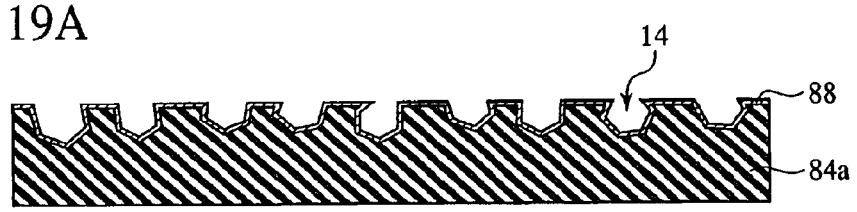
FIGS. 19A and 19B are views of the circuit board in the steps of the circuit board fabrication method according to the second embodiment of the present invention, which illustrate the method (Part 6).
Figure 19B:
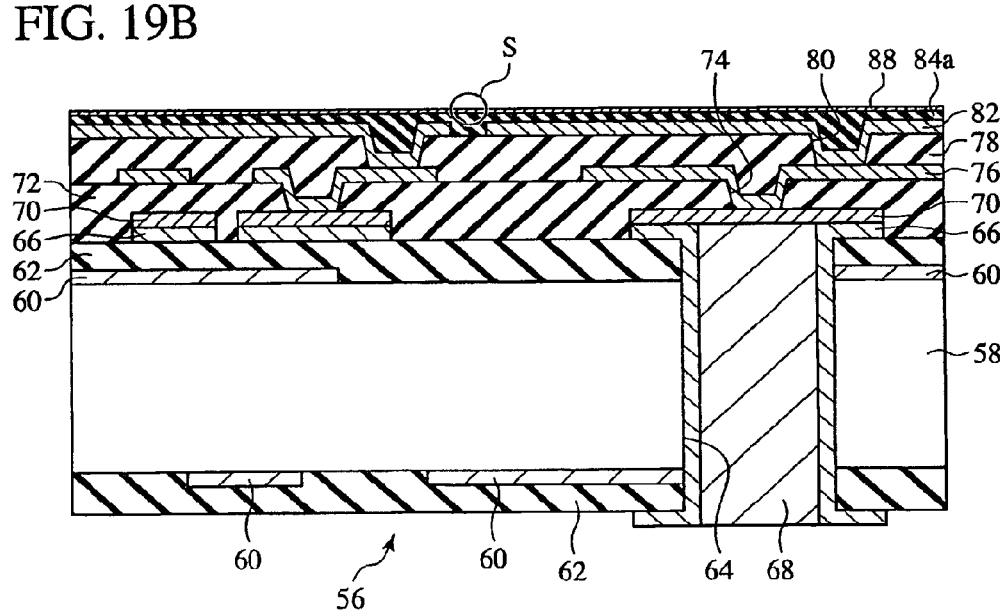

Then, as illustrated in FIGS. 19A and 19B, a seed layer 88 is formed of copper or nickel on the entire surface by electroless plating. The method for forming the seed layer 88 is the same as that for forming the seed layer 36 described in, e.g., the first embodiment. That is, after the conditioning, the adhesion of a catalyst to the surface of the resin layer, etc. are performed, the seed layer 88 is formed by electroless plating. FIG. 19A is an enlarged view of the part in the circle S in FIG. 19B.

Next, a photoresist film (not illustrated) is formed on the entire surface by spin coating.

Next, openings (not illustrated) are formed in the photoresist film down to the seed layer by photolithography. The openings are for forming upper electrodes 90.

Next, the upper electrode 90 of Cu are formed in the openings of the photoresist film by electroplating. Then, the photoresist film is released.

Then, the seed layer 88 exposed beyond the upper electrodes 90 is removed by wet etching. The etching liquid is, e.g., an about 1-10% ammonium persulfate aqueous solution. The etching period of time is, e.g., about 2 minutes. When the seed layer is etched off, the surfaces of the upper electrodes 90 are also etched a little. However, because of the thickness of the seed layer which is sufficiently smaller in comparison with the size of the upper electrodes 90, the seed layer can be etched in a short period of time. Accordingly, in etching the seed layer, the upper electrodes 90 are never excessively etched.

Figure 20A:
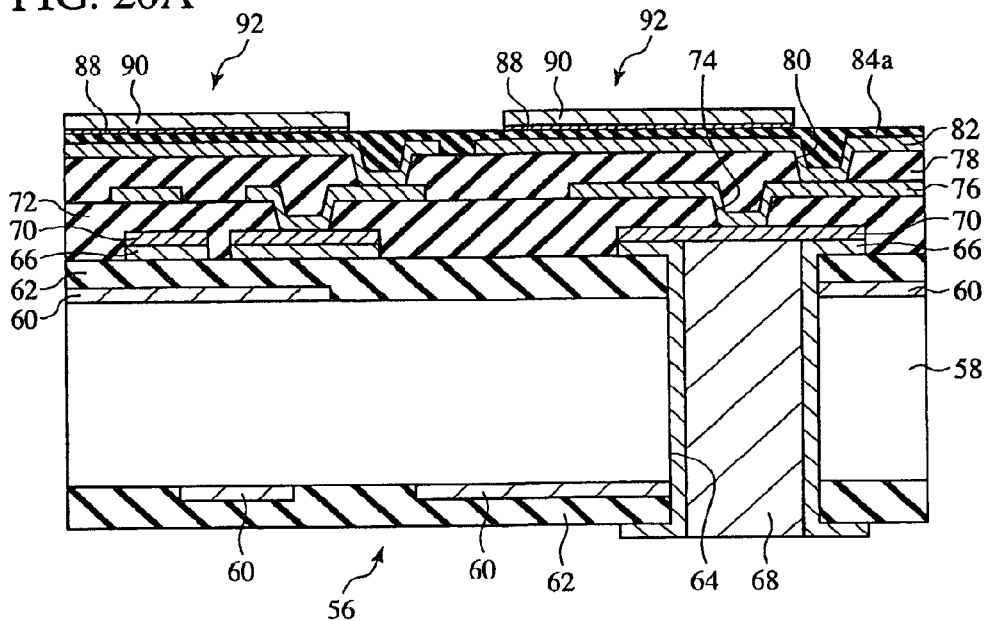
FIGS. 20A and 20B are views of the circuit board in the steps of the circuit board fabrication method according to the second embodiment of the present invention, which illustrate the method (Part 7).
Figure 20B:
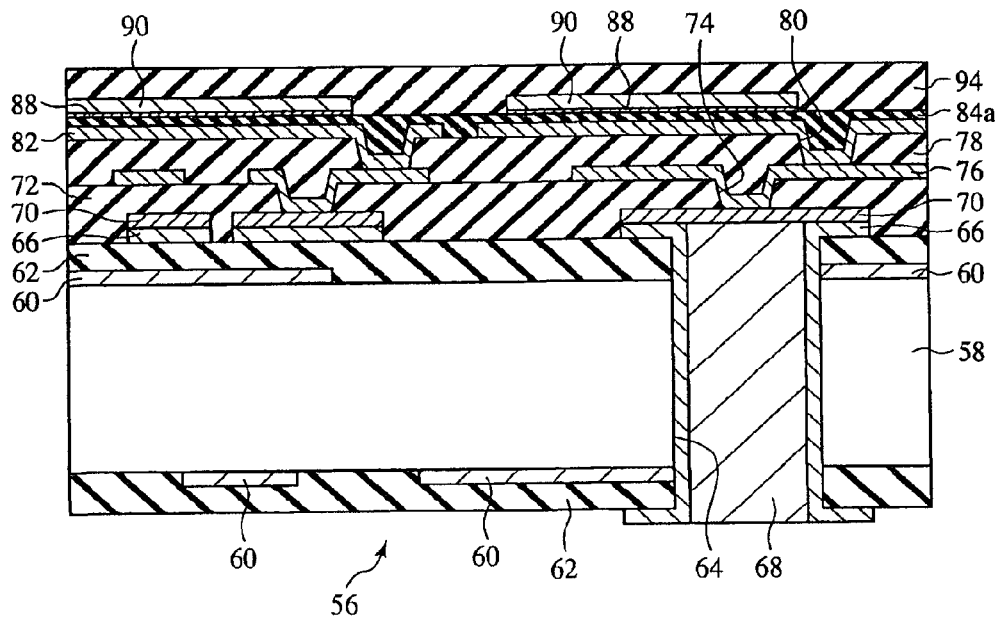

Thus, capacitors 92 each including the lower electrode 82, the dielectric film 84a and the upper electrode 90 are formed (see FIG. 20A).

Next, the resin film is applied to the substrate with a vacuum press apparatus. The resin film is for forming the resin layer 94 (see FIG. 20B). The resin film is ABF (Ajinomoto Build-up Film), which is a film for forming insulation films by AJINOMOTO CO., INC. The thickness of the resin film is 60 μm. Conditions for the vacuum pressing are, e.g., 100° C. and 1 MPa, which are the same as those for vacuum pressing the resin film 8 described in the first embodiment. Thus, the resin film is formed on the base substrate 58.

Next, the resin film is solidified by thermal processing. Conditions for the thermal processing are, e.g., 170° C. and 1 hour, which are the same as those for solidifying the resin film 8 described in the first embodiment. Thus, the resin layer 94 of the resin film is formed on the base substrate 58 (see FIG. 20B).

Then, the surface part of the resin layer 94 is cut with the cutting tool. Conditions for cutting the surface part of the resin layer 94 are the same as those for cutting the surface part of the resin layer 10 described above. That is, the rake angle of the cutting tool 12 is 0 degrees. The rotation number of the chuck table is, e.g., 1000 rpm. With such rotation number, the cut speed is about 5 m/second when the rotation radius is about 5 cm. The cut amount of the cutting tool 12 is, e.g., about 5 μm. The feed speed of the cutting tool 12 is, e.g., 50 μm/second. When the cut is performed under these conditions, the ten-point height of irregularities Rz of the surface of the resin layer 94 is, e.g., about 1-2 μm.

The ten-point height of irregularities Rz of the surface of the resin layer 94 is about 1-2 μm here but is not essentially about 1-2 μm. The surface of the resin layer 94 may be cut so that the ten-point height of irregularities Rz of the surface of the resin layer 94 is, e.g., 0.5-5 μm.

The cutting here is conducted by advancing the cutting tool 12 straight in one direction while the base substrate 58 is being rotated. However, it is also possible to conduct the cutting by rotating a wheel (not illustrated) with the cutting tool 12 mounted while the base substrate 58 is being advanced straight in one direction.

Then, contact holes 96 are formed in the resin layer 94 down to the upper electrodes 90 of the capacitors 92 by photolithography.

Then, a seed layer (not illustrated) of copper or nickel is formed on the entire surface by electroless plating. The technique for forming the seed layer is the same as that for forming the seed layer 36 described in, e.g., the first embodiment. That is, after the conditioning, the adhesion of a catalyst to the surface of the resin layer, etc. are formed, the seed layer is formed by electroless plating.

Next, a photoresist film (not illustrated) is formed on the entire surface by spin coating.

Next, opening (not illustrated) are formed down to the seed layer by photolithography. The openings are for forming interconnections 98.

Next, the interconnections 98 of Cu are formed in the openings by electroplating. Then, the photoresist film is released.

Next, a photoresist film (not illustrated) is formed on the entire surface by spin coating.

Next, openings (not illustrated) are formed in the photoresist film down to the interconnections 98 by photolithography. The openings are for forming the conductor plugs 100.

Then, conductor plugs 100 of Cu are formed in the openings of the photoresist film by electroplating. Then, the photoresist film is released.

Figure 21A:
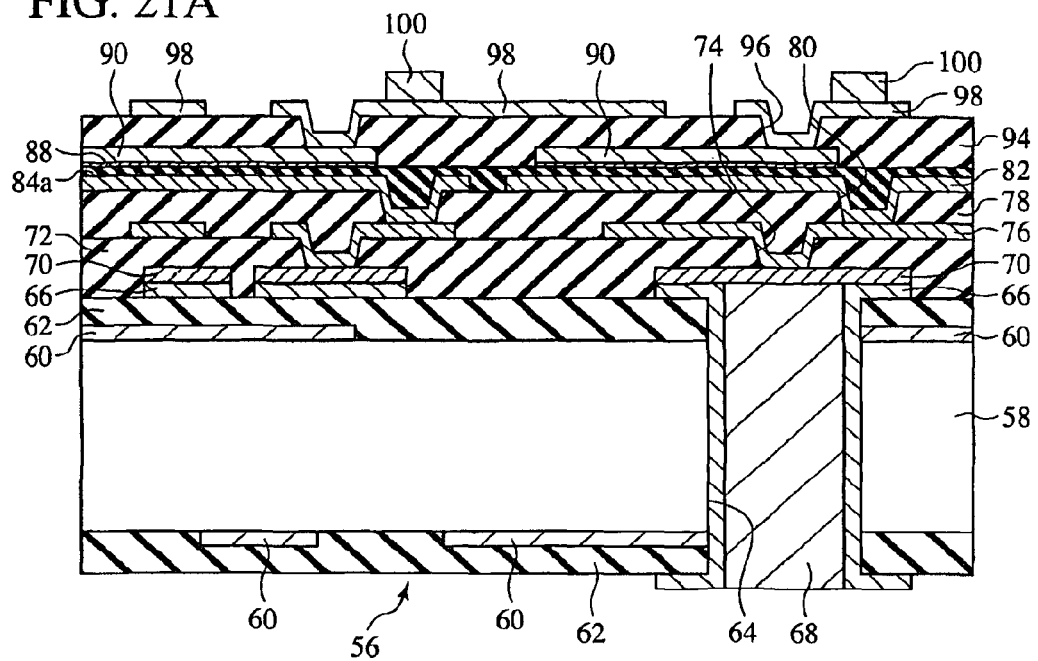
FIGS. 21A and 21B are views of the circuit board in the steps of the circuit board fabrication method according to the second embodiment of the present invention, which illustrate the method (Part 8).
Figure 21B:
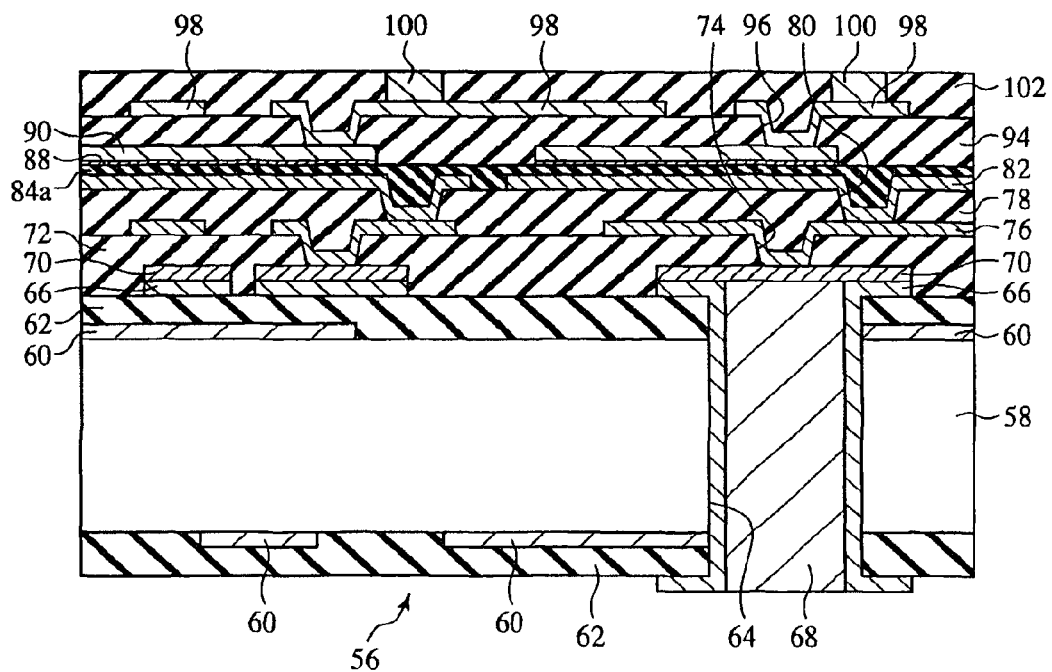

Next, the seed layer exposed around the conductor plugs 100 is etched off (see FIG. 21A). The etching liquid is, e.g., an about 1-10% ammonium persulfate aqueous solution. The etching period of time is, e.g., about 2 minutes. When the seed layer is etched off, the surfaces of the conductor plugs 100 are also etched a little. However, because of the thickness of the seed layer which is sufficiently smaller in comparison with the size of the conductor plugs 100, the seed layer can be etched in a short period of time, and the conductor plugs 100 are never excessively etched.

Next, the resin film is applied to the base substrate 58 with a vacuum press apparatus. The resin film is for forming the resin layer 102 (see FIG. 21B). The resin film is ABF (Ajinomoto Build-up Film), which is a film for forming insulation films by AJINOMOTO CO., INC. Conditions for the vacuum pressing are, e.g., 100° C. and 1 MPa, which are the same as those for vacuum pressing the resin film described in the first embodiment. Thus, the resin film is formed on the resin layer 94 with the interconnections 98 and the conductor plugs 100 formed on.

Next, the resin layer is solidified by thermal processing. Conditions for the thermal processing are the same as those for solidifying the resin film 8 described in the first embodiment, i.e., 170° C. and 1 hour. Thus, the resin layer 102 of the resin film is formed on the resin layer 94 with the interconnections 98 and the conductor plugs 100 formed on (see FIG. 21B).

Then, the surface of the resin layer 102 and the surfaces of the conductor plugs 100 are cut with the cutting tool. Conditions for cutting the surface of the resin layer 102 and the surfaces of the conductor plugs 100 are the same as conditions for cutting the surface part of the resin layer 10 described above. That is, the rake angle of the cutting tool 12 is 0 degrees. The rotation number of the chuck table is, e.g., 1000 rpm. With such rotation number, the cut speed is about 5 m/second when the rotation radius is about 5 cm. The cut amount of the cutting tool 12 is, e.g., about 5 μm. The feed speed of the cutting tool 12 is, e.g., 50 μm/second. The ten-point height of irregularities Rz of the surface of the resin layer 102 becomes, e.g., about 1-2 μm. The ten-point height of irregularities Rz of the surfaces of the conductor plugs 100 becomes, e.g., about 5-15 nm (see FIG. 21B).

The ten-point height of irregularities Rz of the surface of the resin layer 102 is about 1-2 μm here but is not essentially about 1-2 μm. The surface of the resin layer 102 may be cut so that the ten-point height of irregularities Rz of the surface of the resin layer 102 is, e.g., 0.5-5 μm.

The cutting here is conducted by advancing the cutting tool 12 straight in one direction while the base substrate 58 is being rotated. However, it is also possible to conduct the cutting by rotating a wheel (not illustrated) with the cutting tool 12 mounted while the base substrate 58 is being advanced straight in one direction.

Then, a seed layer (not illustrated) is formed of copper or nickel on the entire surface by electroless plating. The method for forming the seed layer is the same as that for forming the seed layer 36 in, e.g., the first embodiment. That is, after the conditioning, the adhesion of a catalyst to the surface of the resin layer, etc. are performed, the seed layer is formed by electroless plating.

Next, a photoresist film (not illustrated) is formed on the entire surface by spin coating.

Next, openings (not illustrated) are formed down to the seed layer by photolithography. The openings are for forming interconnections 104.

Then, the interconnections 104 of Cu are formed in the openings by electroplating. Then, the photoresist film is released.

Next, a photoresist film (not illustrated) is formed on the entire surface by spin coating.

Then, openings (not illustrated) are formed in the photoresist film down to the interconnections 104 by photolithography. The openings are for forming conductor plugs 106.

Next, the conductor plugs 106 of Cu (copper) are formed in the openings of the photoresist film by electroplating. Then, the photoresist film is released.

Figure 22A:
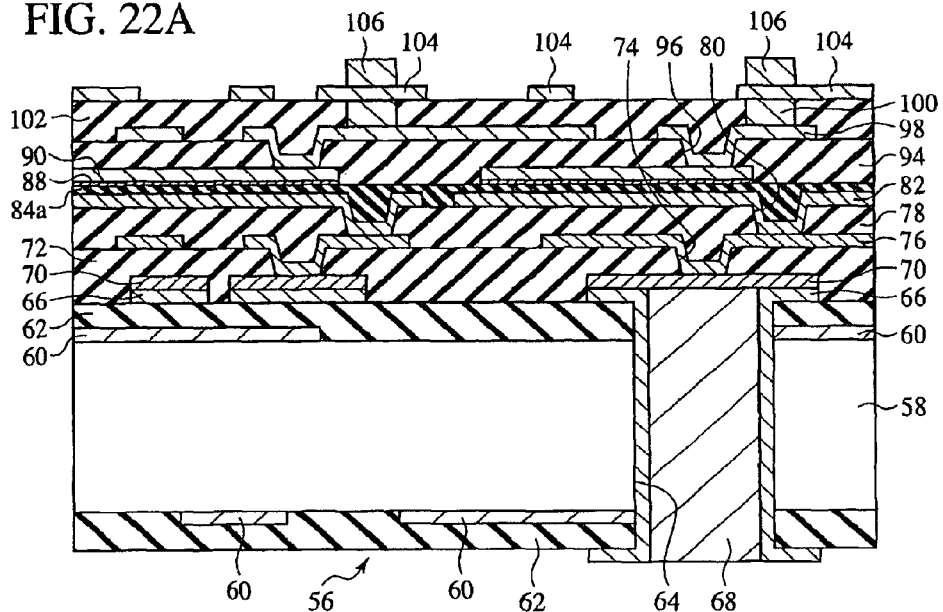
FIGS. 22A and 22B are views of the circuit board in the steps of the circuit board fabrication method according to the second embodiment of the present invention, which illustrate the method (Part 9).
Figure 22B:
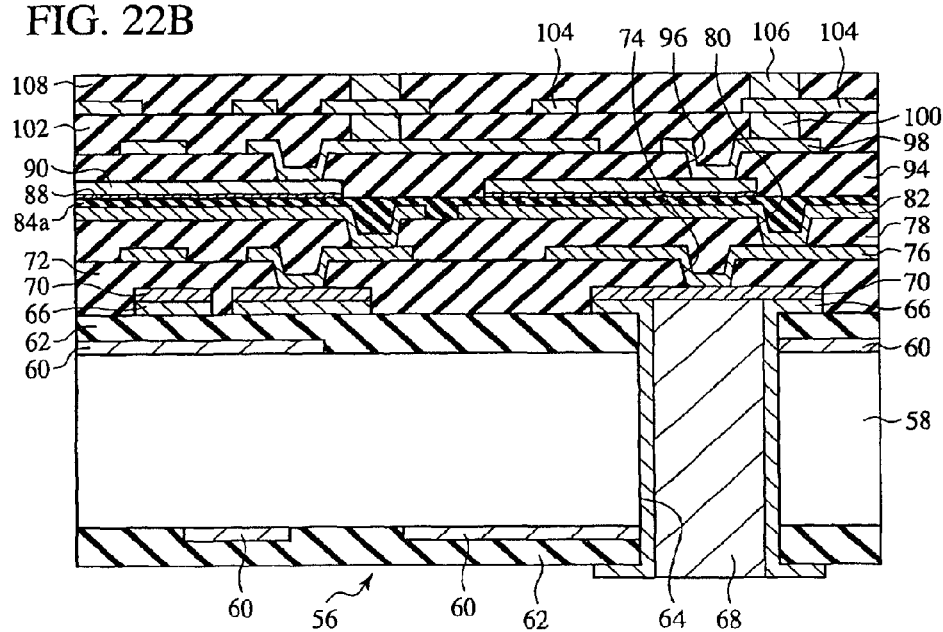

The exposed parts of the seed layer are etched off (see FIG. 22A). The etching liquid is, e.g., an about 1-10% ammonium persulfate aqueous solution. The etching period of time is, e.g., about 2 minutes. When the seed layer is etched off, the surfaces of the conductor plugs 106 are also etched a little. However, because of the thickness of the seed layer which is sufficiently smaller in comparison with the size of the conductor plugs 106, the seed layer can be etched in a short period of time, and the conductor plugs 106 are never excessively etched.

Next, the resin film is applied to the base substrate 58 with a vacuum press apparatus. The resin film is for forming the resin layer 108 (see FIG. 22B). The resin film is ABF (Ajinomoto Build-up Film), which is a film for forming insulation layer by AJINOMOTO CO., INC. Conditions for the vacuum pressing are, e.g., 100° C. and 1 MPa, which are the same as those for vacuum pressing the resin film 8 in the first embodiment. Thus, the resin film is formed on the resin layer 102 with the interconnections 104 and the conductor plugs 106 formed on.

Next, the resin film is solidified by thermal processing. Conditions for the thermal processing are the same as those for solidifying the resin film 8 in the first embodiment, i.e., 170° C. and 1 hour. Thus, the resin layer 108 of the resin film is formed on the resin layer 102 with the interconnections 104 and the conductor plugs 106 formed on (see FIG. 22B).

Then, the surface part of the resin layer 108 and upper portion of the conductor plugs 106 are cut with the cutting tool. Conditions for cutting the surface part of the resin layer 108 and the upper portions of the conductor plugs 106 are the same as conditions for cutting the surface part of the resin layer 10 described above. That is, the rake angle of the cutting tool 12 is 0 degrees. The rotation number of the chuck table is, e.g., 1000 rpm. With such rotation number, the cut speed is about 5 m/second when the rotation radius is about 5 cm. The cut amount of the cutting tool 12 is, e.g., about 5 μm. The feed speed of the cutting tool 12 is, e.g., 50 μm/second. When cut under these conditions, the ten-point height of irregularities Rz of the surface of the resin layer 108 becomes, e.g., about 1-2 μm.

The ten-point height of irregularities Rz of the surface of the resin layer 108 is about 1-2 μm here but is not essentially about 1-2 μm. The surface of the resin layer 108 may be cut so that the ten-point height of irregularities Rz of the surface of the resin layer 108 is, e.g., 0.5-5 μm.

The cutting here is conducted by advancing the cutting tool 12 straight in one direction while the base substrate 58 is being rotated. However, it is also possible to conduct the cutting by rotating a wheel (not illustrated) with the cutting tool 12 mounted while the base substrate 58 is being advanced straight in one direction.

Then, a seed layer (not illustrated) is formed of copper or nickel on the entire surface by electroless plating. The method for forming the seed layer is the same as that for forming the seed layer 36 described in, e.g., the first embodiment. That is, after the conditioning, the adhesion of a catalyst to the surface of the resin layer, etc. are performed, the seed layer is formed by electroless plating.

Next, a photoresist film (not illustrated) is formed on the entire surface by spin coating.

Then, openings (not illustrated) are formed down to the seed layer by photolithography. The openings are for forming interconnections 110.

Next, the interconnections 110 are formed of Cu in the openings by electroplating. Then, the photoresist film is released.

Next, the seed layer exposed around the interconnections 110 is removed by wet etching. The etching liquid is, e.g., about 1-10% ammonium perfulfate aqueous solution. The etching period of time is, e.g., about 2 minutes. When the seed layer is etched off, the surfaces of the interconnections 110 are also etched a little, However, because of the thickness of the seed layer which is sufficiently smaller than the size of the interconnections 110, the seed layer can be etched in a short period of time. Accordingly, in etching the seed layer, the interconnections 110 are never excessively etched.

Figure 23:
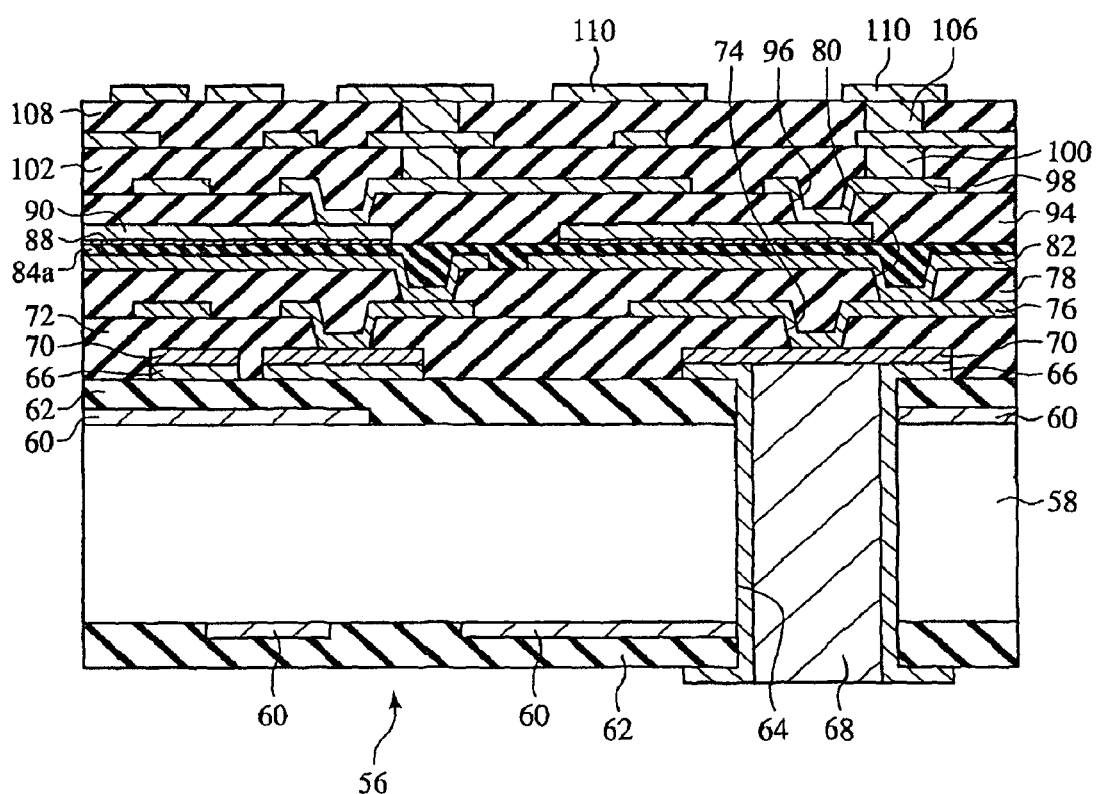
FIG. 23 is a view of the circuit board in the step of the circuit board fabrication method according to the second embodiment of the present invention, which illustrates the method (Part 10).

Thus, the circuit board is fabricated by the circuit board fabrication method according to the present embodiment. This state is illustrated in FIG. 23.

The circuit board according to the present embodiment is characterized mainly in that, as described above, the dielectric film 84 of the capacitors is formed of a resin sheet, and the surface part of the dielectric film 84 of the resin sheet is cut with a cutting tool.

In the conventional circuit board fabrication method, the resin layer must be subjected to the desmearing treatment. For the purpose of preventing the insulation between the upper electrodes and the lower electrodes from being impaired by ten-odd μm-pores formed in the desmearing treatment, the thickness of the resin layer must be set at 30 μm or above. Because the capacitance of a capacitor is in inverse proportion with the thickness of the dielectric film, it is difficult to fabricate a circuit board having a large capacitance.

In contrast to this, in the present embodiment, the dielectric film 84 is formed of a resin sheet, and the surface part of the dielectric film 84 of the resin sheet is cut with a cutting tool 12. According to the present embodiment, in which the surface of the dielectric film 84a after cut has suitable roughness, whereby the adhesion between the dielectric film 84a and the upper electrodes 90 can be ensured. In the present embodiment, which does not require the desmearing treatment, no excessively deep pores are formed in the surface of the dielectric film 84a. Accordingly, even when the film thickness of the dielectric film 84a is sufficiently small, the insulation between the upper electrodes 82 and the lower electrodes 90 can be sufficiently ensured. Thus, the present embodiment can fabricate the circuit board having high reliability and a capacitor of large capacitance.

A Third Embodiment

The circuit board fabrication method according to a third embodiment of the present invention will be explained with reference to FIGS. 24A to 25B. FIGS. 24A to 25B are sectional views of a circuit board in the steps of the circuit board fabrication method according to a third embodiment of the present invention. The same members of the present embodiments as those of the plating method and the semiconductor device fabrication method or the circuit board fabrication method according to the first or the second embodiment illustrated in FIGS. 1A to 23 are represented by the same reference numbers not to repeat or to simplify their explanation.

The circuit board fabrication method according to the present embodiment is characterized mainly in that a resistor layer forming resistor is formed of a resin film, and the surface part of the resistor layer is cut with a cutting tool.

First, the steps up to the step of forming electrodes including the electrode forming steps are the same as those of the circuit board fabrication method according to the second embodiment described above with reference to FIGS. 14A to 16A, and their explanation will not be repeated.

Next, a resin film 112 is prepared. The resin film 112 is a resin film formed of a matrix of epoxy resin mixed with a filler of a conductor. The filler of a conductor is, e.g., the powder of nickel-chrome alloy.

The filler of a conductor is the powder of nickel-chrome alloy but is not essentially the powder of nickel-chrome alloy. A material whose magnetic permeability is higher than the resin of the matrix can be suitably used as the material of the filler. For example, the filler of a conductor may be the powder of carbon, the powder of silicon carbonate or others. The filler of a conductor may be a mixture of them.

Then, the resin films 111 are placed on a base substrate 58. At this time, the resin film 111 to be a resistor layer is spaced from the adjacent resin film 111 so as to prevent the electric short circuit between the resin films 111 to be resistor layers (see FIG. 24A).

Next, the resin film 111 is applied to the base substrate 58 by a vacuum press apparatus. The resin film 111 is for forming the resin layer 112 (see FIG. 24B). Conditions for the vacuum pressing are, e.g., 100° C. and 1 MPa, which are the same as those for vacuum pressing the resin film 8 described in the first embodiment. Thus, the resin film 111 is formed on the base substrate 58.

Next, thermal processing is performed to solidify the resin layer 111. Conditions for the thermal processing are the same as those for solidifying the resin film 8 described in the first embodiment, i.e., 170° C. and 1 hour. This thermal processing is for solidifying the resin layer 112 itself. Thus, the thermal processing may be performed under the conditions described above for solidifying the resin film 8. Thus, the resin layer 112 of the resin film 111 is formed on the base substrate 58 (see FIG. 24B).

Figure 24A:
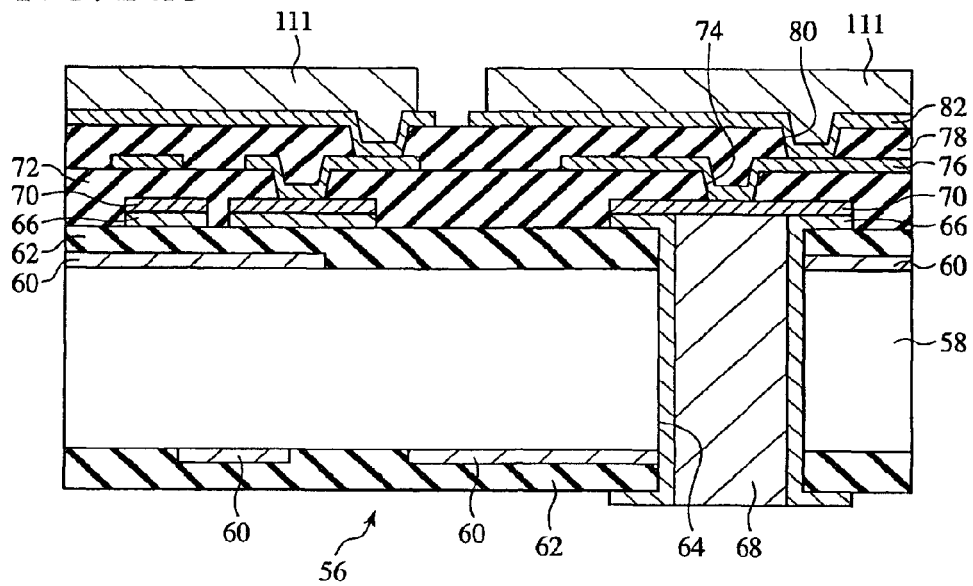
FIGS. 24A and 24B are views of a circuit board in the steps of the circuit board fabrication method according to a third embodiment of the present invention, which illustrate the method (Part 1).
Figure 24B:
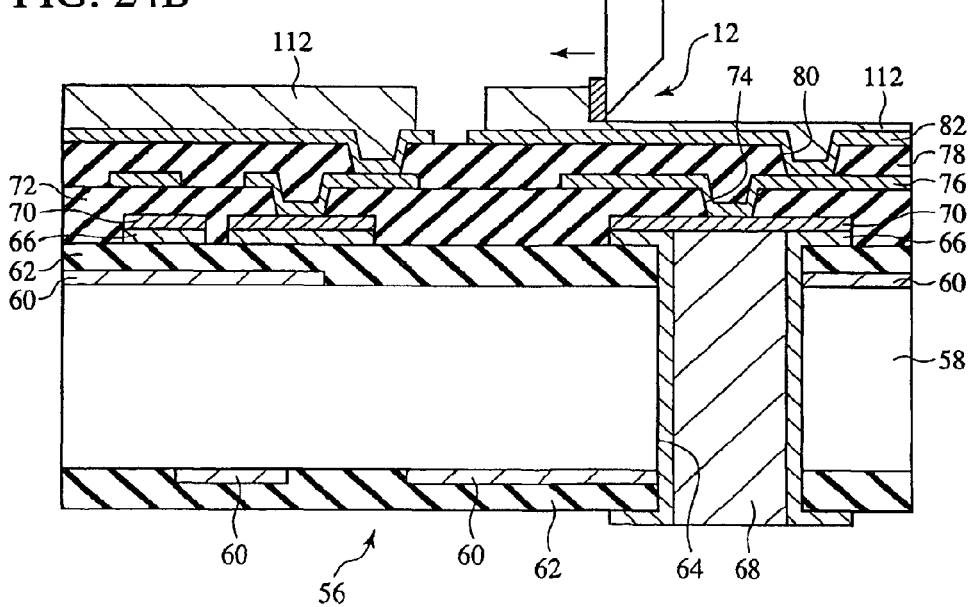
Figure 25A:
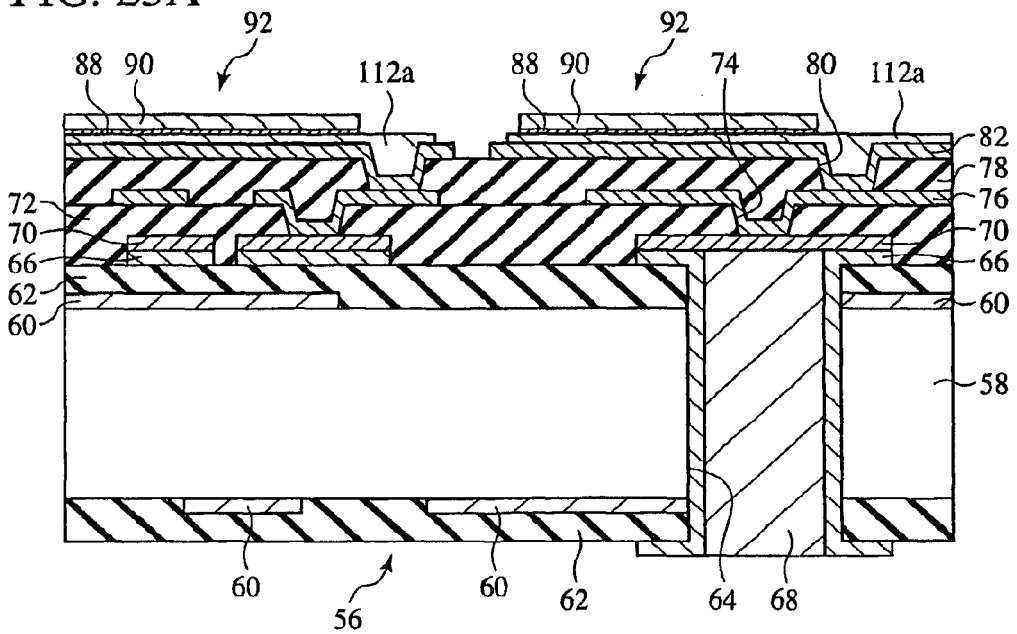
FIGS. 25A and 25B are views of a circuit board in the steps of the circuit board fabrication method according to a third embodiment of the present invention, which illustrate the method (Part 2).
Figure 25B:
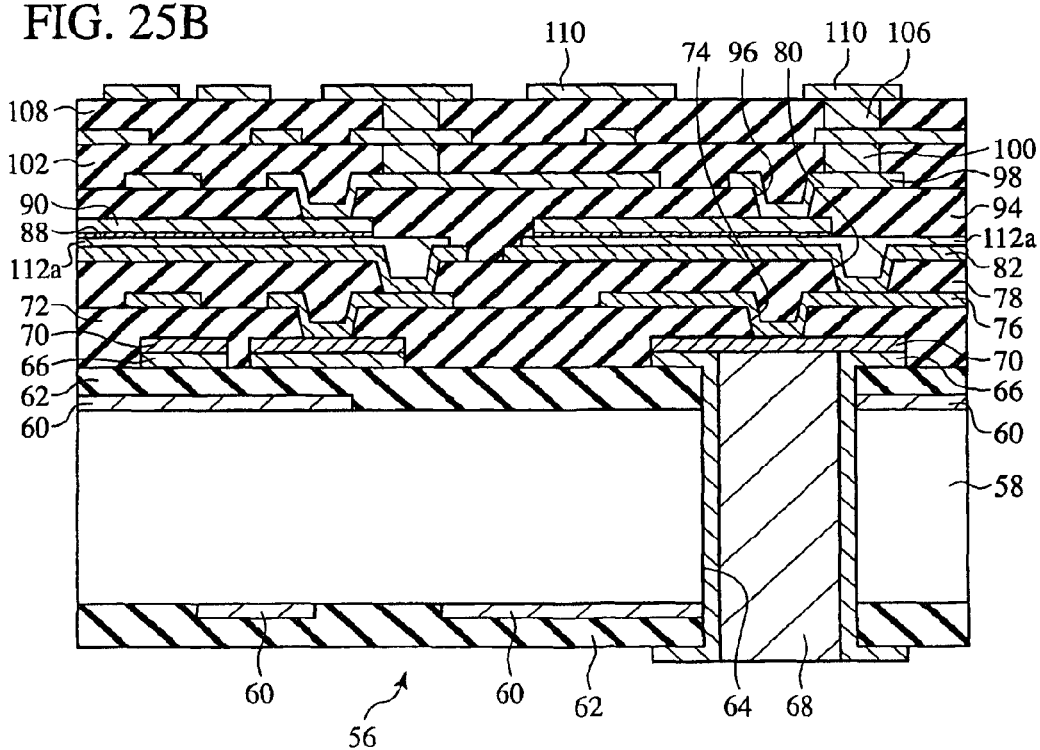

Then, as illustrated in FIG. 24B, the surface of the resin layer 112 is cut with the cutting tool 12. Conditions for cutting the surface part of the resin layer 112 are the same as those for cutting the surface part of the resin layer 10. That is, the rake angle of the cutting tool 12 is 0 degrees. The rotation number of the chuck table is, e.g., about 1000 rpm. With the rotation number thus set, the cutting speed is about 5 m/second when the rotation radius is about 5 cm. The feed speed of the cutting tool 12 is, e.g., 50 μm/second. When the cut is performed under these conditions, the ten-point height of irregularities Rz of the surface of the resin layer 112a after cut is, e.g., about 1-2 μm. The conditions for cutting the surface of the resin layer 112 are suitably set, whereby the surface of the resin layer 112a after cut can be set at required roughness. In cutting the surface of the resin layer 112, the surface of the resin layer 112 is cut until the thickness of the resin layer 112 present on the electrodes 82 becomes, e.g., 10 μm. Thus, the resistor layer 112a formed of the resin layer of, e.g., a 10 μm-thickness is formed.

The ten-point height of irregularities Rz of the surface of the resin layer 112a is about 1-2 μm here but is not essentially limited to about 1-2 μm. The surface of the resin layer 112a may be cut so that the ten-point height of irregularities Rz of the surface of the resin layer 112a becomes, e.g., 0.5-5 μm.

The cutting here is conducted by advancing the cutting tool 12 straight in one direction while the base substrate 58 is being rotated. However, it is also possible to conduct the cutting by rotating a wheel (not illustrated) with the cutting tool 12 mounted while the base substrate 58 is being advanced straight in one direction (not illustrated).

Next, a seed layer (not illustrated) is formed on the resistor layer 112a by electroless plating. The method for forming the seed layer is the same as for forming the seed layer 36 described in, e.g., the first embodiment. That is, after the conditioning, the adhesion of a catalyst to the surface of the resin layer, the seed layer is formed by electroless plating.

Next, a photoresist film (not illustrated) is formed on the entire surface by spin coating.

Then, openings (not illustrated) are formed in the photoresist film down to the seed layer by photolithography. The openings are for forming electrodes 90.

Next, the electrodes 90 are formed of Cu in the openings of the photoresist film by electroplating. Then, the photoresist film is released.

Then, the seed layer exposed around the electrodes 90 is removed by wet etching. The etching liquid is, e.g., about 1-10% ammonium persulfate aqueous solution. The etching period of time is about 2 minutes. When the seed layer 138 is etched off, the surfaces of the electrodes 90 are also etched a little. However, because of the thickness of the seed layer which is sufficiently smaller in comparison with the size of the electrodes 90, the seed layer can be etched in a short period of time. Accordingly, in etching the seed layer, the electrodes 90 are never excessively etched.

Thus, resistors 112a of the resin are formed between the electrodes 82 and the electrodes 90.

The following steps of the circuit board fabrication method are the same as those of the circuit board fabrication method according to the second embodiment illustrated in FIGS. 20B to 23 will not be explained.

The circuit board of the present embodiment is characterized mainly in that the resistor layer 112 forming the resistors is formed of the resin film, and the surface part of the resistor layer 112 is cut.

In the present embodiment, the surface part of the resistor layer 112 of a resin is cut, so that the surface of the resistor layer 112a after cut has suitable roughness. Accordingly, the resistor layer 112a and the electrodes 90 can have sufficient adhesion. In the present embodiment, which does not require the desmearing treatment, excessively deep pores are not formed in the resistor layer 112a of a resin. Thus, even when the thickness of the resistor layer 112a is small, the insulation between the electrode 82 and the electrodes 90 can be sufficiently ensured. The thickness of the resistor layer 112a is suitably set, whereby the resistance value can be set at a required value. Excessively deep pores are not formed in the surface of the resistor layer 112a, which makes the dispersion of the resistance value small. Thus, in the present embodiment, it is possible to fabricate circuit boards including resistors of high reliability.

A Fourth Embodiment

The circuit board fabrication method according to a fourth embodiment will be explained with reference to FIGS. 26A to 28. FIGS. 26A to 28 are sectional views of a circuit board in the steps of the circuit board fabrication method according to the present embodiment, which illustrate the method. The same members of the present embodiment as those of the plating method, the semiconductor device fabrication method and the circuit board fabrication method according to the first to the third embodiments illustrated in FIGS. 1A to 25B are represented by the same reference numbers not to repeat or to simplify their explanation.

The circuit board fabrication method according to the present embodiment is characterized mainly in that a high magnetic permeability layer 114 is formed of a resin film, and then the surface part of the high magnetic permeability layer 114 is cut, and next, an inductor 116 is formed on the high magnetic permeability layer 114a.

The steps up to the step of forming electrodes 82 including the electrodes forming step are the same as those of the circuit board fabrication method according to the second embodiment described above with reference to FIGS. 14A to 16A, and their explanation will be omitted.

Next, a resin film 113 is prepared. The resin film 113 is for forming a resin layer 114. The resin film 113 is a resin film formed of a matrix of epoxy resin containing a filler of a magnetic permeability higher than that of the resin. The high-magnetic permeability filler is, e.g., Mn—Zn-based ferrite.

The high-magnetic permeability filler is the powder of Mn—Zn-based ferrite here but is not limited to the powder of Mn—Zn-based ferrite. A material of high magnetic permeability higher than that of the resin of the matrix can be suitably used as a material of the filler. For example, the powder of Ni—Zn-based ferrite may be used as the material of the filler. A mixture of them may be used as the filler.

The magnetic permeability of epoxy resin forming the matrix is about 1. The magnetic permeability of Mn—Zn-based ferrite is about 10. The magnetic permeability of Ni—Zn-based ferrite is about 20. A filler of such high magnetic permeability is contained in the resin, whereby the resin film 113 can have high magnetic permeability.

Next, the resin film 113 is placed on a base substrate 58.

Next, the resin film 113 is applied to the base substrate 58 with a vacuum press apparatus. Conditions for the vacuum pressing are the same as those for vacuum pressing the resin film 8 in the first embodiment, e.g., 100° C. and 1 MPa. Thus, the resin film 113 is formed on the base substrate 58 (see FIG. 26A).

Next, thermal processing is performed to solidify the resin layer 113. Conditions for the thermal processing are the same as those for solidifying the resin film 8 in the first embodiment, e.g., 170° C. and 1 hour. This thermal processing is for solidifying the resin film 113 itself. Accordingly, the thermal processing may be performed under the same conditions as those for solidifying the resin film 8. Thus, the resin layer 114 of the resin film 113 is formed on the base substrate 58 (see FIG. 26B).

Figure 26A:
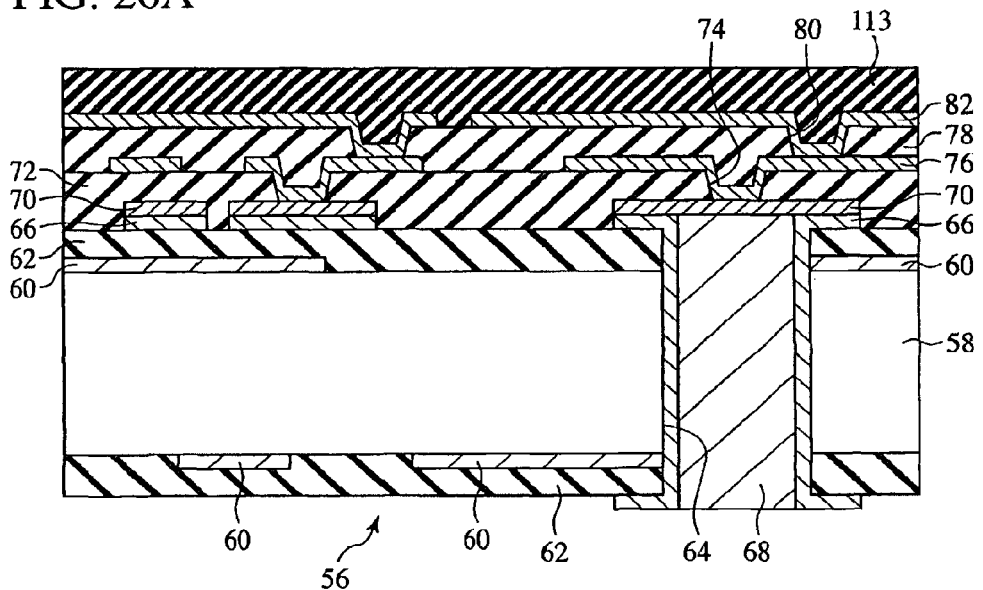
FIGS. 26A and 26B are views of a circuit board in the steps of the circuit board fabrication method according to a fourth embodiment of the present invention, which illustrate the method (Part 1).
Figure 26B:
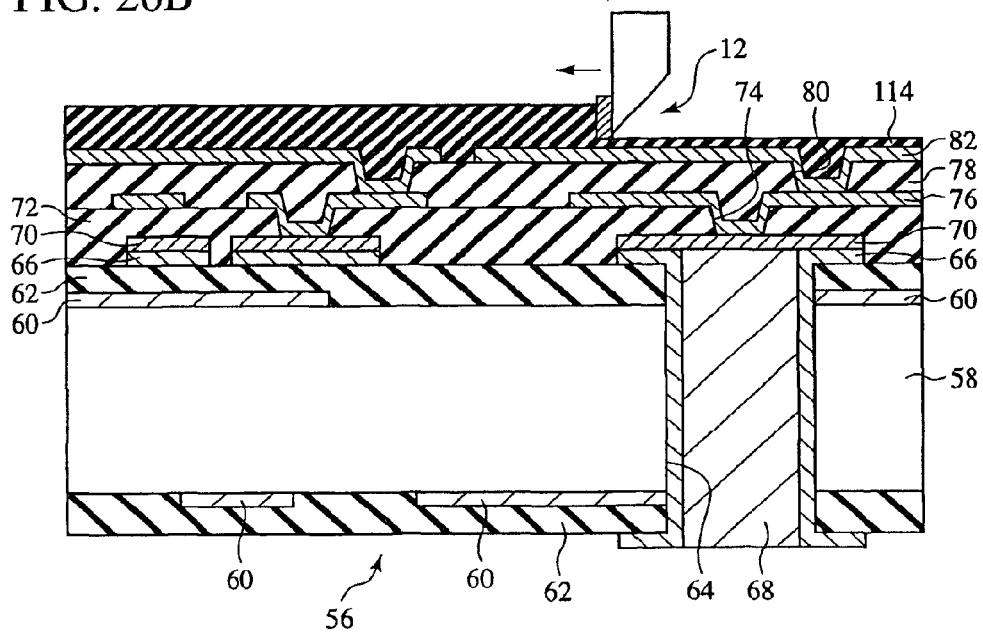

Then, as illustrated in FIG. 26B, the surface of the resin layer 114 is cut with the cutting tool 12. Conditions for cutting the surface part of the resin layer 114 are the same as those for cutting the surface part of the resin layer 10. That is, the rake angle of the cutting tool 12 is 0 degrees. The rotation number of the chuck table is, e.g., about 1000 rpm. With the rotation number thus set, the cutting speed is about 5 m/second when the rotation radius is about 5 cm. The feed speed of the cutting tool 12 is, e.g., 50 μm/second. When the cut is performed under these conditions, the ten-point height of irregularities Rz of the surface of the resin layer 114a after cut is, e.g., about 1-2 μm. The conditions for cutting the surface part of the resin layer 114a are suitably set, whereby the surface of the resin layer 114a after cut can be set at required roughness. Thus, the high-magnetic permeability layer 114a of the resin of, e.g., a 10 μm is formed.

The ten-point height of irregularities Rz of the surface of the resin layer 114a is about 1-2 μm here but is not essentially limited to about 1-2 μm. The surface of the resin layer 114a may be cut so that the ten-point height of irregularities Rz of the surface of the resin layer 114a becomes, e.g., 0.5-5 μm.

The cutting here is conducted by advancing the cutting tool 12 straight in one direction while the base substrate 58 is being rotated. However, it is also possible to conduct the cutting by rotating a wheel (not illustrated) with the cutting tool 12 mounted while the base substrate 58 is being advanced straight in one direction.

Next, a seed layer (not illustrated) of copper or nickel is formed on the entire surface by electroless plating. The method for forming the seed layer is the same as for forming the seed layer 36 in, e.g., the first embodiment. That is, after the conditioning, the adhesion of a catalyst to the surface of the resin layer, the seed layer is formed by electroless plating.

Next, a photoresist film (not illustrated) is formed on the entire surface by spin coating.

Then, the photoresist film is patterned by photolithography to form openings (not illustrated) for forming the inductor 116 and an interconnection 118.

Then, Cu is applied in the openings of the photoresist film by electroplating to form the inductor 116 and the interconnection 118.

Then, the photoresist film is released, and the exposed parts of the seed layer is etched off. The etching liquid is, e.g., a 1-10% ammonium persulfate aqueous solution. The etching period of time is, e.g., about 2 minutes. When the seed layer is etched off, the surfaces of the inductors 116 and interconnections 188 are also etched a little. However, because of the thickness of the seed layer which is sufficiently smaller in comparison with the sizes of the inductors 116 and the interconnections 118, the seed layer can be etched in a short period of time. Accordingly, in etching the seed layer, the inductors 116 and the interconnections 118 are never excessively etched.

Figure 27A:
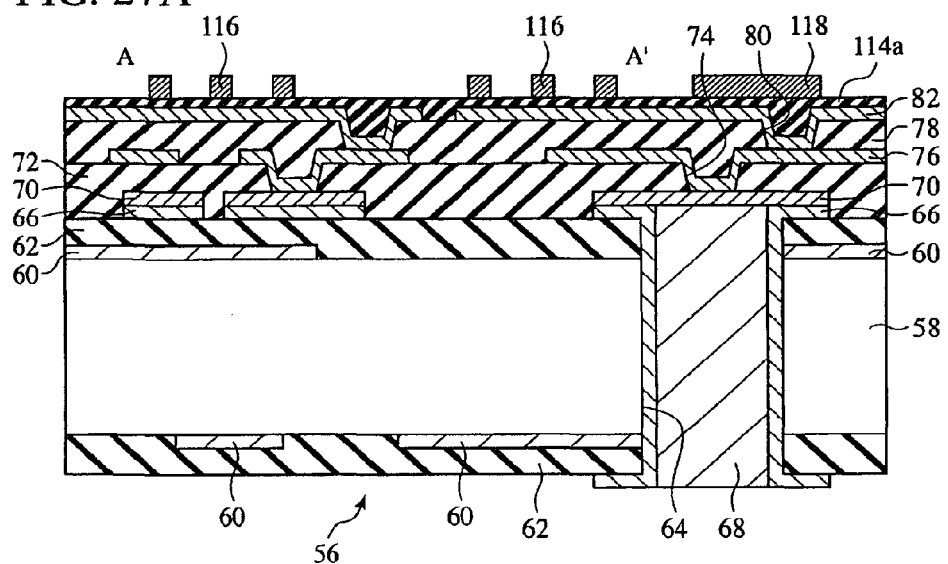
FIGS. 27A and 27B are views of the circuit board in the steps of the circuit board fabrication method according to the fourth embodiment of the present invention, which illustrate the method (Part 2).
Figure 27B:
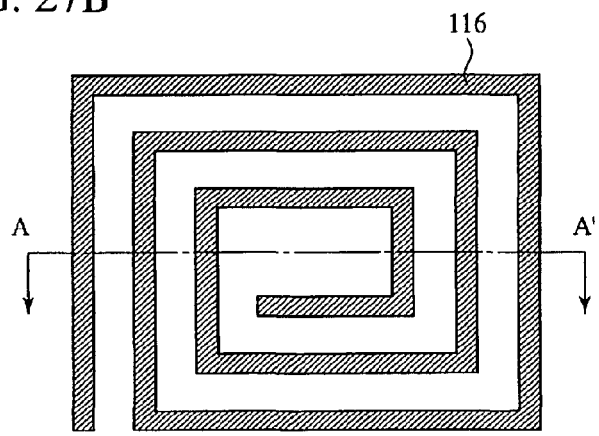

Thus, as illustrated in FIGS. 27A and 27B, the inductor 116 in the shape of a plane coil and the interconnection 118 are formed on the high-magnetic permeability layer 114a of the resin. In place of the above-described selective plating, the inductor 116 and the interconnection 118 can be formed by forming a Cu layer on the entire seed layer first electroplating and then selectively etching the Cu layer.

FIG. 27B illustrates a plan shape of the inductor on the circuit board of the present embodiment, and FIG. 27A is the sectional view along the line A-A' in FIG. 27B.

Figure 28:
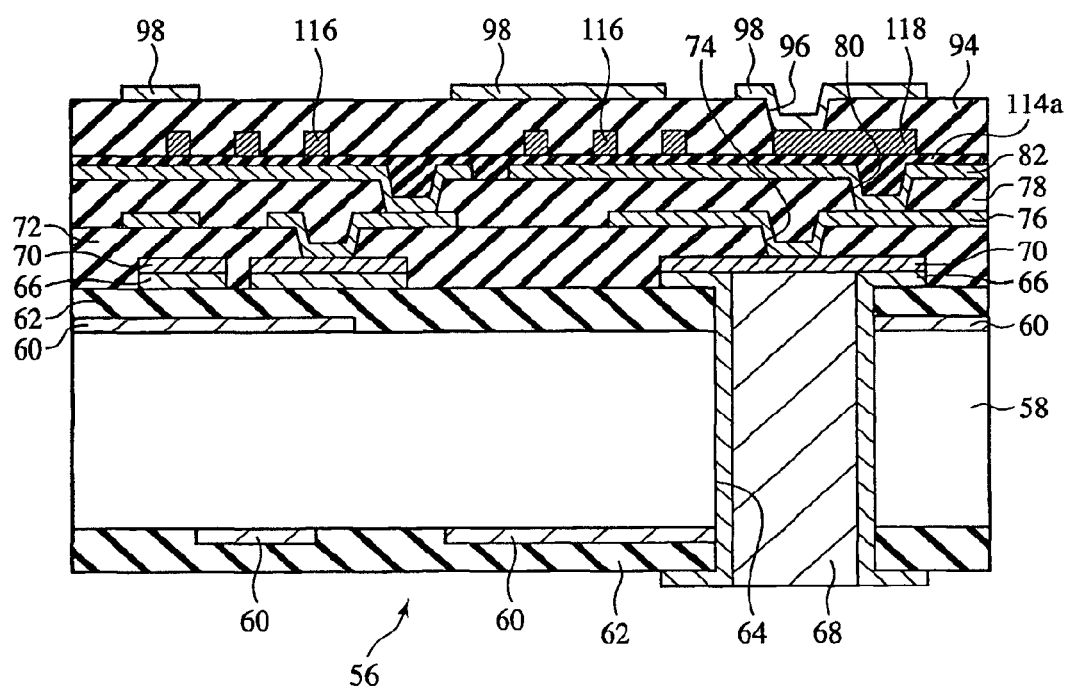
FIG. 28 is views of the circuit board in the steps of the circuit board fabrication method according to the fourth embodiment of the present invention, which illustrate the method (Part 3).

Next, as illustrated in FIG. 28, the resin film 94 is applied to the substrate with a vacuum press apparatus. The resin film 94 is ABF (Ajinomoto Build-up Film), which is a film for forming insulation films by AJINOMOTO CO., INC. The thickness of the resin film 94 is 60 μm. Conditions for the vacuum pressing are, e.g., 100° C. and 1 MPa, which are the same as those for vacuum pressing the resin film 10 in the first embodiment. Thus, the resin layer 94 is formed of the resin film on the base substrate 58.

Thermal processing is performed to solidify the resin layer 94. Conditions for the thermal processing are the same as those for solidifying the resin layer 10 described in the first embodiment, e.g., 170° C. and 1 hour.

Then, the surface of the resin layer 94 is cut with the cutting tool 12. Conditions for cutting the surface part of the resin layer 94 are the same as those for cutting the surface part of the resin layer 10. That is, the rake angle of the cutting tool 12 is 0 degrees. The rotation number of the chuck table is, e.g., about 1000 rpm. With the rotation number thus set, the cutting speed is about 5 m/second when the rotation radius is about 5 cm. The feed speed of the cutting tool 12 is, e.g., 50 μm/second. When the cut is performed under these conditions, the ten-point height of irregularities Rz of the surface of the resin layer 94 after cut is, e.g., about 1-2 μm.

The ten-point height of irregularities Rz of the surface of the resin layer 94 is about 1-2 μm here but is not essentially limited to about 1-2 μm. The surface of the resin layer 94 may be cut so that the ten-point height of irregularities Rz of the surface of the resin layer 94 becomes, e.g., 0.5-5 μm.

The cutting here is conducted by advancing the cutting tool 12 straight in one direction while the base substrate 58 is being rotated. However, it is also possible to conduct the cutting by rotating a wheel (not illustrated) with the cutting tool 12 mounted while the base substrate 58 is being advanced straight in one direction.

A contact hole 96 is formed in the resin layer 94 down to the interconnection 118 by photolithography.

Next, a seed layer (not illustrated) of copper or nickel is formed on the entire surface by electroless plating. The method for forming the seed layer is the same as for forming the seed layer 36 described in, e.g., the first embodiment. That is, after the conditioning, the adhesion of a catalyst to the surface of the resin layer, the seed layer is formed by electroless plating.

Next, a photoresist film (not illustrated) is formed on the entire surface by spin coating.

Then, openings (not illustrated) are formed in the photoresist film down to the seed layer by photolithography. The openings are for forming interconnections 98.

Next, the interconnections 98 of Cu are formed in the openings of the photoresist film by electroplating. Then, the photoresist film is released.

Then, the seed layer exposed beyond the interconnections 98 is removed by wet etching (see FIG. 28). The etching liquid is, e.g., an about 1-10% ammonium persulfate aqueous solution. The etching period of time is, e.g., about 2 minutes. When the seed layer is etched off, the surface of the interconnections 98 are also etched a little. However, because of the thickness which is sufficiently smaller in comparison with the size of the interconnections 98, the seed layer can be etched in a short period of time. Accordingly, in etching the seed layer, the interconnections 98 are never excessively etched.

The following steps of the circuit board fabrication method according to the present embodiment are the same as those of the circuit board fabrication method according to the second embodiment, and their explanation will be omitted.

The circuit board fabrication method according to the present embodiment is characterized mainly in that the high-magnetic permeability layer 114 is formed of the resin film, then the surface part of the high-magnetic permeability layer 114 is cut with the cutting tool 12, and then the inductor 116 is formed on the high-magnetic permeability layer 114a.

In the present embodiment, the surface part of the high-magnetic permeability layer 114 of the resin film is cut with the cutting tool 12, whereby the surface of the high-magnetic permeability layer 114a after cut has suitable roughness. Accordingly, the adhesion between the high-magnetic permeability layer 114a of the resin layer and the inductor 116 can be sufficiently ensured. The present embodiment does not require the desmearing treatment, and accordingly, excessively deep pores are not formed in the surface of the high-magnetic permeability layer 114a of the resin, which permits a micronized pattern of a photoresist film to be formed on the high-magnetic permeability layer 114a. Thus, according to the present embodiment, the inductor 116 can have high reliability and a very small coil pitch.

A Fifth Embodiment

The method for fabricating the semiconductor device according to a fifth embodiment of the present invention will be explained with reference to FIGS. 30A to 37B. FIGS. 30A to 37B are views of the semiconductor device in the steps of the method for fabricating the semiconductor device, which illustrate the method.

The above-described plating method, the method for fabricating the semiconductor device and the method for fabricating the circuit board according to the first to the fourth embodiments illustrated in FIGS. 1A to 29 are represented by the same reference numbers not to repeat or to simplify their explanation.

The method for fabricating the semiconductor device according to the present embodiment is characterized mainly in that a resin layer 132 is formed, covering bump electrodes 128, i.e., stud bumps 128 formed by ball bonding, the surface of the resin layer 132 and the upper parts of the bump electrodes 128 are cut with a cutting tool 12, and then a seed layer 138 is formed on the cut resin layer 132a and the bump electrodes 128.

Figure 30A:
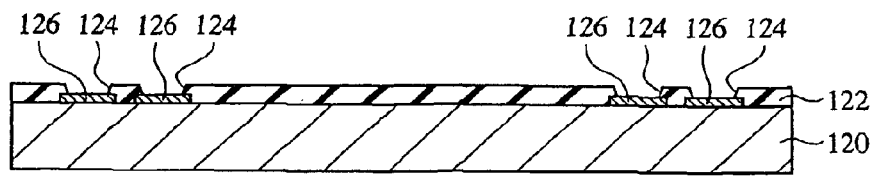
FIGS. 30A to 30D are views of the semiconductor device according to a fifth embodiment of the present invention in the steps of the method for fabricating the semiconductor device, which illustrate the method (Part 1).

First, as illustrated in FIG. 30A, a semiconductor substrate 120 is prepared. The semiconductor substrate 120 is, e.g., a silicon wafer. On the semiconductor substrate 120, a logic circuit and/or a memory circuit, etc. (not illustrated) comprising active device, such as MOS transistors, etc., passive devices, such as capacitor devices, etc., and others are formed. An insulation film 122 of, e.g., silicon oxide film is formed on such semiconductor substrate 120. The insulation film 122 is formed by, e.g., CVD. The insulation film 122 is formed in a plurality of layers on the semiconductor substrate 120, but only one of them is illustrated in FIG. 30A. As illustrated in FIG. 30A, openings 124 are formed in the insulation film 122. Electrodes pads 126 of, e.g., aluminum (Al) are formed in the openings 124, electrically connected to the above-described logic circuit and/or the memory circuit, etc.

In the present embodiment, to make the fabrication cost low, the following steps are conducted on the semiconductor substrate 120 which is not cut in discrete semiconductor device (semiconductor chips). However, the following steps may be conducted on the semiconductor substrate 120 which has been cut and separated into discrete semiconductor devices.

Figure 30B:
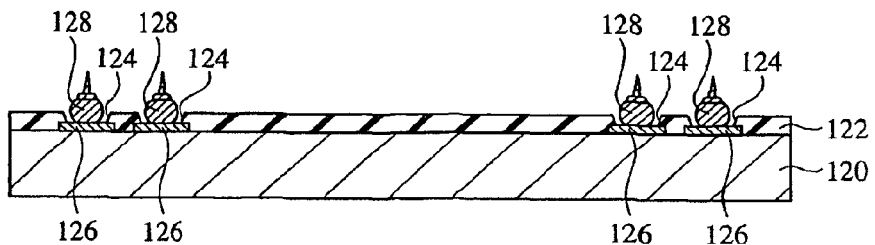

Then, as illustrated in FIG. 30B, the stud bumps 128 of, e.g., gold (Au), copper (Cu) or others are formed on the electrode pads 126. The stud bumps 128 are bump electrodes formed on the electrode pads 126 by ball bonding, which is used in wire bonding. The stud bumps 128 are formed by forming balls on the forward ends of wires of gold (Au) or others by discharge, thermocompression bonding the balls onto the electrode pads 126 of aluminum or others with capillaries for the wire bonding, lifting the capillaries with the wires fixed to the bumps, and cutting the wires at the tops of the balls.

It is possible that before the stud bumps 128 are formed, an inspection or a test is made on the respective semiconductor chips 120a formed on the semiconductor substrate 120 (see FIG. 31) to form the stud bumps 128 only on the electrode pads 126 of those of the semiconductor chips 120a found normal by the inspection or the test. The stud bumps 128 are not formed on the electrodes pad 126 of abnormal ones of the semiconductor chips 120a, which can decrease the fabrication cost.

Figure 30C:
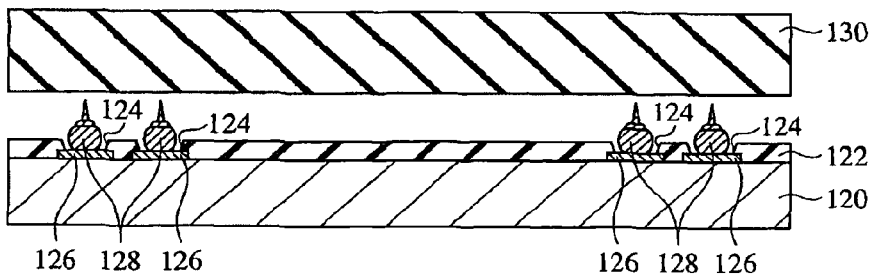

Then, as illustrated in FIG. 30C, a resin film 130 is placed on the semiconductor substrate 120. The resin film 130 is ABF, a film for forming insulation layers, by AJINOMOTO CO., INC., as is the resin film 8 used in the first embodiment. The film thickness of the resin film 130 is, e.g., 60 µm.

Figure 30D:
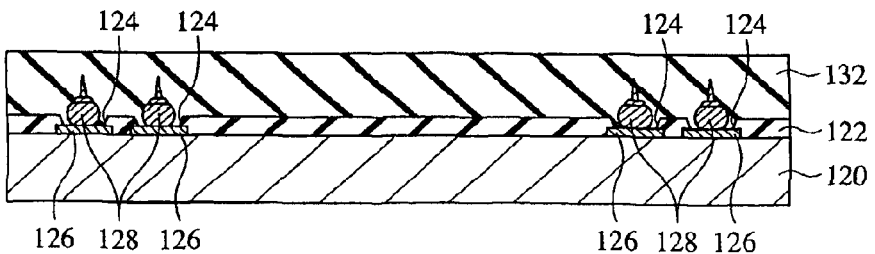

Then, by a vacuum press, the resin film 130 is adhered to the semiconductor substrate 120 with an inter-layer insulation film 122, etc. formed on (see FIG. 30D). Specifically, the resin film 130 is heated and solved while depressurized to thereby the resin film 130 is adhered to the inter-layer insulation film 122. The temperature for solving the resin film 130 is, e.g., 150° C. Thus, a resin layer 132 of the resin film 130 is formed on the semiconductor substrate 120 with the inter-layer insulation film 122, etc. formed on. The stud bumps 128 are buried in the resin layer 132.

Then, the resin layer 132 is solidified by thermal processing. Conditions for the thermal processing are, e.g., 170° C. and 1 hour.

Figure 31A:
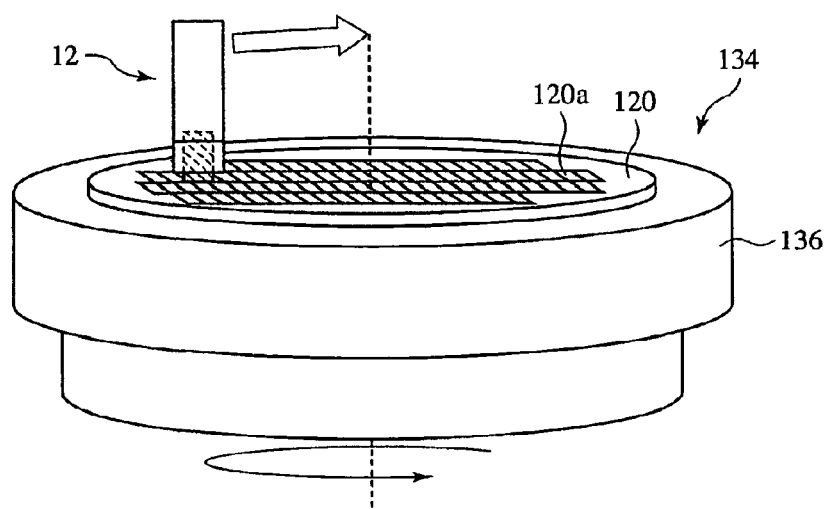
FIGS. 31A and 31B are views of the semiconductor device according to the fifth embodiment of the present invention in the steps of the method for fabricating the semiconductor device, which illustrate the method (Part 2).

Next, as illustrated in FIG. 31A, the semiconductor substrate 120 is fixed to a chuck table 136 of an ultraprecision lathe 134 by vacuum suction.

FIG. 31A is a perspective view of the semiconductor substrate 120 fixed to the ultraprecision lathe. When the semiconductor substrate 120 is fixed to the chuck table 136, the backside of the semiconductor substrate 120, i.e., the surface where the stud bumps 128 are not formed is fixed to the chuck table 136. When the semiconductor substrate 120 is fixed to the chuck table 136, preferably, a pin chuck is used.

Figure 31B:
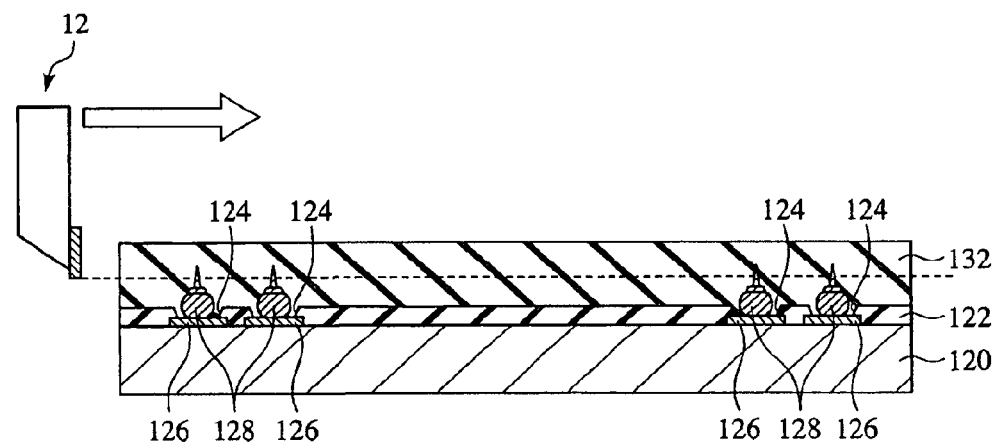

Next, while the semiconductor substrate 120 is being rotated, the surface of the resin layer 132 and the upper parts of the stud bumps 128 are cut with a cutting tool 12 of diamond (see FIG. 31B).

Conditions for cutting the surface of the resin layer 132 and the upper parts of the stud bumps 128 are as follows.

The tool angle of the cutting tool 12 used in the cutting is, e.g., about 80 degrees. The rake angle of the cutting tool 12 is about 0 degrees. The rotation number of the chuck table is, e.g., about 1000 rpm. With the rotation number thus set, the cutting speed is about 5 m/second for an about 5 cm rotation radius. The cut amount of the cutting tool 12 is, e.g., about 5 µm. The feed of the cutting tool 12 is, e.g., 50 µm/second.

When the cut is conducted under these conditions, the ten-point height of irregularities Rz of the surface of the resin layer 132a (hereinafter the resin layer after cut is indicated by the resin layer 132a to be discriminated from the resin layer 132 before cut) is, e.g., about 1-2 µm. On the other hand, the ten-point height of irregularities of the surfaces of the stud bumps 128 is, e.g., about 20 nm.

The ten-point height of irregularities Rz of the surface of the resin layer 132a is about 1-2 µm here. However, the ten-point height of irregularities Rz of the surface of the resin layer 132a is not limited to about 1-2 µm. The surfaces of the resin layer 132a may be cut so that the ten-point height of irregularities Rz of the surface of the resin layer 132a becomes, e.g., 0.5-5 µm.

Thus, the surface of the resin layer 132 and the upper parts of the stud bumps 128 are cut. Resultantly, the upper end surfaces of the stud bumps 128 are exposed on the cut surface of the resin layer 132a (see FIG. 32A).

Figure 32A:
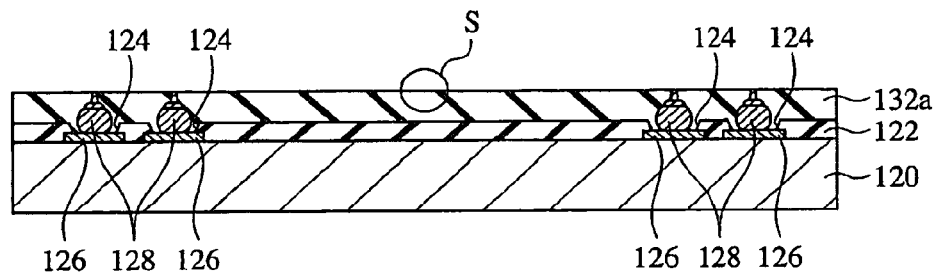
FIGS. 32A to 32D are views of the semiconductor device according to the fifth embodiment of the present invention in the steps of the method for fabricating the semiconductor device, which illustrate the method (Part 3).
Figure 32B:
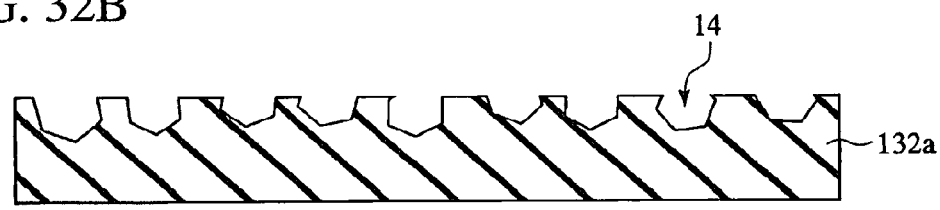

FIG. 32B is an enlarged view of the part in the circle S in FIG. 32A. As illustrated in FIG. 32B, concavities 14 are formed in the surface of the resin layer 132a.

The cutting here is conducted by advancing the cutting tool 12 straight in one direction while the semiconductor substrate 120 is being rotated. However, it is also possible to conduct the cutting by rotating a wheel (not illustrated) with the cutting tool 12 mounted while the semiconductor substrate 120 is being advanced straight in one direction.

Figure 32C:
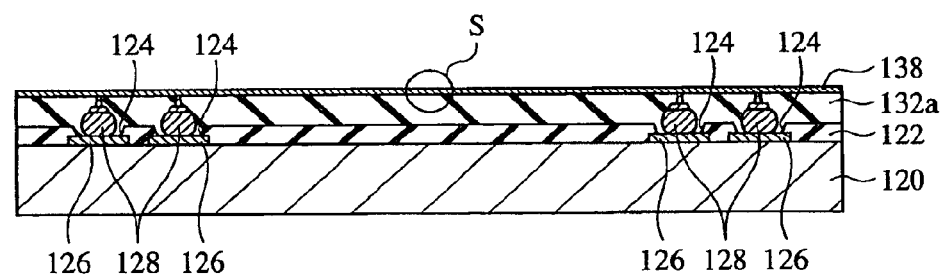

Next, as illustrated in FIG. 32C, a seed layer 138 of copper or nickel is formed on the entire surface by electroless plating. The process for forming the seed layer 138 is the same as, e.g., the process forming the seed layer 36 described in the first embodiment. That is, after the conditioning, the adhesion of the catalyst to the surface of the resin layer 132a, etc., the seed layer 138 is formed by electroless plating. Thus, the seed layer 138 of an electroless plated film of, e.g., a 0.3-0.5 µm-thickness is formed.

Figure 32D:
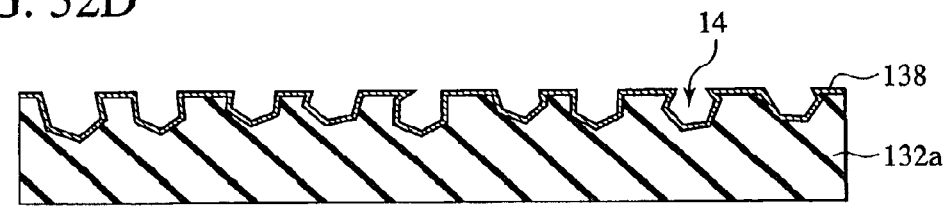

FIG. 32D is an enlarged view of the part in the circle S in FIG. 32B. As illustrated in FIG. 32D, the seed layer 138 is formed on the resin layer 132a with the concavities 14 formed in the surface and is fixed by the parts formed in the concavities 14. The adhesion between the seed layer 138 and the resin layer 132a is sufficiently ensured.

The seed layer 138 is formed in mechanical contact with the exposed end surfaces of the stud bumps 128 described above and can be electrically connected to the stud bumps 128.

Figure 33A:
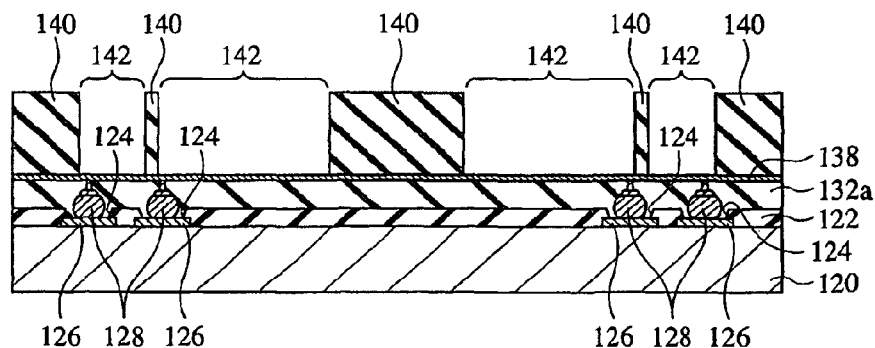
FIGS. 33A to 33C are views of the semiconductor device according to the fifth embodiment of the present invention in the steps of the method for fabricating the semiconductor device, which illustrate the method (Part 4).

Next, as illustrated in FIG. 33A, a photoresist film 140 is formed on the entire surface by spin coating.

Next, by photolithography, openings 142 are formed in the photoresist film 140 down to the seed layer 138. The openings 142 are for forming interconnections 144. The cavities in the surface of the resin layer 132a are not excessively deep, and the cavities formed in the surface of the seed layer 138 are not excessively deep. Accordingly, when the photoresist film 140 is patterned micronized, the pattern can be formed well of the photoresist film 140.

Figure 33B:
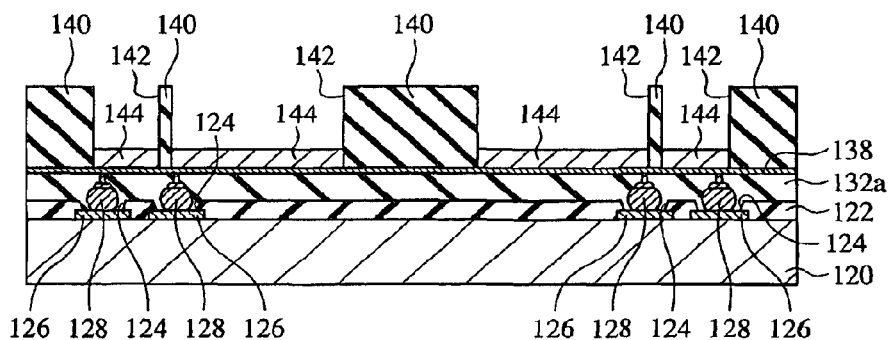

Then, as illustrated in FIG. 33B, the interconnections 144 of Cu are formed on the seed layer 138 in the openings 142 of the photoresist film 140 by electroplating. As described above, the photoresist film 140 has been well patterned even when the pattern is micronized, and the interconnections 144 can be formed at an accordingly small pitch. Because of the sufficient adhesion between the seed layer 138 and the resin layer 132a, the interconnections 144 can be surely fixed to the resin layer 132a via the seed layer 138.

Figure 33C:
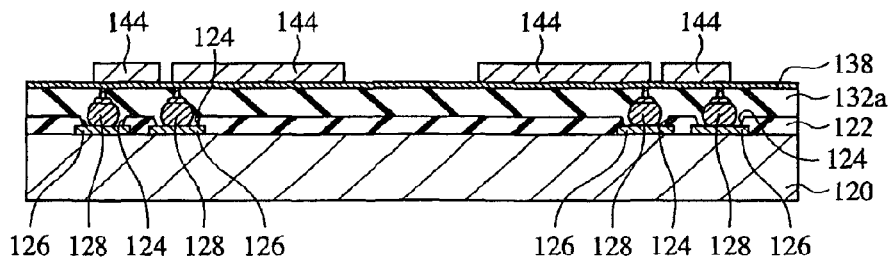

Then, as illustrated in FIG. 33C, the photoresist film 140 is released.

Figure 34A:
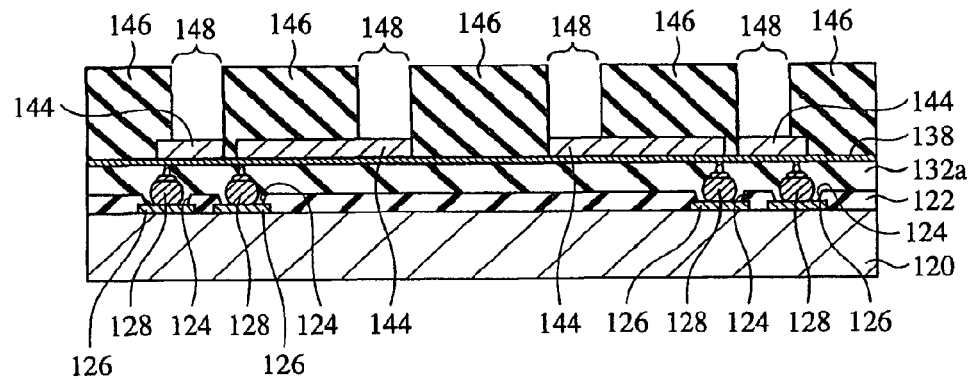
FIGS. 34A to 34C are views of the semiconductor device according to the fifth embodiment of the present invention in the steps of the method for fabricating the semiconductor device, which illustrate the method (Part 5).

Next, as illustrated in FIG. 34A, a photoresist film 146 is formed on the entire surfaces of the interconnections 144 and the seed layer 138 by spin coating.

Next, by photolithography, openings 148 are formed in the photoresist film 146 down to the interconnections 144. The openings 148 are for forming conductor plugs 150.

Figure 34B:
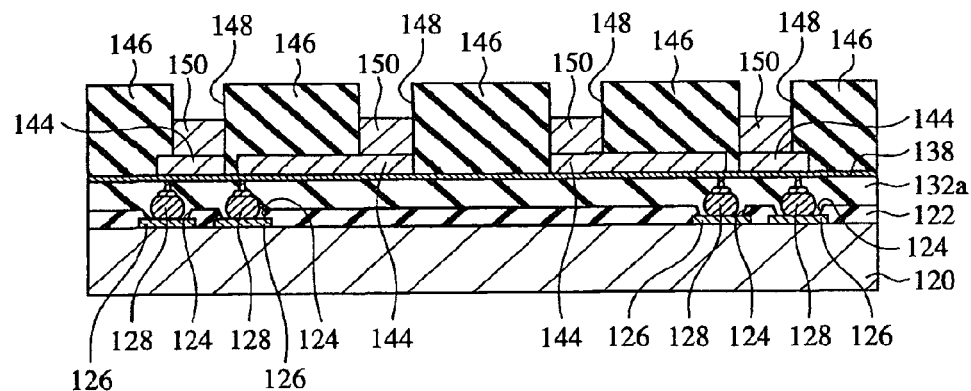

Next, as illustrated in FIG. 34B, the conductor plugs 150 of Cu are formed in the openings 148 by electroplating.

Figure 34C:
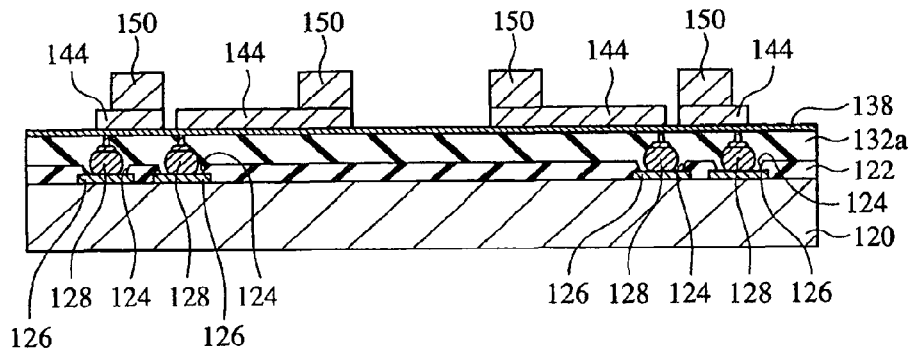

Then, as illustrated in FIG. 34C, the photoresist film 146 is released.

Figure 35A:
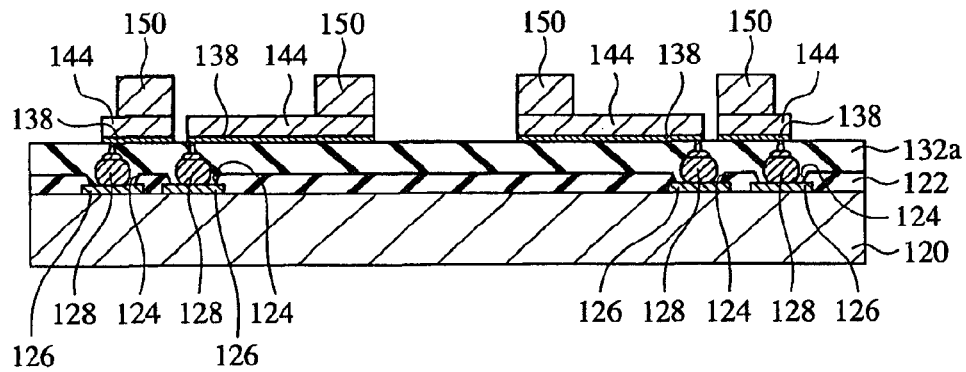
FIGS. 35A to 35C are views of the semiconductor device according to the fifth embodiment of the present invention in the steps of the method for fabricating the semiconductor device, which illustrate the method (Part 6).

Next, as illustrated in FIG. 35A, the seed layer 138 exposed around the interconnections 144 is removed by wet etching. The etching liquid is, e.g., an about 1-10% ammonium persulfate. The etching period of time is, e.g., about 2 minutes. When the seed layer 138 is etched off, the surfaces of the interconnections 144 and the conductor plugs 150 are also etched a little. However, because of the thickness of the seed layer 138 which is sufficiently small in comparison with the sizes of the interconnections 144 and the conductor plugs 150, the seed layer 138 can be etched in a short period of time. Accordingly, in etching the seed layer 138, the interconnections 144 and the conductor plugs 150 are never excessively etched.

Figure 35B:
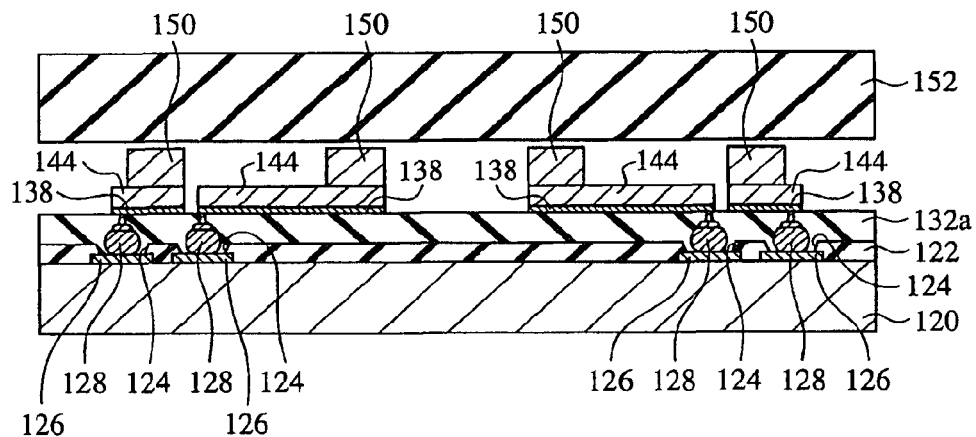

Then, as illustrated in FIG. 35B, a resin film 152 is mounted on the semiconductor substrate 120. The resin film 152 is ABF, a film for forming insulation layers, by AJINO-MOTO CO., INC., as is, e.g., the resin film 130 described above with reference to FIG. 30C.

Figure 35C:
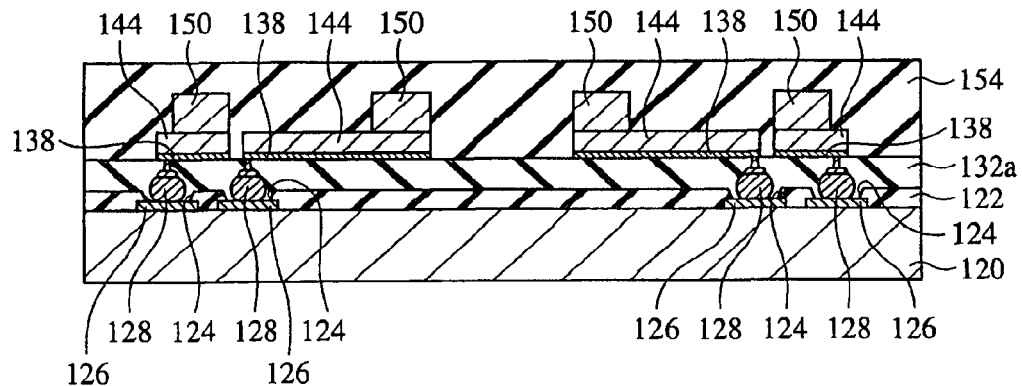

Next, by a vacuum press, the resin film 152 is adhered to the resin layer 132a with the interconnections 144 and the conductor plugs 150 formed on (see FIG. 35C). Specifically, the resin film 152 is adhered to the inter-layer insulation film 132a by being heated and solved while depressurized. The temperature for solving the resin film 152 is, e.g., 150° C. Thus, a resin layer 154 of the resin film 152 is formed on the resin layer 132a. The interconnections 144 and the conductor plugs 150 are buried by the resin layer 154.

Next, the resin layer 154 is solidified by thermal processing. Conditions for the thermal processing are, e.g., 170° C. and 1 hour.

Figure 36A:
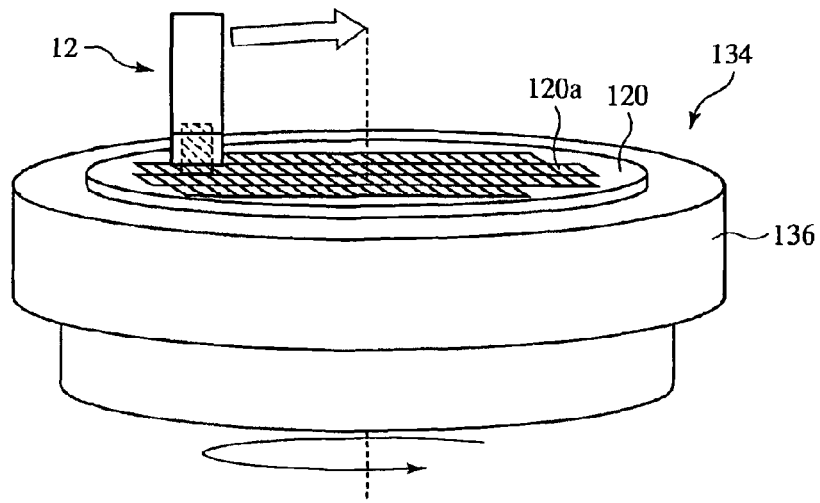
FIGS. 36A and 36B are views of the semiconductor device according to the fifth embodiment of the present invention in the steps of the method for fabricating the semiconductor device, which illustrate the method (Part 7).

Next, as illustrated in FIG. 36A, the semiconductor substrate 120 is fixed to the chuck table 136 of the ultraprecision lathe 134 by vacuum suction.

FIG. 36A is a perspective view of the semiconductor substrate 120 fixed to the ultraprecision lathe 134. When the semiconductor substrate 120 is fixed to the chuck table 136, the backside of the semiconductor substrate 120, i.e., the surface where the conductor plugs 150, etc. are not formed is fixed to the chuck table 136. When the semiconductor substrate 120 is fixed to the chuck table 136, preferably, a pin chuck is used.

Figure 36B:
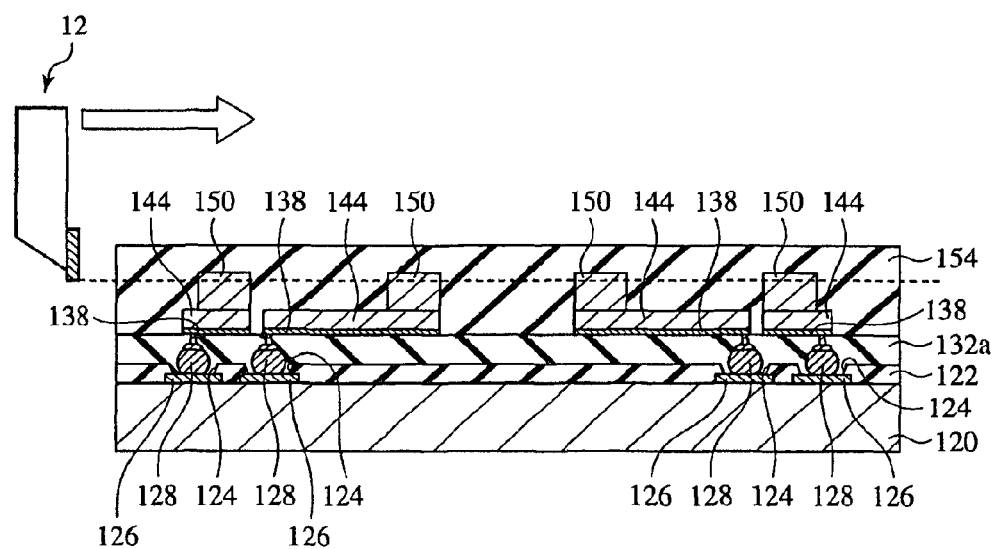

Then, while the semiconductor substrate 120 is being rotated, the surface of the resin layer 154 and the upper parts of the conductor plugs 150 are cut with a cutting tool 12 of diamond (see FIG. 36B).

Conditions for cutting the surface of the resin layer 154 and the upper parts of the conductor plugs 150 may be the same as those for cutting the surface of the resin layer 132 and the upper parts of the stud bumps 128 described above or may be different from those for cutting the surface of the resin layer 132 and the upper parts of the stud bumps 128 described above. This is because the surface of the resin layer 154a (hereinafter the resin layer 154 after cut is indicated by the resin layer 154a to be discriminated from the resin layer 154 before cut) need not be set at a suitable roughness because no seed layer must be formed on the resin layer 154a. When the resin layer 154a must have the surface cut smooth, the rake angle of the cutting tool 12 may be set, e.g., about 10 degrees for the cutting. By setting the rake angle of the cutting tool 12 a little larger, the surface of the resin layer 154a can be smooth. The rotation number of the chuck table 136 is, e.g., about 1000 rpm. When the cutting is divided to be conducted several times, the cut amount of the cutting tool 12 in the final cutting is set at, e.g., about 2 μm. The feed of the cutting tool 12 is set at, e.g., 70 μm/second. The cutting under these conditions makes the surface of the resin layer 154a very smooth.

Figure 37A:
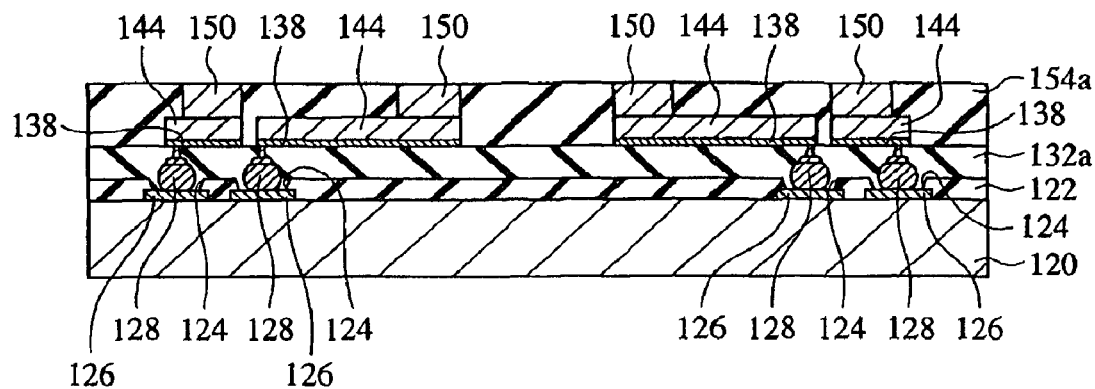
FIGS. 37A and 37B are views of the semiconductor device according to the fifth embodiment of the present invention in the steps of the method for fabricating the semiconductor device, which illustrate the method (Part 8).

Thus, the surface of the resin layer 154 and the upper parts of the conductor plugs 150 are cut (see FIG. 37A).

The cutting here is conducted by advancing the cutting tool 12 straight in one direction while the semiconductor substrate 120 is being rotated. However, it is also possible to conduct the cutting by rotating a wheel (not illustrated) with the cutting tool 12 mounted while the semiconductor substrate 120 is being advanced straight in one direction (not illustrated).

Figure 37B:
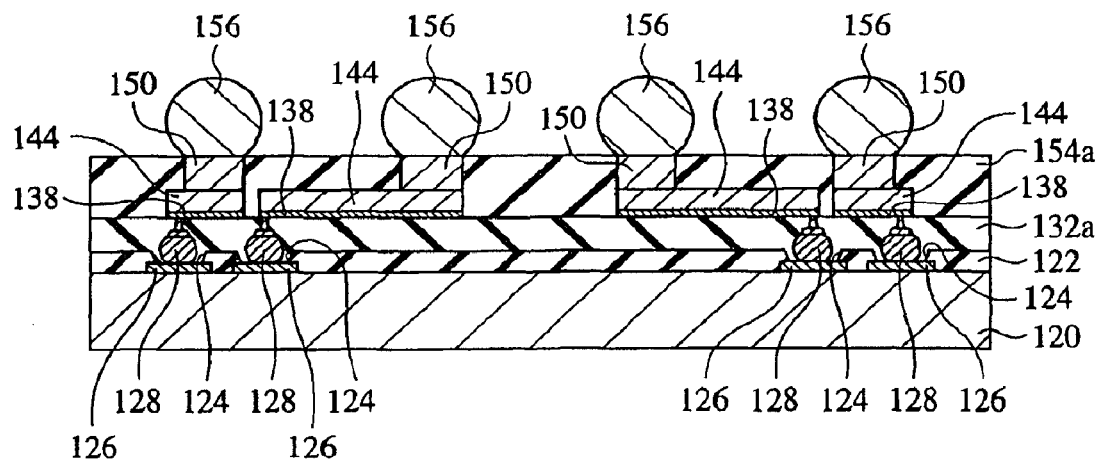

Next, as illustrated in FIG. 37B, solder bumps 156 of, e.g., Sn-based solder are formed on the conductor plugs 150.

The solder bumps 156 are formed here directly on the conductor plugs 150. However, a barrier metal film (not illustrated) of nickel (Ni), gold (Au) or others may be formed on the conductor plugs 150. The barrier metal film is formed on the conductor plugs 150, and the solder bumps 156 are formed on the barrier metal, whereby the diffusion of the material of the conductor plugs 150 into the solder bumps 156 can be prevented.

Then, with a thin blade formed of diamond particles collected with a binder, the semiconductor substrate is cut and separated into discrete semiconductor devices (semiconductor chips). This processing is of course unnecessary when the semiconductor substrate has been cut and separated in discrete semiconductor devices.

Thus, the semiconductor device according to the present embodiment is fabricated.

In this structure, the electrode pads 126 of the semiconductor substrate 120 are electrically connected to the outside via the stud bumps 128, the interconnections 144 including the seed layer 138, the conductor plugs 150 and the solder bumps 156.

The method for fabricating the semiconductor device according to the present embodiment is characterized mainly in that, as described above, the resin layer 132 is formed, covering the bump electrodes (stud bumps) 128 formed by ball bonding, the surface of the resin layer 132 and the upper parts of the stud bumps 128 are cut with the cutting tool 12, and then the seed layer 138 is formed on the cut resin layer 132a and the stud bumps 128.

Forming bump electrodes by plating causes a certain cost irrespective of the number of the bump electrodes. Accordingly, when a large number of the bump electrodes are formed, the cost per 1 bump electrodes is relatively low, but the cost per 1 bump electrode is relatively high when the number of the bump electrodes is not so large. On the other hand, when the stud bumps 128 are formed, i.e., the bump electrodes 128 are formed by ball bonding, costs are caused corresponding to numbers of the bump electrodes 128. Accordingly, when the number of the bump electrodes 128 is relatively small, the ball bonding often costs less than the plating. Thus, it can decrease the cost to suitably form the bump electrodes by ball bonding as in the present embodiment.

A Sixth Embodiment

The method for fabricating the semiconductor device according to a sixth embodiment of the present invention will be explained with reference to FIGS. 38A to 46C. FIGS. 38A to 46C are views of the semiconductor device according to the present embodiment in the steps of the method for fabricating the semiconductor device, which illustrate the method.

The members of the plating method, the method for fabricating the semiconductor device and the method for fabricating the circuit board according to the first to the fifth embodiments described above and illustrated in FIGS. 1A to 37B are represented by the same reference numbers not to repeat or to simplify their explanation.

The method for fabricating the semiconductor device according to the present embodiment is characterized mainly in that semiconductor chips 166 are mounted on a semiconductor substrate 158, wire electrodes 174 and bump electrodes 176 are formed on the semiconductor substrate 158 and the semiconductor chips 166 respectively by ball bonding, a resin layer 180 is formed, burying the wire electrodes 174 and the bump electrodes 176, the surface of the resin layer 180 is cut with a cutting tool 12, and a seed layer 182 is formed on the cut resin layer 180a in contact with the wire electrodes 174 and the bump electrodes 176.

Figure 38A:
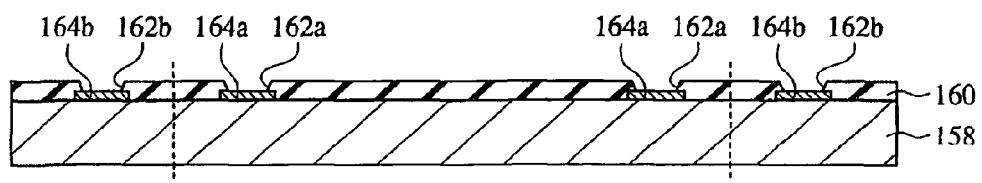
FIGS. 38A to 38C are views illustrating the semiconductor device according to a sixth embodiment of the present invention in the steps of the method for fabricating the semiconductor device, which illustrate the method (Part 1).

First, as illustrated in FIG. 38A, the semiconductor substrate 158 is prepared. The semiconductor substrate 158 is, e.g., a silicon wafer. On the semiconductor substrate 158, a logic circuit and/or a memory circuit, etc. (not illustrated) comprising active devices, such as MOS transistors, etc., passive devices, such as capacitor devices, etc., and others. is formed. An insulation film 160 of, e.g., silicon oxide film is formed on such semiconductor substrate 158. The insulation film 160 is formed by, e.g., CVD. The insulation film 160 is formed in a plurality of layers on the semiconductor substrate 158, but only one of them is illustrated in FIG. 38A.

Openings 162a, 162b are formed in the insulation film 160. Electrode pads 164a of, e.g., aluminum (Al) are provided in the openings 162a, electrically connected to the logic circuit, etc. described above.

In the openings 162b, dummy pads 164b of, e.g., aluminum (Al), which are not electrically connected to the logic circuit, etc. described above are provided. The dummy pads 164b are to be used to cut the wires of the bump electrodes which will be described later. The dummy pads 164b are provided in the chips if the chips have spaces for forming the dummy pads 164b, but if the chips have no space for forming the dummy pads 164b, the dummy pads 164b may be formed in the adjacent chips. FIG. 38A illustrates an example that the dummy pads 164b are formed in the adjacent chips. The broken lines in FIG. 38A indicate the cut surfaces along which the semiconductor substrate 158 is cut into semiconductor devices (semiconductor chips) in a later step. As illustrated in FIG. 38A, the dummy pads 164b are disposed on chips adjacent to each other.

Figure 38B:
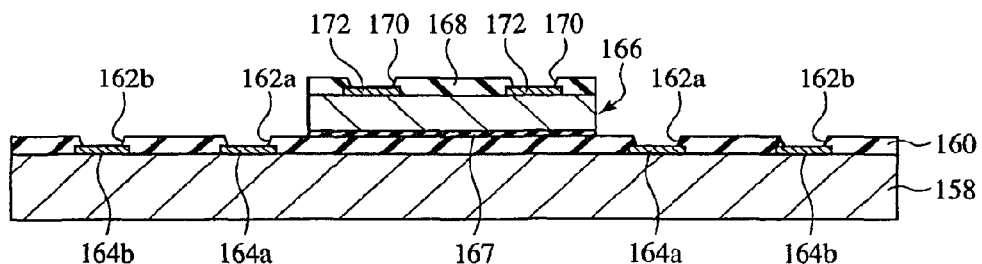
Figure 38C:
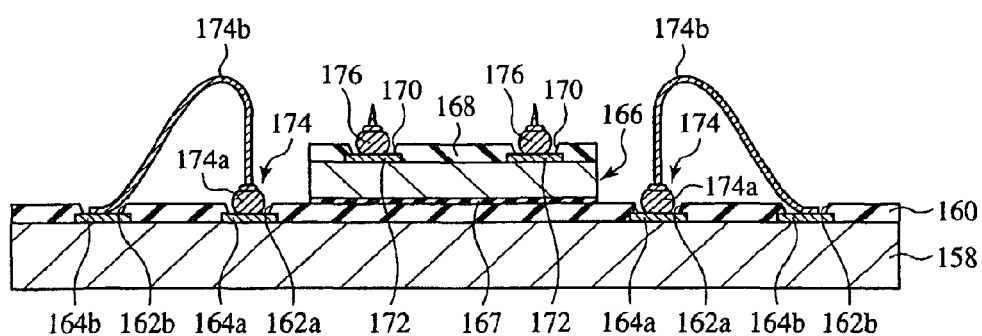

Next, a semiconductor chip 166 is prepared (see FIG. 38B). On one primary surface (the surface opposite to the surface opposed to the semiconductor substrate 158), another logic circuit and/or another memory circuit, etc. (not illustrated) comprising active devices, such as MOS transistors, etc. passive devices, such as capacitor devices, etc. and others are formed. An insulation film 168 of, e.g., silicon oxide film is formed on one primary surface of the semiconductor chip 166 (the surface opposite to the surface opposed to the semiconductor substrate 158). The insulation film 168 is formed by, e.g., CVD. A plurality of the insulation films 168 are formed on the semiconductor chip 166, but only one of the insulation films 168 is illustrated in FIG. 38B. Openings 170 are formed in the insulation film 168. Electrode pads 172 of, e.g., aluminum (Al) are provided in the openings 170, electrically connected to the logic circuit, etc. described above.

Then, the semiconductor chip 166 is mounted on the insulation film 160 formed on the semiconductor substrate 158. At this time, the semiconductor chip 166 is mounted with the other primary surface of the semiconductor chip 166 opposed to the semiconductor substrate 158. To mount the semiconductor chip 166 on the semiconductor substrate 158, i.e., fixing the semiconductor chip 166 to the semiconductor substrate 158, an adhesive 167 is used to secure the semiconductor chip 166 to the semiconductor substrate 158. Thus, the semiconductor chip 166 is fixed by the adhesive layer 167.

Next, by ball bonding, the electrode pads 164a and the dummy pads 164b formed on the semiconductor substrate 158 are bonded by wire bonding to form wire electrodes 174, and other bump electrodes (stud bumps) 176 are formed on the electrodes pad 172 formed on the semiconductor chip 166. The wire electrode 174 and the stud bumps 176 are formed of, e.g., gold (Au) or copper (Cu). In forming the wire electrodes 174, the wire electrodes 174 are formed, projected upward beyond at least one primary surface of the semiconductor chip 166 (the surface opposite to the surface opposed to the semiconductor substrate 158).

Specifically, the wire electrodes 174 are formed by forming balls 174a are formed on the forward ends of wires 174b of gold (Au) or others by discharge, thermocompression bonding the balls onto the electrode pads 164a of aluminum or others with capillaries for the wire bonding, lifting the capillaries with the wires 174b fixed, then thermocompression bonding the wires 174b to the dummy pads 164b and cutting the wires 174b. In forming the wire electrodes 174, it is preferable that the wire electrodes 174 are formed, projected upward beyond the upper ends of the stud bumps 176 which will be described alter.

On the other hand, the stud pumps 176 are formed by forming balls on the forward ends of wires of gold (Au) or others by discharge, thermocompression bonding the balls to the electrodes pads 172 of aluminum or others by capillaries for wire bonding, lifting the capillaries with the wires fixed and cutting the wires at the upper ends of the wires.

The wire electrodes 174 are formed, projected upward beyond one primary surface of the semiconductor chip 166 (the surface opposite to the surface opposed to the semiconductor substrate 158) so that the wire electrodes 174 and the stud bumps 176 can be connected to each other by interconnections 188 (see FIG. 42B) in a later step.

It is possible that before the wire electrodes 174 and the stud bumps 176 are formed, an inspection or a test is made on the respective semiconductor chips 158a formed on the semiconductor substrate 158 (see FIG. 40A) to form the wire electrodes 174 and the stud bumps 176 only on those of the semiconductor chips 158a found normal by the inspection or the test. The wire electrodes 174 and the stud bumps 176 are not formed on abnormal ones of the semiconductor chips 158a, which can decrease the fabrication cost.

Figure 39A:
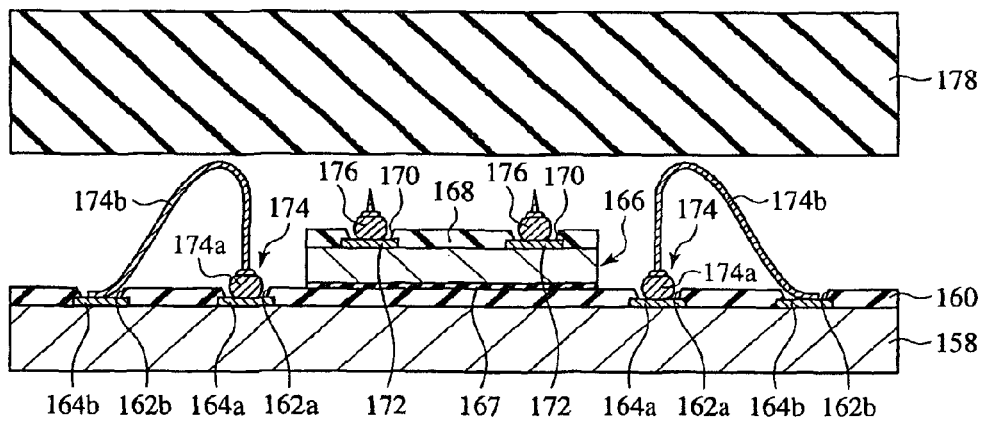
FIGS. 39A and 39B are views illustrating the semiconductor device according to the sixth embodiment of the present invention in the steps of the method for fabricating the semiconductor device, which illustrate the method (Part 2).
Figure 39B:
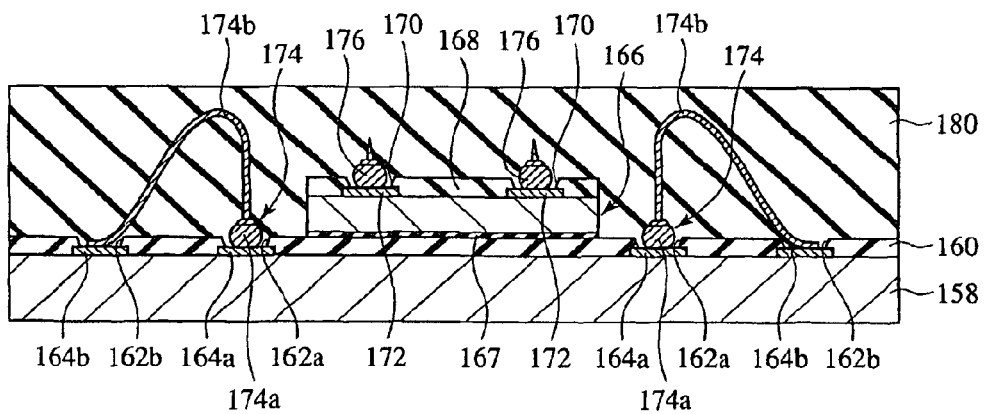

Then, as illustrated in FIG. 39A, a resin film 178 is placed on the semiconductor substrate 158. The resin film 178 is ABF, a film for forming insulation layers, by AJINOMOTO CO., INC., as is the resin film 8 used in the first embodiment. The film thickness of the resin film 178 is, e.g., 150 µm.

Then, by a vacuum press apparatus, the resin film 178 is adhered to the semiconductor substrate 158 with an inter-layer insulation film 160, etc. formed on (see FIG. 30D). Specifically, the resin film 178 is heated and solved while depressurized to thereby the resin film 178 is adhered to the inter-layer insulation film 160. The temperature for solving the resin film 178 is, e.g., 160° C., which is higher than 150° C. usually used, whereby the resin is buried between the wires without bending the wires. Thus, a resin layer 180 of the resin film 178 is formed on the semiconductor substrate 158 with the inter-layer insulation film 160, etc. formed on. The wire electrodes 174 and the stud bumps 176 are buried in the resin layer 180.

It is possible to use a liquid resin in place of the resin film to bury the wire electrodes 174 and the stud bumps 176.

Then, the resin layer 180 is solidified by thermal processing. Conditions for the thermal processing are, e.g., 170° C. and 1 hour.

Figure 40A:
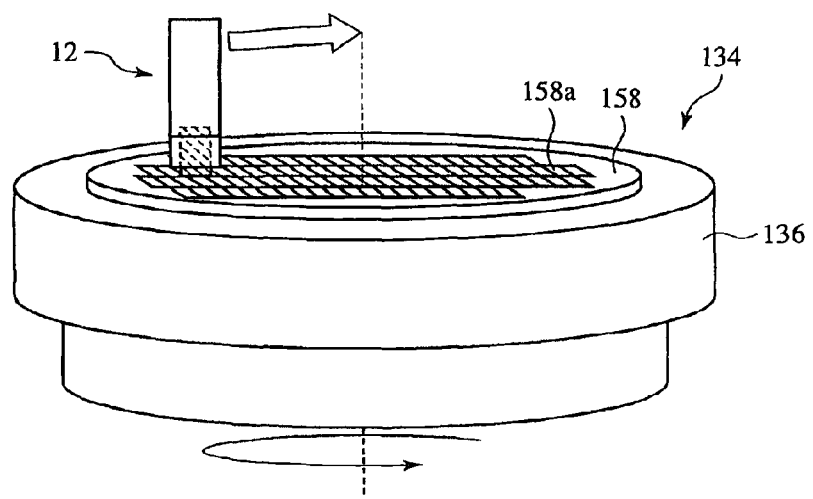
FIGS. 40A and 40B are views illustrating the semiconductor device according to the sixth embodiment of the present invention in the steps of the method for fabricating the semiconductor device, which illustrate the method (Part 3).

Next, as illustrated in FIG. 40A, the semiconductor substrate 158 is fixed to the chuck table 136 of an ultraprecision lathe 134 by vacuum suction.

FIG. 40A is a perspective view of the semiconductor substrate 158 fixed to the ultraprecision lathe 134. When the semiconductor substrate 158 is fixed to the chuck table 136, the backside of the semiconductor substrate 158, i.e., the surface where the wire electrodes 174, the stud bumps 176 are not formed is fixed to the chuck table 136. When the semiconductor substrate 158 is fixed to the chuck table 136, preferably, a pin chuck is used.

Figure 40B:
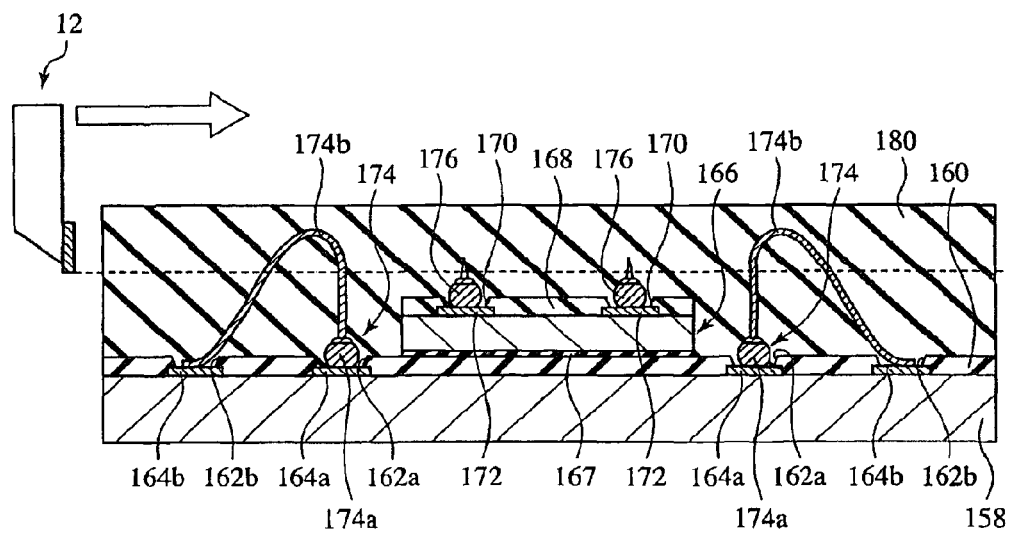

Next, while the semiconductor substrate 158 is being rotated, the surface of the resin layer 180 and the upper parts of the wire electrodes 174 and the stud bumps 176 are cut with a cutting tool 12 of diamond (see FIG. 40B).

Conditions for cutting the surface of the resin layer 180 and the upper parts of the wire electrodes 174 and the stud bumps 176 are as follows.

The rake angle of the cutting tool 12 is 0 degrees. The rotation number of the chuck table is, e.g., about 1000 rpm. The cutting rate of the cutting tool 12 is, e.g., about 5 µm. The feed of the cutting tool 12 is, e.g., 50 µm/second. When the cutting is conducted under these conditions, the ten-point height of irregularities Rz of the surface of the resin layer 180a (hereinafter the resin layer after cut is indicated by the resin layer 180a to be discriminated from the resin layer 180 before cut) is, e.g., about 1-2 µm. The ten-point height of irregularities Rz of the surfaces of the wire electrodes 174 and the stud bumps 176 is, e.g., about 20 nm.

The ten-point height of irregularities Rz of the surface of the resin layer 180a here is about 1-2 µm. However, the ten-point height of irregularities of the surface of the resin layer 180a is not limited to about 1-2 µm. The surface of the resin layer 180 may be cut so that the ten-point height of irregularities of the surface of the resin layer 180a is 0.5-5 µm.

Figure 41A:
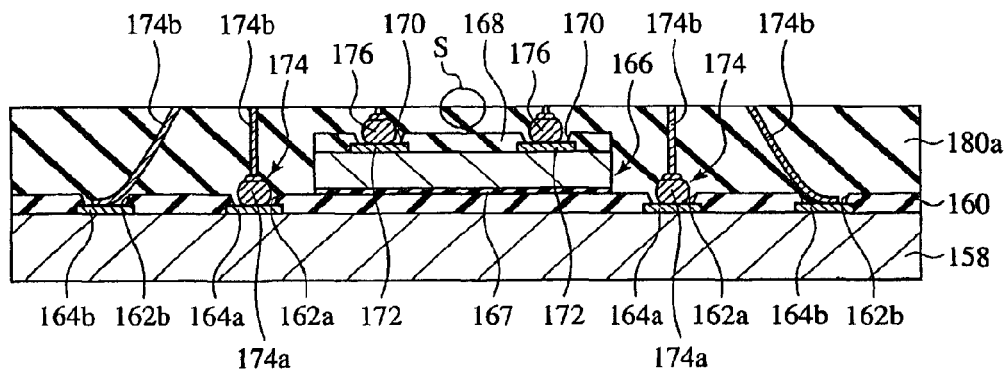
FIGS. 41A to 41D is views illustrating the semiconductor device according to the sixth embodiment of the present invention in the steps of the method for fabricating the semiconductor device, which illustrate the method (Part 4).
Figure 41B:
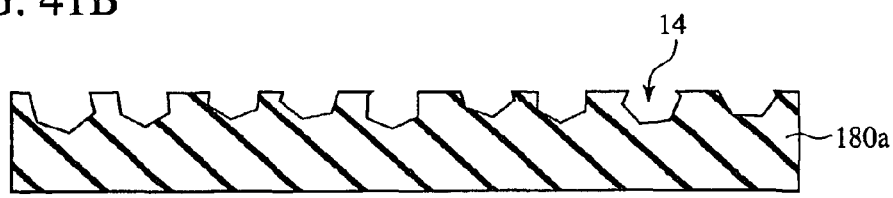

Thus, the surface of the resin layer 180 and he upper parts of the wire electrodes 174 and the stud bumps 176 are cut. Resultantly, the upper ends surfaces of the wire electrodes 174 and the stud bumps 176 are exposed in the cut surface of the resin layer 180a (see FIG. 41A). FIG. 41B is an enlarged view of the part inside the circle S in FIG. 41A. As illustrated in FIG. 41B, cavities 14 are formed in the surface of the resin layer 180a.

The cutting here is conducted by advancing the cutting tool 12 straight in one direction while the semiconductor substrate 158 is being rotated. However, it is also possible to conduct the cutting by rotating a wheel (not illustrated) with the cutting tool 12 mounted while the semiconductor substrate 158 is being advanced straight in one direction (not illustrated).

Figure 41C:
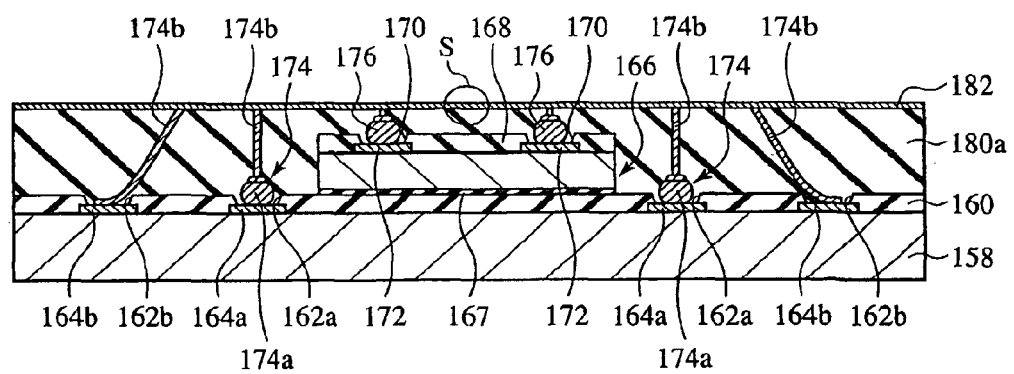

Then, as illustrated in FIG. 41C, a seed layer 182 is formed of copper or nickel on the entire surface by electroless plating. The process for forming the seed layer 182 is the same as the process for forming the seed layer 36 described in, e.g., the first embodiment. That is, after the conditioning, the adhesion of the catalyst to the surface of the resin layer 180a, etc., the seed layer 182 is formed by electroless plating. Thus, the seed layer 182 of an electroless plated film of, e.g., a 0.3-0.5 µm-thickness is formed.

Figure 41D:
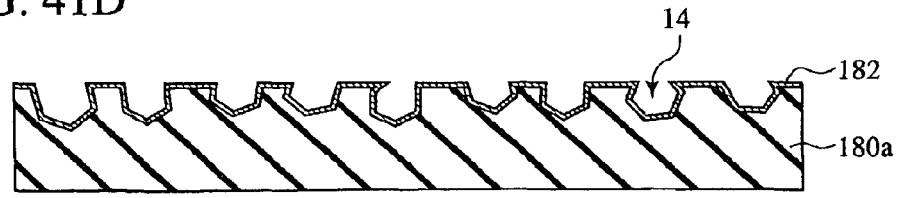

FIG. 41D is an enlarged view of the part in the circle S in FIG. 41B. As illustrated in FIG. 41D, the seed layer 182 is formed on the resin layer 180a with the concavities 14 formed in the surface and is fixed by the parts formed in the concavities 14. The adhesion between the seed layer 182 and the resin layer 180a is sufficiently ensured.

The seed layer 182 is formed in mechanical contact with the exposed end surfaces of the wire electrodes 174 and the stud bumps 176 described above and can be electrically connected to the wire electrodes 174 and the stud bumps 176.

Figure 42A:
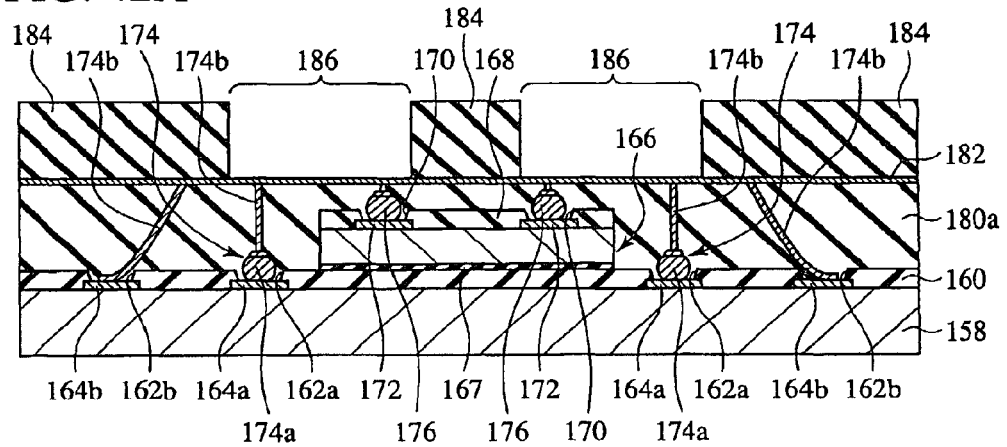
FIGS. 42A to 42C are views illustrating the semiconductor device according to the sixth embodiment of the present invention in the steps of the method for fabricating the semiconductor device, which illustrate the method (Part 5).

Next, as illustrated in FIG. 42A, a photoresist film 184 is formed on the entire surface by spin coating.

Next, by photolithography, openings 186 are formed in the photoresist film 184 down to the seed layer 182. The openings 186 are for forming interconnections 188. The cavities in the surface of the resin layer 180a are not excessively deep, and the cavities formed in the surface of the seed layer 182 are not excessively deep. Accordingly, when the photoresist film 184 is patterned nanonized, the pattern can be formed well of the photoresist film 184.

Figure 42B:
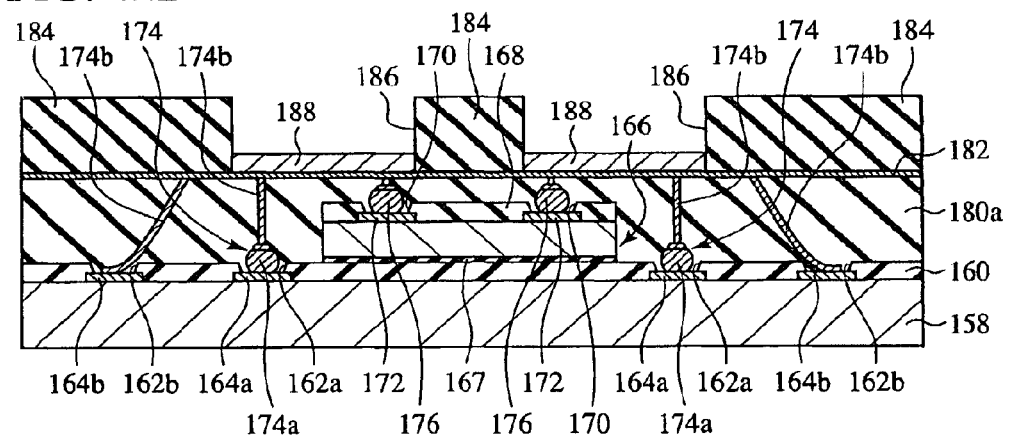

Then, as illustrated in FIG. 42B, the interconnections 188 of Cu are formed on the seed layer 182 in the openings 186 of the photoresist film 184 by electroplating. As described above, the photoresist film 184 has been well patterned even when the pattern is micronized, and the interconnections 188 can be formed at an accordingly small pitch. Because of the sufficient adhesion between the seed layer 182 and the resin layer 180a, the interconnections 188 can be surely fixed to the resin layer 180a via the seed layer 182.

Figure 42C:
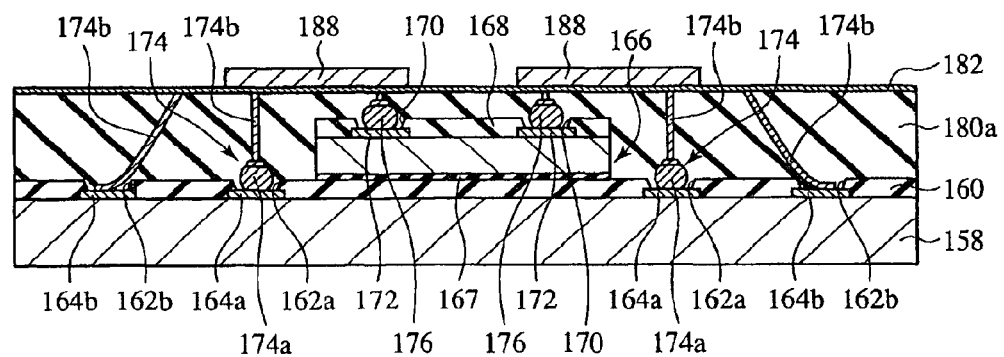

Then, as illustrated in FIG. 42C, the photoresist film 184 is released.

Figure 43A:
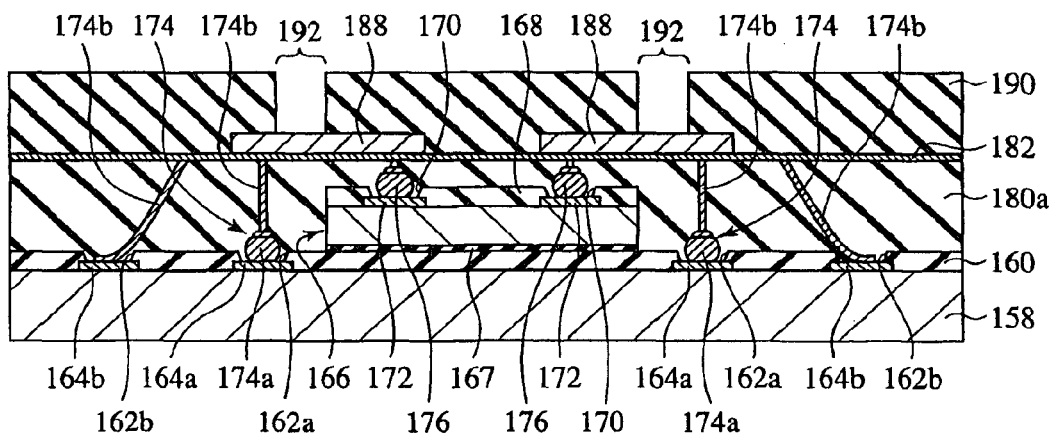
FIGS. 43A to 43C are views illustrating the semiconductor device according to the sixth embodiment of the present invention in the steps of the method for fabricating the semiconductor device, which illustrate the method (Part 6).

Next, as illustrated in FIG. 43A, a photoresist film 190 is formed on the entire surfaces of the interconnections 188 and the seed layer 182 by spin coating.

Next, by photolithography, openings 192 are formed in the photoresist film 190 down to the interconnections 188. The openings 192 are for forming conductor plugs 194 (see FIG. 43B).

Figure 43B:
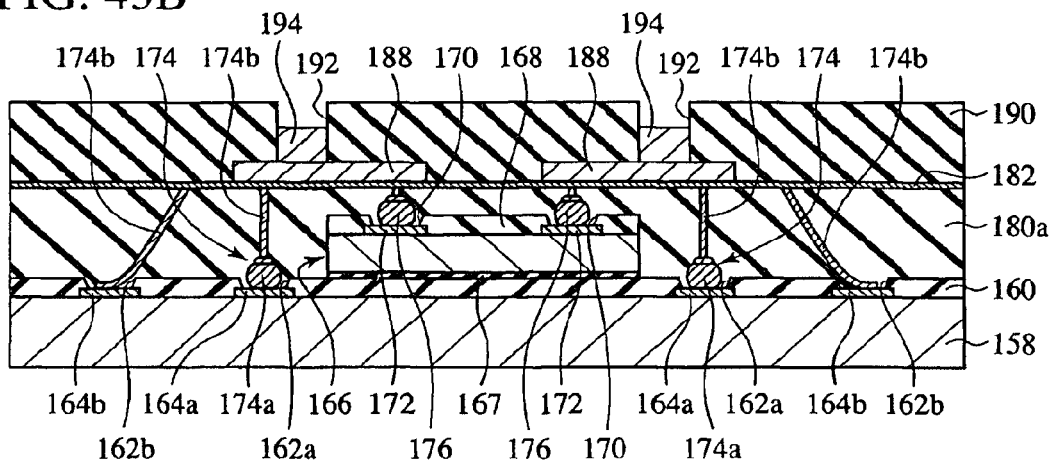

Then, as illustrated in FIG. 43B, conductor plugs 194 of Cu are formed in the openings 192 by electroplating.

Figure 43C:
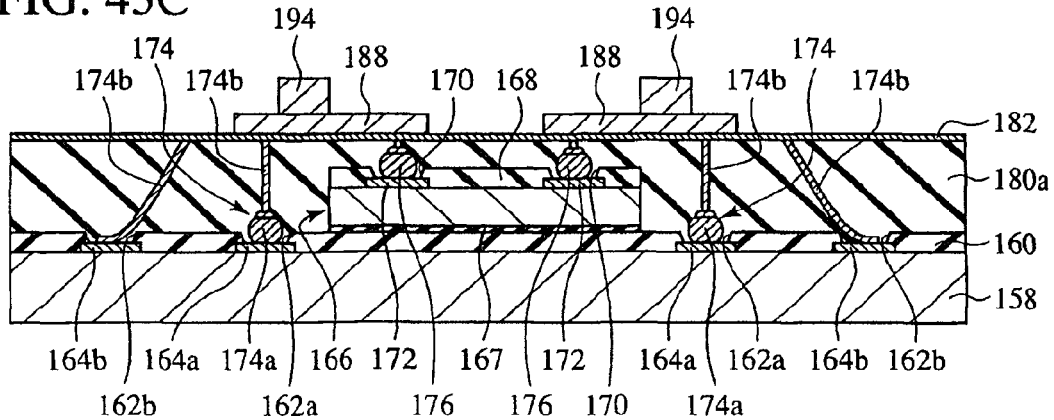

Then, as illustrated in FIG. 43C, the photoresist film 190 is released.

Figure 44A:
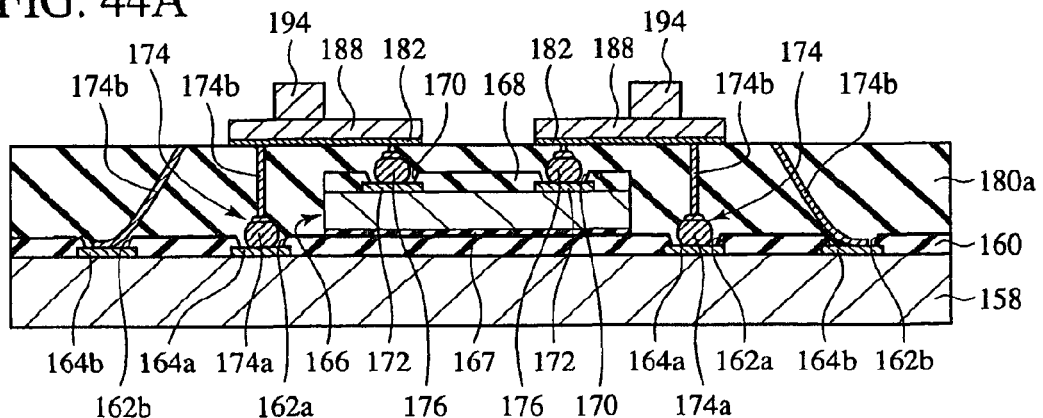
FIGS. 44A to 44C are views illustrating the semiconductor device according to the sixth embodiment of the present invention in the steps of the method for fabricating the semiconductor device, which illustrate the method (Part 7).

Next, as illustrated in FIG. 44A, the seed layer 182 exposed around the interconnections 188 is removed by wet etching. The etching liquid is, e.g., an about 1-10% ammonium persulfate aqueous solution. The etching period of time is, e.g., about 2 minutes. When the seed layer 182 is etched off, the surfaces of the interconnections 188 and the conductor plugs 194 are also etched a little. However, because of the thickness of the seed layer 182 which is sufficiently small in comparison with the sizes of the interconnections 188 and the conductor plugs 194, the seed layer 182 can be etched in a short period of time. Accordingly, in etching the seed layer 182, the interconnections 188 and the conductor plugs 194 are never excessively etched.

Figure 44B:
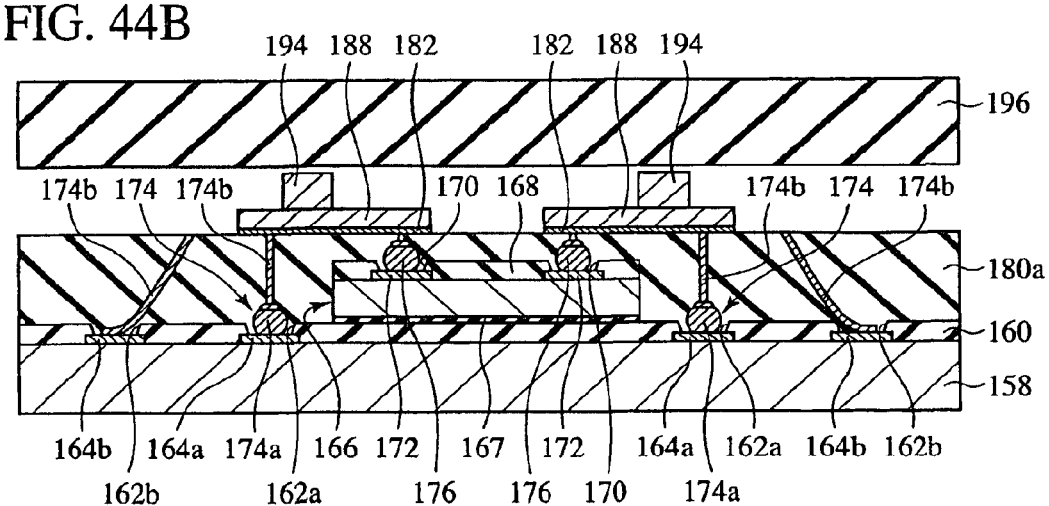

Then, as illustrated in FIG. 44B, a resin film 196 is mounted on the semiconductor substrate 158. The resin film 196 is ABF, a film for forming insulation layers, by AJINOMOTO CO., INC., as is, e.g., the resin film 176 described above with reference to FIG. 39A.

Figure 44C:
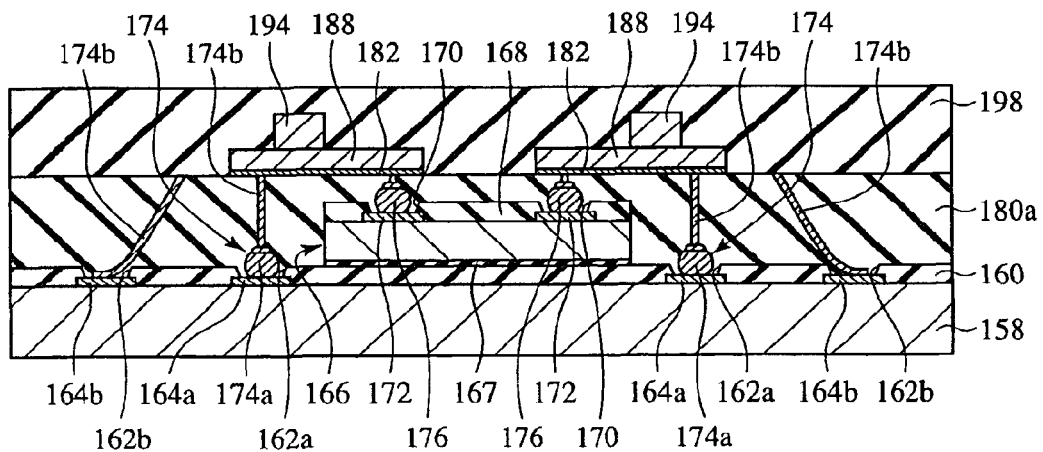

Next, by a vacuum press apparatus, the resin film 196 is adhered to the resin layer 180a with the interconnections 188 and the conductor plugs 194 formed on (see FIG. 44C). Specifically, the resin film 196 is adhered to the inter-layer insulation film 180a by being heated and solved while depressurized. The temperature for solving the resin film 196 is, e.g., 150° C. Thus, a resin layer 198 of the resin film 196 is formed on the resin layer 180a. Resultantly, the interconnections 188 and the conductor plugs 194 are buried by the resin layer 198.

Next, the resin layer 198 is solidified by thermal processing. Conditions for the thermal processing are, e.g., 170° C. and 1 hour.

Figure 45A:
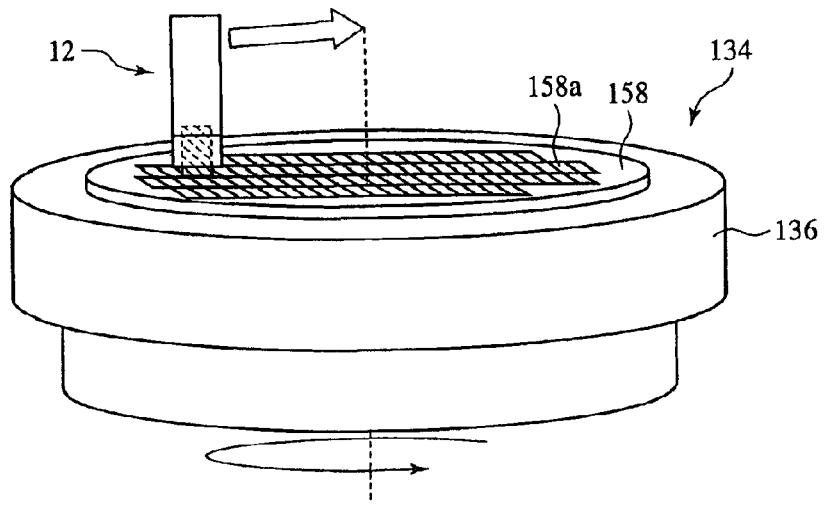
FIGS. 45A and 45B are views illustrating the semiconductor device according to the sixth embodiment of the present invention in the steps of the method for fabricating the semiconductor device, which illustrate the method (Part 8).

Next, as illustrated in FIG. 45A, the semiconductor substrate 158 is fixed to the chuck table 136 of the ultraprecision lathe 134 by vacuum suction.

FIG. 45A is a perspective view of the semiconductor substrate 158 fixed to the ultraprecision lathe 134. When the semiconductor substrate 158 is fixed to the chuck table 136, the backside of the semiconductor substrate 158, i.e., the surface where the conductor plugs 194, etc. are not formed is fixed to the chuck table 136. When the semiconductor substrate 158 is fixed to the chuck table 136, preferably, a pin chuck is used.

Figure 45B:
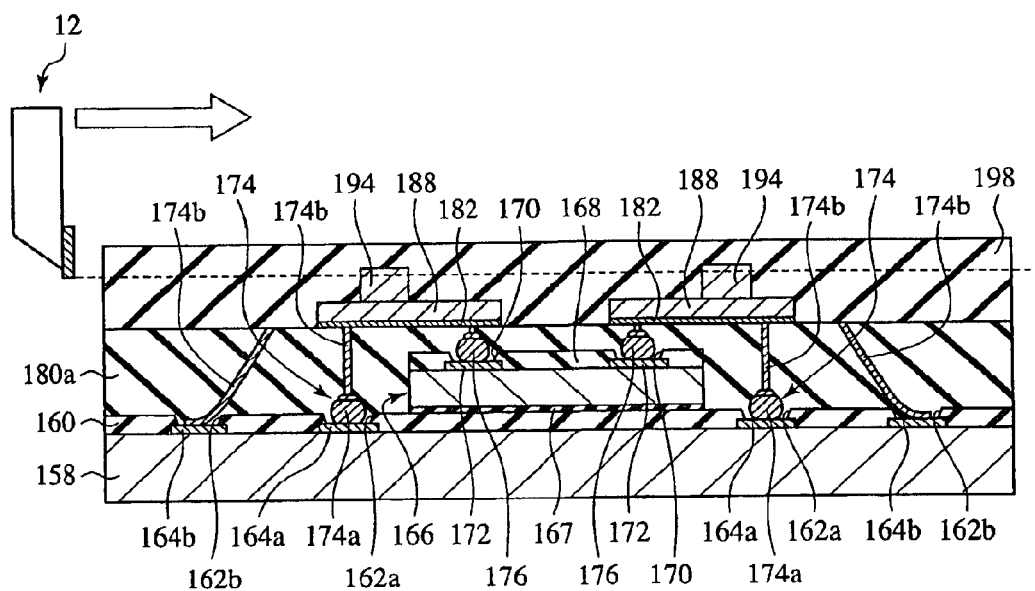

Then, while the semiconductor substrate 158 is being rotated, the surface of the resin layer 198 and the upper parts of the conductor plugs 194 are cut with a cutting tool 12 of diamond (see FIG. 45B).

Conditions for cutting the surface of the resin layer 198 and the upper parts of the conductor plugs 194 may be the same as those for cutting the surface of the resin layer 180 and the upper parts of the wire electrodes 174 and the stud bumps 176 described above or may be different from those for cutting the surface of the resin layer 180 and the upper parts of the wire electrodes 174 and the stud bumps 176 described above. This is because the surface of the resin layer 198a (hereinafter the resin layer after cut is indicated by the resin layer 198a to be discriminated from the resin layer 198 before cut) need not be set at a suitable roughness because no seed layer must be formed on the resin layer 198a. When the resin layer 198a must have the surface cut smooth, the rake angle of the cutting tool 12 may be set, e.g., about 10 degrees for the cutting. By setting the rake angle of the cutting tool 12 a little larger, the surface of the resin layer 198a can be smooth. The rotation number of the chuck table 136 is, e.g., about 1000 rpm. When the cutting is divided to be conducted several times, the cut amount of the cutting tool 12 in the final cutting is set at, e.g., about 2 μm. The feed of the cutting tool 12 is set at, e.g., 70 μm/second. The cutting under these conditions makes the surface of the resin layer 198a very smooth.

Figure 46A:
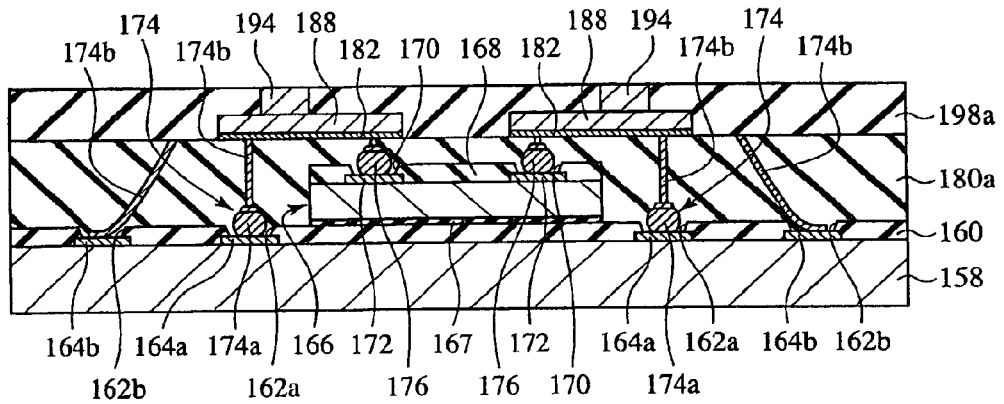
FIGS. 46A to 46C are views illustrating the semiconductor device according to the sixth embodiment of the present invention in the steps of the method for fabricating the semiconductor device, which illustrate the method (Part 9).

Thus, the surface of the resin layer 198 and the upper parts of the conductor plugs 194 are cut (see FIG. 46A).

The cutting here is conducted by advancing the cutting tool 12 straight in one direction while the semiconductor substrate 158 is being rotated. However, it is also possible to conduct the cutting by rotating a wheel (not illustrated) with the cutting tool 12 mounted while the semiconductor substrate 158 is being advanced straight in one direction (not illustrated).

Figure 46B:
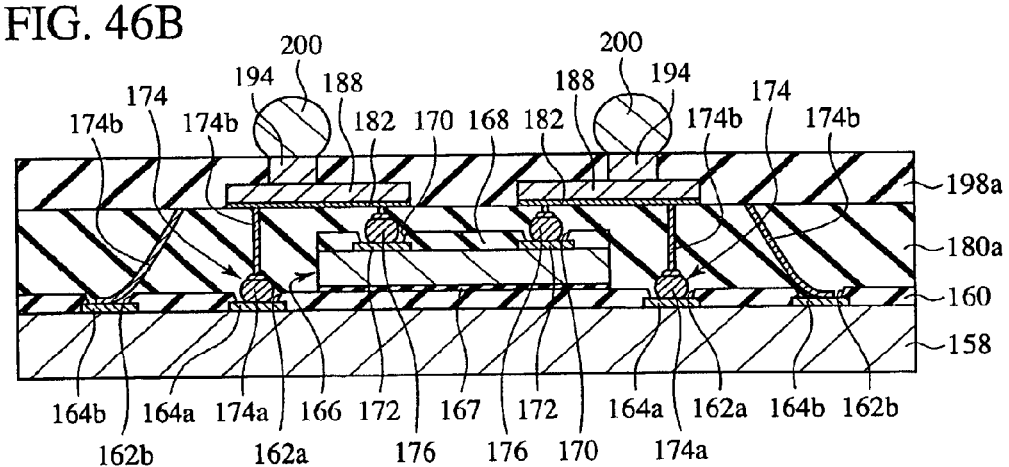

Next, as illustrated in FIG. 46B, solder bumps 200 of, e.g., Sn-based solder are formed on the upper ends of the conductor plugs 194 exposed on the surface of the resin layer 198.

The solder bumps 200 are formed here directly on the conductor plugs 194. However, a barrier metal film (not illustrated) of nickel (Ni), gold (Au) or others may be formed on the conductor plugs 194. The barrier metal film is formed on the conductor plugs 194, and the solder bumps 200 are formed on the barrier metal, whereby the diffusion of the material of the conductor plugs 194 into the solder bumps 200 can be prevented.

Figure 46C:
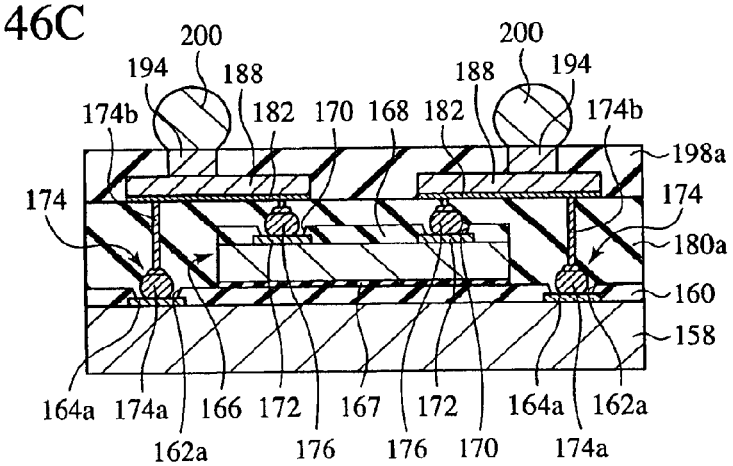

Then, with a thin blade of diamond particles, etc. collected by a binder, the semiconductor substrate is cut into discrete semiconductor devices (semiconductor chips) (see FIG. 46C). At this time, the parts of the semiconductor substrate 158, which include, as described above, the dummy pads 164b and the wire parts 174b connected to the dummy pads 164b are present on other semiconductor chips (not illustrated).

Thus, the semiconductor device according to the present embodiment is fabricated.

In this structure, the electrodes of the semiconductor substrate 158 and the electrode of the semiconductor devices 166 are connected to each other via the wire electrodes 174b, the interconnections 188 including the seed layer 182, and stud bumps 174.

The interconnection 188 can be connected to the outside via the conductor plugs 194 and the solder bumps 200.

The method for fabricating the semiconductor device according to the present embodiment is characterized mainly in that, as described above, the semiconductor chips 166 are mounted on the semiconductor substrate 158, the bump electrodes 174 and the bump electrodes 176 are formed on the semiconductor substrate 158 and the semiconductor chips 166 respectively by ball bonding, the resin layer 180 is formed, burying the wire electrodes 174 and the stud bumps 176, then the surface of the resin layer 180 is cut with the cutting tool 12, and the seed layer 182 is formed on the cut resin layer 180a.

As described above, forming bump electrodes by plating causes a certain cost irrespective of the number of the bump electrodes. Accordingly, when a large number of the bump electrodes are formed, the cost per 1 bump electrodes is relatively low, but the cost per 1 bump electrode is relatively high when the number of the bump electrodes is not so large. On the other hand, when the wire electrodes 174 and the stud bumps 176 are formed, i.e., the wire electrodes 174 and the stud bumps 176 are formed by ball bonding, costs are caused corresponding to numbers of the wire electrodes 174 and the stud bumps 176. Accordingly, when the numbers of the wire electrodes 174 and the stud bumps 176 are relatively small, the ball bonding often costs less than the plating. Thus, it can decrease the cost to suitably form the wire electrodes 174 and the stud bumps 176 by ball bonding as in the present embodiment.

Modified Embodiments

The present invention is not limited to the above-described embodiments and can cover other various modifications.

For example, in the above-described embodiments, the seed layer is formed by electroless plating but may be formed by sputtering. The resin layer is cut with a cutting tool to give suitable roughness to the surface of the resin layer, which sufficiently ensures the adhesion between the resin layer and the seed layer, even when the seed layer is formed by sputtering. Thus, even when the seed layer is formed by sputtering, the adhesion between the resin layer and the plating film can be sufficiently ensured.

What is claimed is:

1. A circuit board fabrication method for fabricating a circuit board including a base substrate and an inductor formed over the base substrate, the method comprising:
   forming an insulation layer containing a resin over the base substrate;
   cutting a surface part of the insulation layer with a cutting tool having a cutting blade so that a ten-point height of irregularities of the surface of the insulation layer is 0.5-5 µm;
   forming a seed layer on the insulation layer, and
   forming the inductor on the seed layer by electroplating,
   wherein the circuit board fabrication method is free from immersing the insulation layer in a chemical liquid.

2. The circuit board fabrication method according to claim 1, wherein
   the insulation layer further contains a filler of a material whose magnetic permeability is higher than that of the resin.

3. The circuit board fabrication method according to claim 2, wherein
   the filler is formed of any one of Mn—Zn-based ferrite and Ni—Zn-based ferrite, or a mixture of them.

\* \* \* \* \*